US 11,159,869 B2
United States Patent
Grinker et al.

(10) Patent No.: US 11,159,869 B2
(45) Date of Patent: Oct. 26, 2021

(54) EARTIP WITH CONTROL LEAK

(71) Applicant: Apple Inc., Cupertino, CA (US)

(72) Inventors: Scott C. Grinker, Belmont, CA (US);
Esge Andersen, Campbell, CA (US);
Ethan L. Huwe, Davis, CA (US);
Benjamin A. Cousins, San Jose, CA
(US); Samuel G. Parker, Woodside,
CA (US); Sean T. McIntosh,
Cupertino, CA (US); **Jason C. Della
Rosa, Morgan Hill, CA (US); Craig M.
Stanley, Campbell, CA (US); Edward
Siahaan**, San Francisco, CA (US);
Ethan W. Juhnke, Fernley, NV (US)

(73) Assignee: Apple Inc., Cupertino, CA (US)

( * ) Notice: Subject to any disclaimer, the term of this
patent is extended or adjusted under 35
U.S.C. 154(b) by 0 days.

(21) Appl. No.: 16/584,914

(22) Filed: Sep. 26, 2019

(65) Prior Publication Data

US 2020/0107101 A1 Apr. 2, 2020

Related U.S. Application Data

(60) Provisional application No. 62/738,772, filed on Sep.
28, 2018, provisional application No. 62/738,788,
(Continued)

(51) Int. Cl.
*H04R 1/10* (2006.01)
*G01V 3/08* (2006.01)
(Continued)

(52) U.S. Cl.
CPC ............ *H04R 1/1016* (2013.01); *A45C 11/00*
(2013.01); *A45C 13/005* (2013.01);
(Continued)

(58) Field of Classification Search
CPC ...... H04R 1/10; H04R 1/1016; H04R 1/1058;
H04R 1/1066; H04R 1/1091; H04R
5/033;
(Continued)

(56) References Cited

U.S. PATENT DOCUMENTS 2,521,414 A * 9/1950 Schier .................. H04R 25/656
181/135
5,596,304 A 1/1997 Tatchyn
(Continued)

FOREIGN PATENT DOCUMENTS

| CN | 1867748 A | 11/2006 |
|----|-----------|---------|
| CN | 1955530 A | 5/2007 |

(Continued)

OTHER PUBLICATIONS

Office Action issued in Korean Application No. KR10-2019-
0120908, dated May 29, 2020 in 8 pages.
(Continued)

*Primary Examiner* — Walter F Briney, III
(74) *Attorney, Agent, or Firm* — Kilpatrick Townsend &
Stockton LLP

(57) ABSTRACT

Embodiments describe an eartip including an eartip body
having an attachment end and an interfacing end opposite
from the attachment end, and an attachment structure
coupled to the inner eartip body at the attachment end. The
eartip body can include: an inner eartip body having a
sidewall extending between the interfacing end and the
attachment end, the sidewall defining a channel and having
a first thickness near the attachment end and a second
thickness different from the first thickness at the interfacing
end; and an outer eartip body sized and shaped to be inserted
into an ear canal and extending from the interfacing end, the
outer eartip body extending toward the attachment end of the
(Continued)

eartip. The attachment structure including a sidewall extending around a periphery of the attachment structure and defining an opening extending through the sidewall that fluidly couples the channel to an ambient environment.

17 Claims, 39 Drawing Sheets

Related U.S. Application Data filed on Sep. 28, 2018, provisional application No. 62/738,803, filed on Sep. 28, 2018, provisional application No. 62/738,813, filed on Sep. 28, 2018, provisional application No. 62/738,828, filed on Sep. 28, 2018, provisional application No. 62/738,843, filed on Sep. 28, 2018, provisional application No. 62/865,070, filed on Jun. 21, 2019, provisional application No. 62/900,307, filed on Sep. 13, 2019.

(51) Int. Cl.

| | |
|---|---|
| A45C 11/00 | (2006.01) |
| A45C 13/00 | (2006.01) |
| E05F 1/12 | (2006.01) |
| E05F 3/20 | (2006.01) |
| H01F 7/02 | (2006.01) |
| H05K 5/00 | (2006.01) |
| H05K 5/02 | (2006.01) |
| H05K 5/03 | (2006.01) |
| H04R 1/02 | (2006.01) |
| H04B 1/38 | (2015.01) |
| H04B 1/3827 | (2015.01) |

(52) U.S. Cl.
CPC .............. *E05F 1/1261* (2013.01); *E05F 3/20* (2013.01); *G01V 3/081* (2013.01); *H01F 7/02* (2013.01); *H04R 1/023* (2013.01); *H04R 1/1041* (2013.01); *H04R 1/1058* (2013.01); *H04R 1/1091* (2013.01); *H05K 5/0086* (2013.01); *H05K 5/0217* (2013.01); *H05K 5/0226* (2013.01); *H05K 5/03* (2013.01); *A45C 2011/001* (2013.01); *E05Y 2201/224* (2013.01); *E05Y 2900/602* (2013.01); *H04B 1/38* (2013.01); *H04B 2001/3866* (2013.01); *H04R 1/1025* (2013.01); *H04R 2400/11* (2013.01); *H04R 2420/07* (2013.01); *H04R 2460/11* (2013.01)

(58) Field of Classification Search
CPC ...... H04R 5/0335; H04R 25/00; H04R 25/02; H04R 25/60; H04R 25/65; H04R 25/652; H04R 25/656; H04R 2201/10; H04R 2225/00; H04R 2225/023; H04R 2225/025; H04R 2225/77; H04R 2460/00; H04R 2460/0911

See application file for complete search history.

(56) References Cited

U.S. PATENT DOCUMENTS

| | | | |
|---|---|---|---|
| 5,652,413 | A | 7/1997 | Mulera |
| 5,944,197 | A | 8/1999 | Baltzer et al. |
| 7,272,423 | B2 | 9/2007 | Satoh et al. |
| 7,832,058 | B2 | 11/2010 | Wang et al. |
| 8,055,003 | B2 | 11/2011 | Mittleman et al. |
| 8,270,656 | B2 | 9/2012 | Stiehl et al. |
| 8,280,093 | B2 | 10/2012 | Siahaan et al. |
| 8,385,991 | B2 | 2/2013 | Wang et al. |
| 8,996,079 | B2 | 3/2015 | Ahn |
| 9,014,411 | B2 | 4/2015 | Rodgers |
| 9,036,853 | B2 | 5/2015 | Silvestri et al. |
| 9,167,336 | B2 | 10/2015 | Siahaan et al. |
| 9,571,912 | B2 | 2/2017 | Siahaan et al. |
| 9,578,766 | B2 | 2/2017 | Jin et al. |
| 9,788,620 | B1 | 10/2017 | Parkinson |
| 9,910,455 | B1 | 3/2018 | Morrison et al. |
| 9,941,778 | B2 | 4/2018 | Yoshikawa |
| 9,961,433 | B2 | 5/2018 | Chawan et al. |
| 10,098,422 | B2 | 10/2018 | Fiedler et al. |
| 10,206,463 | B2 | 2/2019 | De Jong |
| 10,237,640 | B2 | 3/2019 | Siahaan et al. |
| 10,582,287 | B2 | 3/2020 | Song et al. |
| 10,586,641 | B2 | 3/2020 | Good |
| 10,785,553 | B2 | 9/2020 | Sang et al. |
| 10,841,675 | B2 | 11/2020 | Howard et al. |
| 10,979,795 | B2 | 4/2021 | Huwe et al. |
| 11,012,770 | B2 | 5/2021 | Hatfield et al. |
| 2007/0123319 | A1 | 5/2007 | Hwang |
| 2009/0103760 | A1 | 4/2009 | Stiehl et al. |
| 2010/0166207 | A1 | 7/2010 | Masuyama |
| 2010/0166241 | A1* | 7/2010 | Sabio ................ H04R 25/656 381/328 |
| 2011/0206225 | A1* | 8/2011 | Moller ............... H04R 25/556 381/314 |
| 2012/0082336 | A1 | 4/2012 | Wubker et al. |
| 2012/0114161 | A1 | 5/2012 | Tiemens et al. |
| 2012/0195455 | A1 | 8/2012 | Chiba et al. |
| 2013/0148830 | A1* | 6/2013 | Sakaguchi ........... H04R 1/2869 381/312 |
| 2014/0000312 | A1 | 1/2014 | Nicolas et al. |
| 2014/0355809 | A1 | 12/2014 | Killion et al. |
| 2016/0007110 | A1* | 1/2016 | Silvestri ............. H04R 1/2849 381/380 |
| 2016/0037841 | A1 | 2/2016 | Dey et al. |
| 2016/0037896 | A1 | 2/2016 | Kosoglow et al. |
| 2016/0212546 | A1 | 7/2016 | Salvatti |
| 2017/0094387 | A1 | 3/2017 | Huwe et al. |
| 2017/0094394 | A1 | 4/2017 | McPeak et al. |
| 2017/0247943 | A1 | 8/2017 | Ng et al. |
| 2017/0347182 | A1 | 11/2017 | Chawan et al. |
| 2018/0020302 | A1* | 1/2018 | Rasmussen ......... H04R 25/609 |
| 2019/0089187 | A1 | 3/2019 | Konomi |
| 2020/0084532 | A1 | 3/2020 | Lo et al. |
| 2020/0099231 | A1 | 3/2020 | Nobre et al. |

FOREIGN PATENT DOCUMENTS

| | | |
|---|---|---|
| CN | 201708900 U | 1/2011 |
| CN | 102138273 A | 7/2011 |
| CN | 102342082 A | 2/2012 |
| CN | 204145701 U | 2/2015 |
| CN | 106465000 A | 2/2017 |
| CN | 106559721 A | 4/2017 |
| CN | 106921899 A | 7/2017 |
| CN | 206506647 U | 9/2017 |
| CN | 107735650 A | 2/2018 |
| CN | 107925810 A | 4/2018 |
| CN | 207200926 U | 4/2018 |
| CN | 108430900 A | 8/2018 |
| CN | 207783095 U | 8/2018 |
| EP | 0606272 B1 | 12/1997 |
| EP | 2025849 A2 | 2/2009 |
| EP | 3068142 A1 | 9/2016 |
| EP | 3629591 A1 | 4/2020 |
| GB | 606272 A | 8/1948 |
| JP | 60173254 U | 11/1985 |
| JP | 10126469 | 5/1998 |
| JP | 2007518355 A | 7/2007 |
| JP | 2007305540 A | 11/2007 |
| JP | 2008160847 A | 7/2008 |
| JP | 2008277909 A | 11/2008 |
| JP | 2008283063 A | 11/2008 |
| JP | 2012085114 A | 4/2012 |
| JP | 2013127401 A | 6/2013 |
| JP | 2016029880 A | 3/2016 |
| JP | 2017098943 A | 6/2017 |
| JP | 2018037753 A | 3/2018 |

(56) References Cited

FOREIGN PATENT DOCUMENTS

| KR | 100869560 | B1 | 11/2008 |
|---|---|---|---|
| KR | 101539662 | B1 | 7/2015 |
| KR | 20170039570 | A | 4/2017 |
| WO | 2012047624 | A1 | 4/2012 |
| WO | 2017212453 | A1 | 12/2017 |
| WO | 2017223213 | A1 | 12/2017 |

OTHER PUBLICATIONS

Office Action issued in Korean Application No. KR10-2019-0120933, dated May 30, 2020 in 3 pages.
First Action Interview Pilot Program Pre-Interview Communication issued in U.S. Appl. No. 16/584,894, dated Jul. 30, 2020 in 6 pages.
First Action Interview Pilot Program Pre-Interview Communication issued in U.S. Appl. No. 16/584,929, dated Jul. 31, 2020 in 7 pages.
Non-Final Office Action issued in U.S. Appl. No. 16/584,939, dated Aug. 6, 2020 in 15 pages.
Notice of Allowance for U.S. Appl. No. 16/584,934, dated Jul. 24, 2020, 11 pages.
First Action Interview Office Action Summary issued in U.S. Appl. No. 16/584,894, dated Oct. 13, 2020 in 8 pages.
First Action Interview Office Action Summary issued in U.S. Appl. No. 16/584,929, dated Oct. 6, 2020 in 9 pages.
Office Action issued in China Application No. CN201910930734.2, dated Oct. 10, 2020 in 7 pages.
Office Action issued in China Application No. CN201910930796.3, dated Sep. 23, 2020 in 13 pages.
Office Action issued in China Application No. CN201910931008.2, dated Sep. 25, 2020 in 11 pages.
Office Action issued in China Application No. CN201910931039.8, dated Sep. 23, 2020 in 8 pages.
Notice of Decision to Grant issued in Korea Application No. KR10-2019-0120933, dated Sep. 29, 2020 in 5 pages.
Office Action issued in Japan Application No. JP2019-179588, dated Nov. 27, 2020 in 3 pages.
Office Action issued in Japan Application No. JP2019-179622, dated Nov. 27, 2020 in 4 pages.
Office Action issued in China Application No. CN201910931008.2, dated Mar. 9, 2021 in 3 pages.
Notice of Decision to Grant issued in China Application No. CN201910931039.8, dated Mar. 2, 2021 in 9 pages.
First Examination Report issued in India Application No. IN201914039506, dated Mar. 25, 2021 in 5 pages.
Notice of Allowance issued in U.S. Appl. No. 16/584,894, dated Feb. 9, 2021 in 7 pages.
Non-Final Office Action issued in U.S. Appl. No. 16/584,929, dated Feb. 9, 2021 in 25 pages.
Notice of Decision to Grant issued in China Application No. CN201910930796.3, dated Feb. 7, 2021 in 8 pages.
Office Action issued in Taiwan Application No. TW108135603, dated Jan. 27, 2021 in 9 pages.
Supplemental Notice of Allowance issued in U.S. Appl. No. 16/584,894, dated Mar. 3, 2021 in 2 pages.
International Preliminary Report on Patentability issued in PCT Application No. PCT/US2019/053547, dated Apr. 8, 2021 in 23 pages.
Notice of Allowance issued in U.S. Appl. No. 16/584,929, dated Jul. 6, 2021 in 11 pages.
Notice of Allowance issued in U.S. Appl. No. 16/584,905, dated May 12, 2021 in 10 pages.
Notice of Allowance issued in U.S. Appl. No. 16/584,920, dated May 6, 2021 in 9 pages.

\* cited by examiner

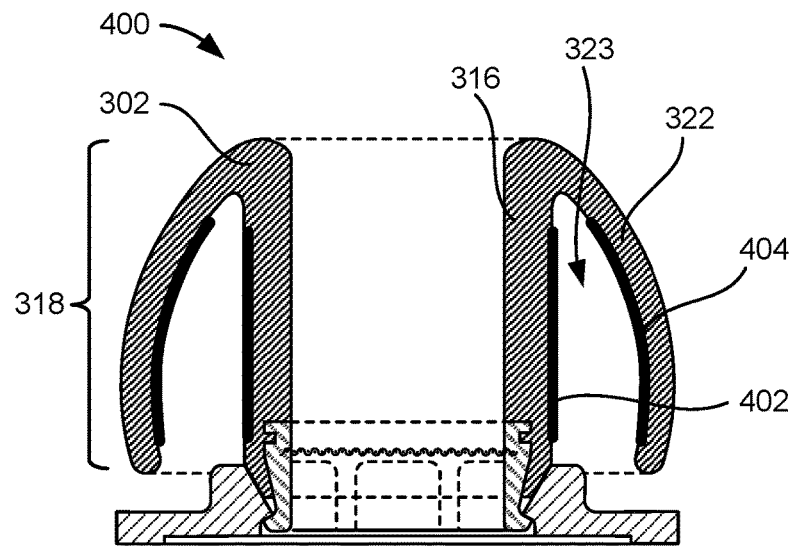
FIG. 4A
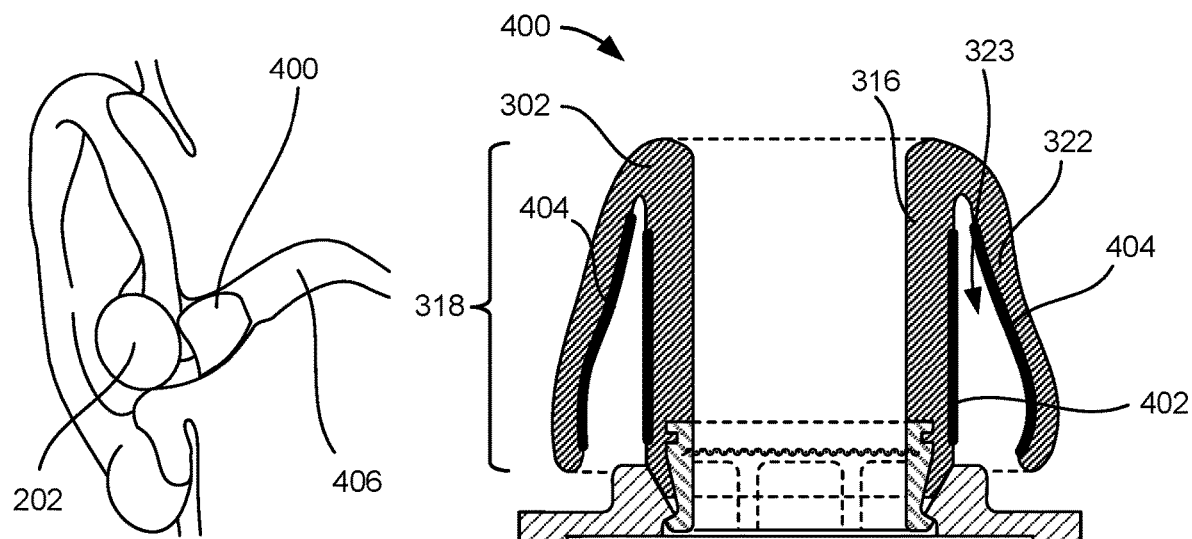
FIG. 4B  FIG. 4C

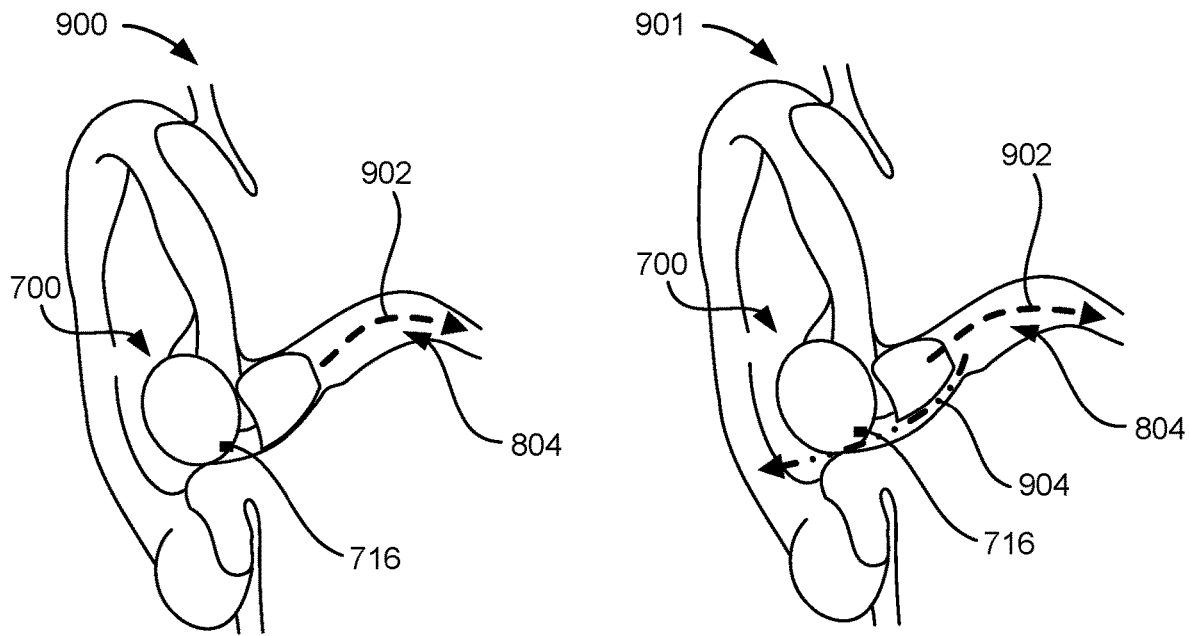
*FIG. 9A*  *FIG. 9B*
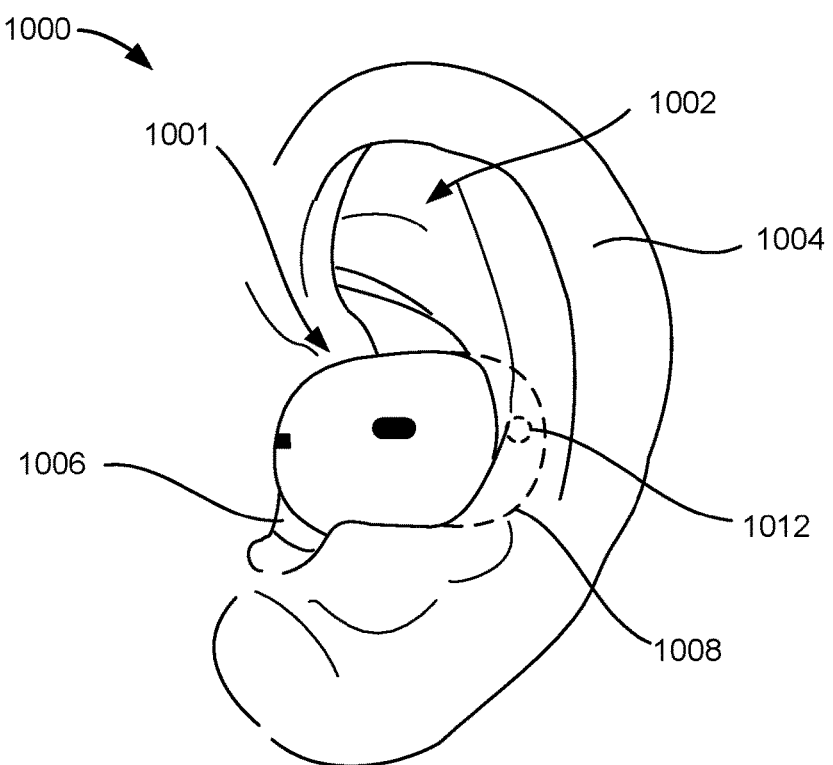
*FIG. 10*

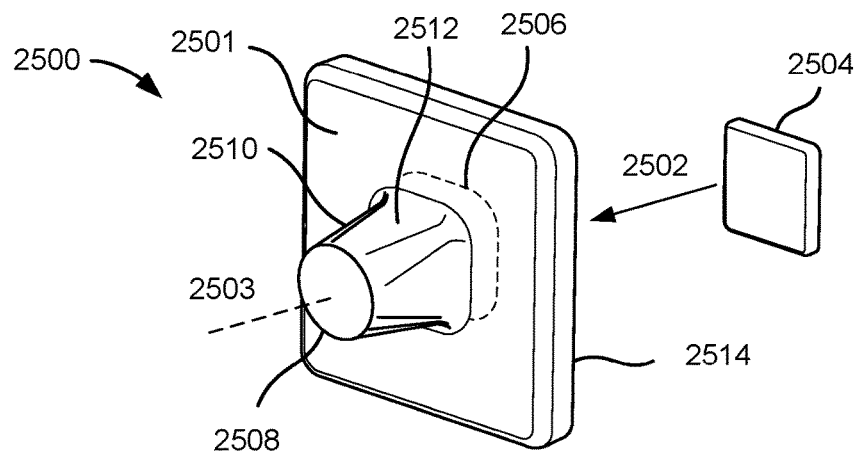
FIG. 25
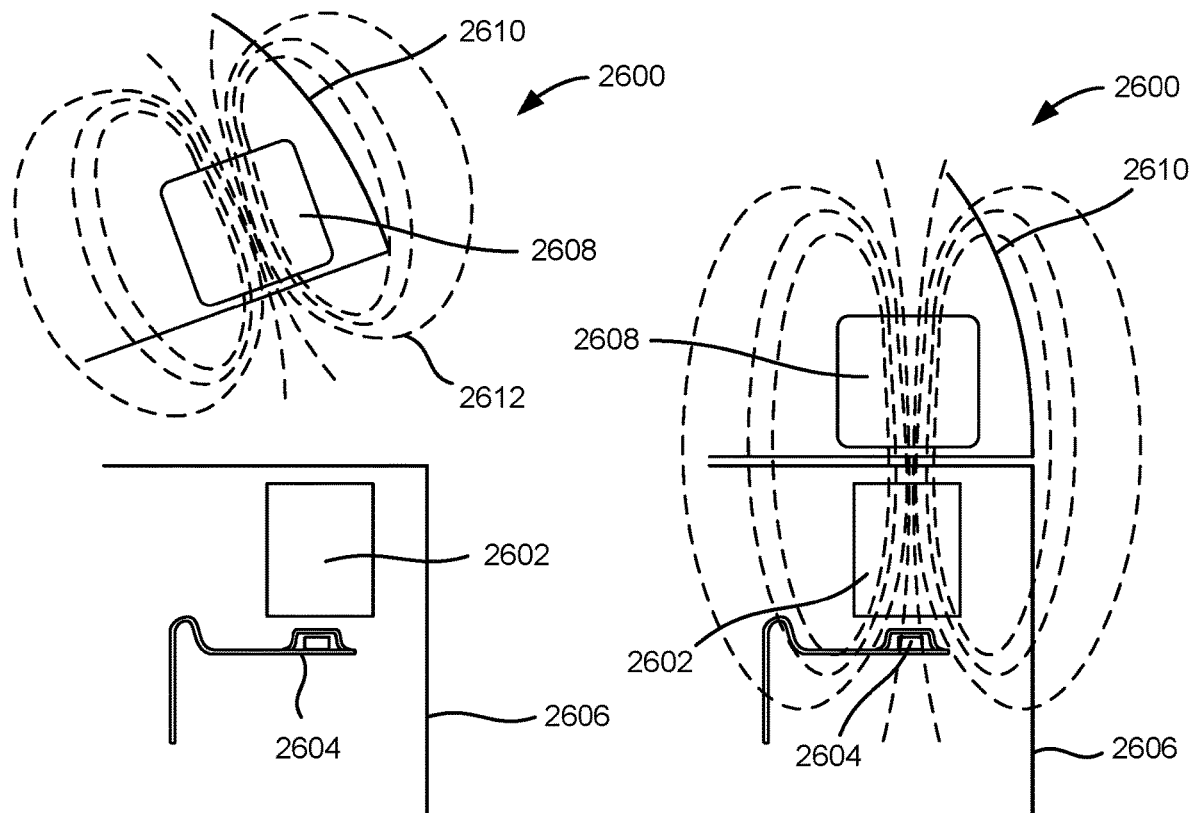
FIG. 26A  FIG. 26B

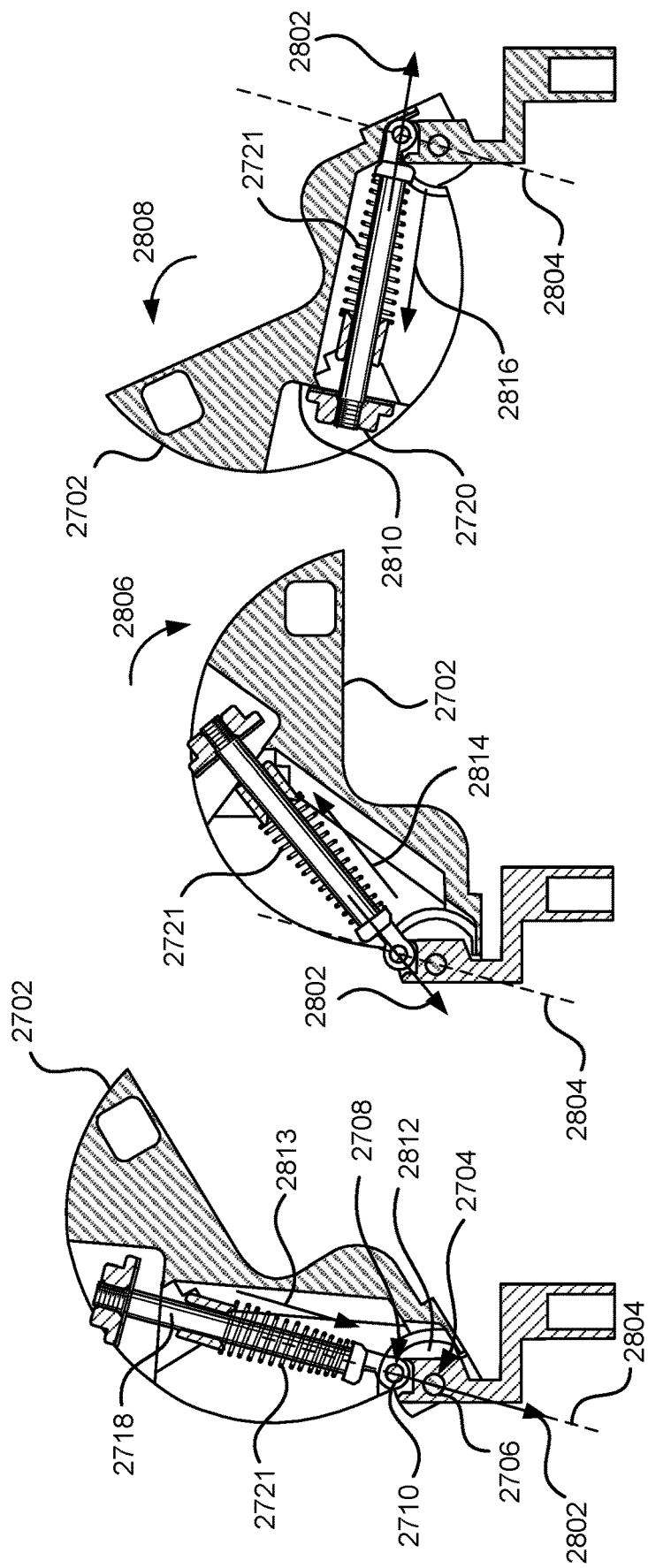

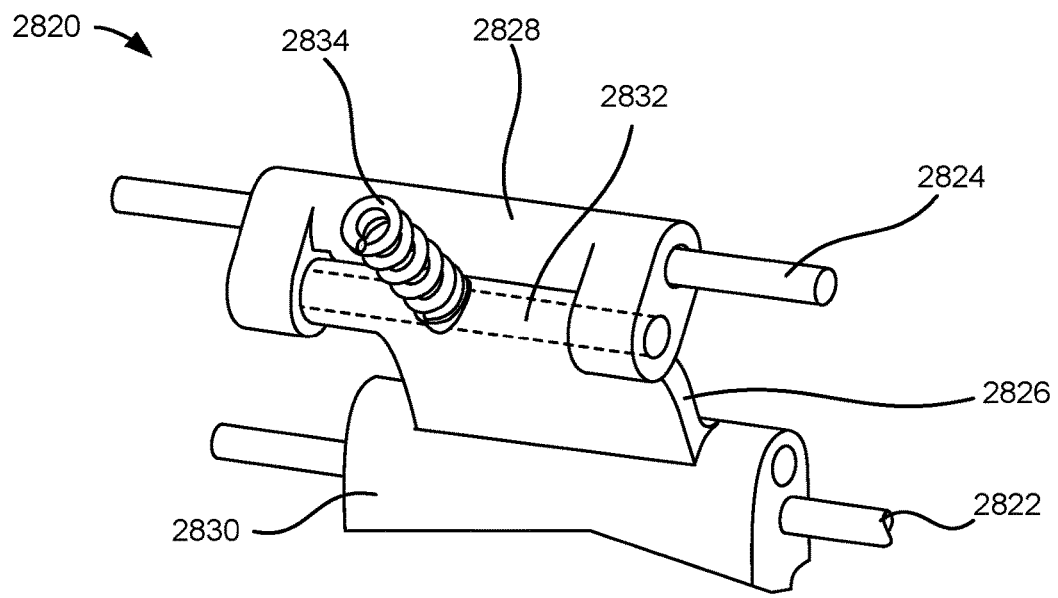
FIG. 28D
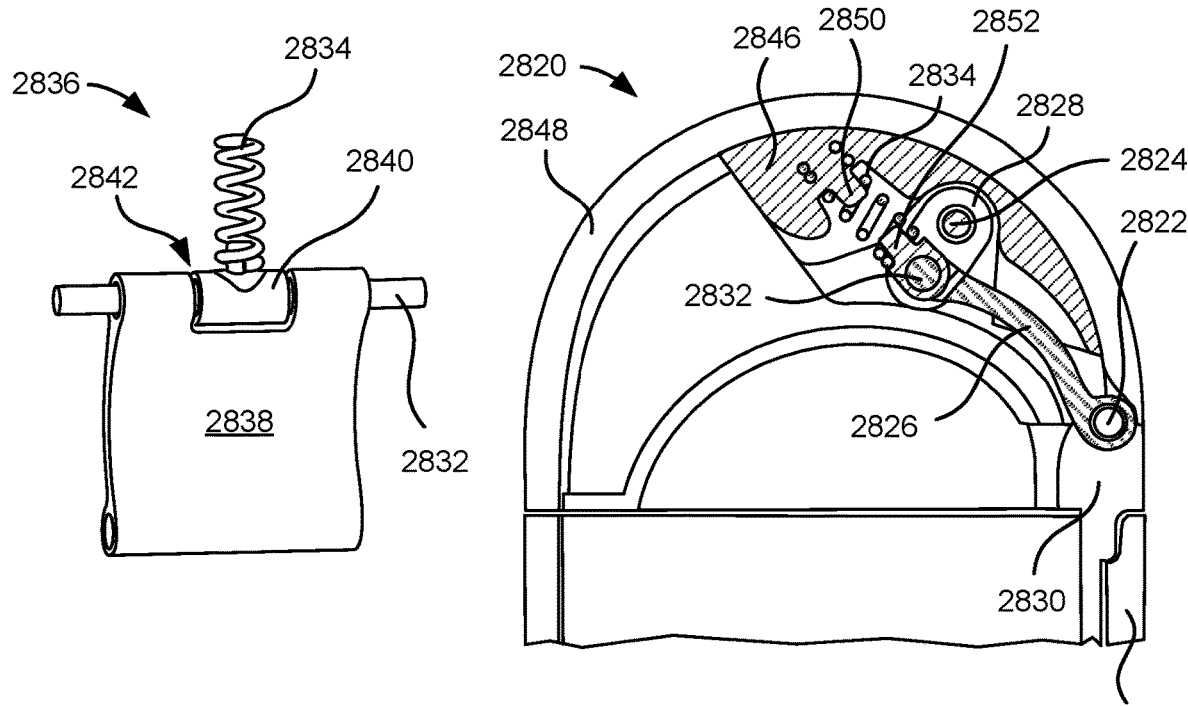
FIG. 28E     FIG. 28F

EARTIP WITH CONTROL LEAK

CROSS REFERENCE TO RELATED APPLICATIONS

This application claims priority to U.S. Provisional Patent Application No. 62/738,772 filed on Sep. 28, 2018, U.S. Provisional Patent Application No. 62/738,788 filed on Sep. 28, 2018, U.S. Provisional Patent Application No. 62/738,803 filed on Sep. 28, 2018, U.S. Provisional Patent Application No. 62/738,813 filed on Sep. 28, 2018, U.S. Provisional Patent Application No. 62/738,828 filed on Sep. 28, 2018, U.S. Provisional Patent Application No. 62/738,843 filed on Sep. 28, 2018, U.S. Provisional Patent Application No. 62/865,070 filed on Jun. 21, 2019, and U.S. Provisional Patent Application No. 62/900,307 filed on Sep. 13, 2019; the disclosures of which are hereby incorporated by reference in their entirety and for all purposes.

BACKGROUND

Portable listening devices can be used with a wide variety of electronic devices such as portable media players, smart phones, tablet computers, laptop computers, stereo systems, and other types of devices. Portable listening devices have historically included one or more small speakers configured to be place on, in, or near a user's ear, structural components that hold the speakers in place, and a cable that electrically connects the portable listening device to an audio source. Other portable listening devices can be wireless devices that do not include a cable and instead, wirelessly receive a stream of audio data from a wireless audio source. Such portable listening devices can include, for instance, wireless earbud devices or in-ear hearing devices that operate in pairs (one for each ear) or individually for outputting sound to, and receiving sound from, the user.

While wireless listening devices have many advantages over wired portable listening devices, they also have some potential drawbacks. For example, it may be difficult to achieve high-end acoustic performance from the listening devices due to the limited amount of space available within each listening device. Also, some wireless listening devices that extend into the ear canal to achieve better performance can often have an improper seal between the portable listening device and the ear canal, causing the user to experience lower quality sound. Further, the small size of wireless listening devices often causes a compromise in user interface features, blockage of sensors and/or microphones, and lower overall user experience.

SUMMARY

Some embodiments of the disclosure provide a wireless listening device that achieves improved acoustic performance and functionality, which results in an enriched user experience. In some instances, the wireless listening device can include a housing and an eartip that can attach to the housing. The eartip can be configured to insert into a user's ear and provide an avenue through which sound generated by the housing can be outputted to the user. The housing can include various sensors that can work alone, or in conjunction with, the eartip to perform various functions, such as, but not limited to, detecting when the wireless listening device has been inserted into a user's ear canal, determining whether a proper seal has been made between the eartip and the ear canal, and determining whether an improper blocking of one or more sensors of the wireless listening device exists. The housing can also be configured to recognize user input through movement of anatomical parts of a user's ear proximate to the wireless listening device, as well as through the user's voice alone or in conjunction with additional sensing measurements. These additional features can improve the user experience as well as enhance the acoustic performance of the wireless listening device.

In some embodiments, an eartip includes an eartip body having an attachment end and an interfacing end opposite from the attachment end, and an attachment structure coupled to the inner eartip body at the attachment end. The eartip body can include: an inner eartip body having a sidewall extending between the interfacing end and the attachment end, the sidewall defining a channel and having a first thickness near the attachment end and a second thickness different from the first thickness at the interfacing end; and an outer eartip body sized and shaped to be inserted into an ear canal and extending from the interfacing end, the outer eartip body extending toward the attachment end of the eartip. The attachment structure including a sidewall extending around a periphery of the attachment structure and defining an opening extending through the sidewall that fluidly couples the channel to an ambient environment.

In some additional embodiments, an in-ear hearing device includes a housing having an outer structure defining an internal cavity and an acoustic opening that allows sound to exit out of the outer structure, and an eartip attaching to the outer structure of the housing and directing sound outputted through the acoustic opening, the eartip including an eartip body having an attachment end and an interfacing end opposite from the attachment end, and an attachment structure coupled to the inner eartip body at the attachment end. The eartip body can include: an inner eartip body having a sidewall extending between the interfacing end and the attachment end, the sidewall defining a channel and having a first thickness near the attachment end and a second thickness different from the first thickness at the interfacing end; and an outer eartip body sized and shaped to be inserted into an ear canal and extending from the interfacing end, the outer eartip body extending toward the attachment end of the eartip. The attachment structure including a sidewall extending around a periphery of the attachment structure and defining an opening extending through the sidewall that fluidly couples the channel to an ambient environment.

In some further embodiments, a wireless listening device includes: a housing comprising an outer structure defining an internal cavity and an acoustic opening that allows sound to exit out of the outer structure; a nozzle attached to the housing around the acoustic opening; an attachment mechanism coupled to and extending through the nozzle and formed of wire bent in various directions forming a spring compressible in lateral directions; and an eartip removably attached to the nozzle by the attachment mechanism. The eartip including an eartip body having an attachment end and an interfacing end opposite from the attachment end, and an attachment structure coupled to the inner eartip body at the attachment end. The eartip body can include: an inner eartip body having a sidewall extending between the interfacing end and the attachment end, the sidewall defining a channel and having a first thickness near the attachment end and a second thickness different from the first thickness at the interfacing end; and an outer eartip body sized and shaped to be inserted into an ear canal and extending from the interfacing end, the outer eartip body extending toward the attachment end of the eartip. The attachment structure including a sidewall extending around a periphery of the attachment structure and defining an opening extending through the sidewall that fluidly couples the channel to an ambient environment.

A better understanding of the nature and advantages of embodiments of the present invention may be gained with reference to the following detailed description and the accompanying drawings.

BRIEF DESCRIPTION OF THE DRAWINGS

FIG. 4A is a cross-sectional view illustration of an exemplary eartip configured as a capacitive sensor, according to some embodiments of the present disclosure.

FIGS. 4B and 4C are cross-sectional view illustrations of eartip when it is inserted into an ear canal, according to some embodiments of the present disclosure.

FIG. 9A is a cross-sectional view illustration of a wireless listening device when a leakage is not present, according to some embodiments of the present disclosure.

FIG. 9B is a cross-sectional illustration of a wireless listening device when a leakage is present, according to some embodiments of the present disclosure.

FIG. 10 is an exemplary side-view illustration of a wireless listening device worn by a user where one or more ports, control leaks, and/or microphones are occluded, according to some embodiments of the present disclosure.

FIG. 25 is a simplified perspective view illustration of an exemplary visual indicator including a light emitter and a light tube for directing light emitted by the light emitter from within a body of a case to a region outside of the body of the case, according to some embodiments of the present disclosure.

FIGS. 26A-26B are simplified cross-sectional views of an exemplary magnetic attachment and sensor system that includes a hybrid retention and sensor shunt, according to some embodiments of the present disclosure.

FIGS. 28A-28C are cross-sectional view illustrations of the different states of a bistable hinge, according to some embodiments of the present disclosure.

FIGS. 28D-28F are simplified illustrations of an exemplary bistable hinge having a piston formed of a curved plate coupled to a rocker, according to some embodiments of the present disclosure.

DETAILED DESCRIPTION OF THE INVENTION

Figure 1A:
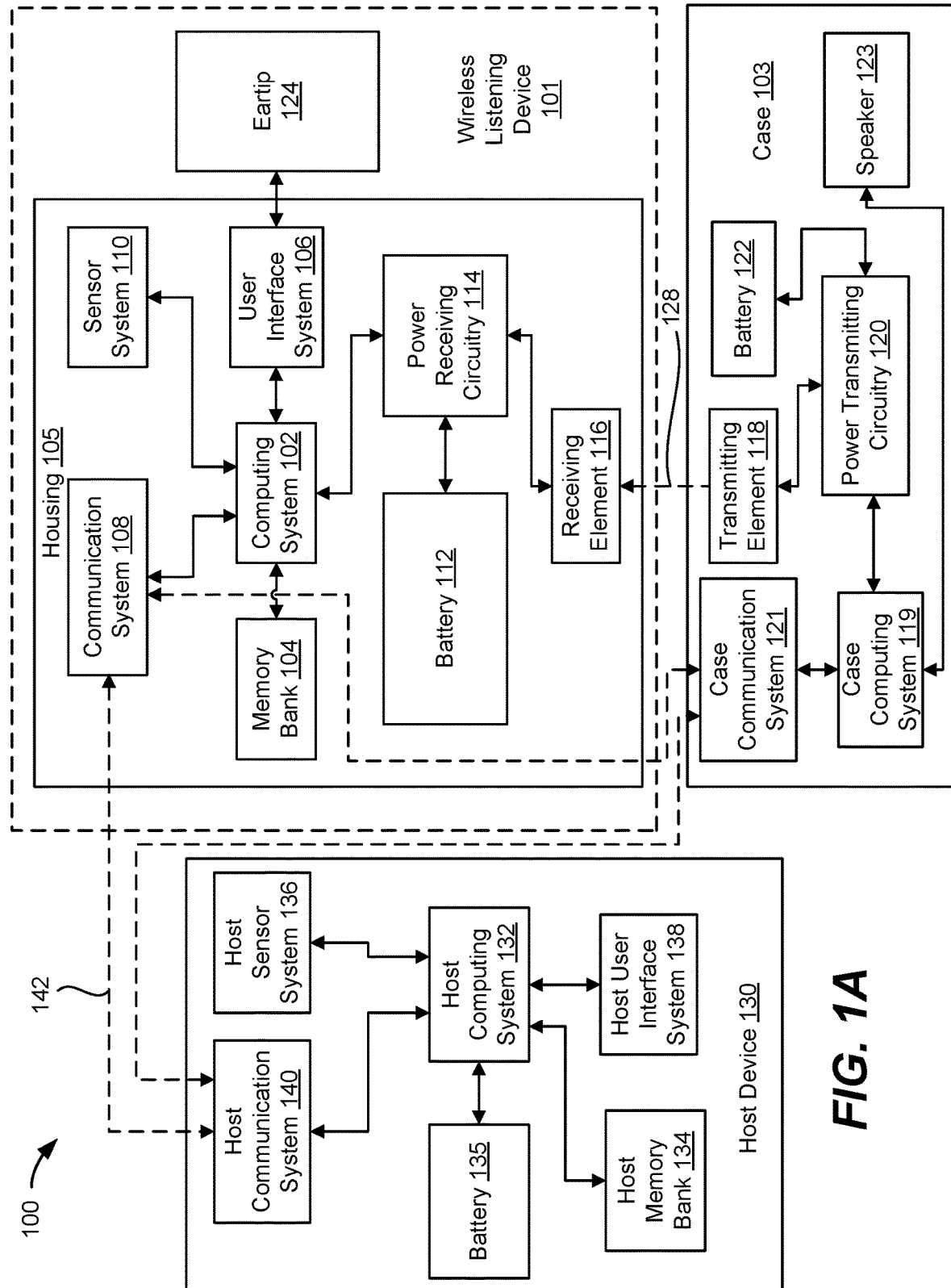
FIG. 1A is a block diagram illustrating a portable electronic listening device system including an exemplary wireless listening device, according to some embodiments of the present disclosure.

Embodiments of the disclosure describe a wireless listening device that achieves high-end acoustic performance and improved user experience. The wireless listening device can be one of a pair of wireless listening devices configured to fit in the left and right ears of a user for outputting sound to the user and for inputting sound from the user and/or the surrounding environment. In some instances, the wireless listening device can include a housing and an eartip that can attach to the housing. The housing can include a rigid outer structure that encloses various electrical components that operate the wireless listening device (e.g., a battery, a processor, a driver for generating sound, and the like). The outer structure can include an opening through which the generated sound can be outputted to the eartip, which can then direct the sound into the user's ear canal. The eartip can be substantially pliable in construction but include a stiff attachment structure that enables the eartip to easily attach to the housing by inserting into the opening of the outer structure. Details of example eartips are discussed herein with respect to FIGS. 3A-3E.

In some instances, the eartip can be attached by way of a wireform attachment mechanism that enables the eartip to attach to the housing under application of a low insertion force while requiring a high extraction force to remove the eartip. The wireform attachment mechanism can have an s-shape profile that includes end caps for inserting into recesses of an attachment structure of the eartip. The end caps can have beveled upper corners to allow a vertical insertion force to translate into a horizontal force to compress the wireform attachment mechanism. Details of example wireform attachment mechanisms are discussed herein with respect to FIGS. 3F-3Q.

In some additional or alternative embodiments, the wireless listening device can include a control leak for improved comfort. For example, the eartip can include a control leak in the form of a specifically designed opening through which the ear canal can be exposed to the atmosphere. The control leak can be defined by an attachment structure of the eartip. Without the control leak, pressure can be trapped in the ear canal and be uncomfortable to the user, and outputted sound may be muffled. Details of example control leaks are discussed herein with respect to FIGS. 6A-6E.

In some embodiments, the wireless listening device can also include an acoustic shielding component to mitigate wind noise and improve sound capture quality. The acoustic shielding can be a multi-layered mesh structure that includes an acoustic mesh sandwiched between a cosmetic mesh and a stiffener. The outer surface of the cosmetic mesh can be flush with the outer contours of the housing so that wind noise can be mitigated. Details of example acoustic shielding components are discussed herein with respect to FIGS. 11A-11B and 12.

In some additional or alternative embodiments, the wireless listening device can include various sensors for performing various functions. For instance, the eartip can include a capacitive sensor for determining when the eartip has been inserted into an ear canal, as discussed herein with respect to FIGS. 4A-4C. Or, in another instance, the housing can include an optical sensor that can work in conjunction with features of the eartip to determine when the eartip has been inserted into an ear canal, as discussed herein with respect to FIGS. 5A-5C. The wireless listening device can also be configured to determine whether a proper seal has been made between the eartip and the ear canal, and whether one or more sensors of the housing is improperly blocked, as discussed herein with respect to FIGS. 9A-9B.

The wireless listening device can also include various improved user interface features, such as a status light indicator, strategically positioned optical sensors, an outward facing microphone, and/or low-power accelerometers, as discussed herein with respect to FIGS. 7-8, 10, and 14-15. The status light indicator can be configured to output different colors of light to indicate whether active noise cancelling (ANC) is activated. For instance, the status light indicator can output a red light when ANC is on and a green light when ANC is off so that people around the user can be made aware of the user's ability to communicate. The optical sensors can be strategically positioned to observe parts of the ear so that when the ear moves, e.g., pulls away from the wireless listening device when the user pulls on certain parts of his or her ear, the wireless listening device can associate that movement with a specific user input. The low-power accelerometer can be used in conjunction with the outward facing microphone to detect voice commands only from the user. For instance, the wireless listening device can determine that the user is speaking a command, as opposed to another person who happens to be speaking next to or directly to the user, by also measuring a degree of vibration with the low-power accelerometer. The low-power accelerometer may vibrate over a threshold when the user speaks. Thus, the wireless listening device can determine that the user is speaking a command when the command is spoken in conjunction with a threshold amount of vibration. These user interface features can improve the user experience of the wireless listening device, which are discussed further herein.

As used herein, the term "portable listening device" includes any portable device designed to play sound that can be heard by a user. Headphones are one type of portable listening device, portable speakers are another. The term "headphones" represents a pair of small, portable listening devices that are designed to be worn on or around a user's head. They convert an electrical signal to a corresponding sound that can be heard by the user. Headphones include traditional headphones that are worn over a user's head and include left and right listening devices connected to each other by a headband, headsets (a combination of a headphone and a microphone); and earbuds (very small headphones that are designed to be fitted directly in a user's ear). Traditional headphones include both over-ear headphones (sometimes referred to as either circumaural or full-size headphones) that have earpads that fully encompass a user's ears, and on-ear headphones (sometimes referred to as supra-aural headphones) that have earpads that press against a user's ear instead of surrounding the ear.

The term "earbuds", which can also be referred to as earphones or ear-fitting headphones, includes both small headphones that fit within a user's outer ear facing the ear canal without being inserted into the ear canal, and in-ear headphones, sometimes referred to as canalphones, that are inserted in the ear canal itself. Thus, in-ear hearing devices can be another type of portable listening device that are configured to be positioned substantially within a user's ear. Other types of portable listening devices can also include hearing aids that augment sounds from the surrounding environment to the user. As used herein, the term "eartip", which can also be referred to as earmold, includes preformed, post-formed, or custom-molded sound-directing structures that at least partially fit within an ear canal. Eartips can be formed to have a comfortable fit capable of being worn for long periods of time. They can have different sizes and shapes to achieve a better seal with a user's ear canal and/or ear cavity.

In addition to the wireless listening device aforementioned herein, embodiments also include a case for housing one or more wireless listening devices. The case can include a magnet array formed of a set of magnets laterally positioned with respect to one another. Each magnet can have a specific magnetic polarity that is positioned in a distinct direction to focus the magnetic force at a retention slab in the wireless listening device to generate high attractive forces in a small footprint. Details of example magnet arrays are discussed herein with respect to FIGS. 23 and 24A-24B.

In some additional or alternative embodiments, the case can also include a bistable hinge that can have two stable states, one of which pulls the lid of the case closed, and the other one of which pushes the lid of the case opened. The bistable hinge can include three pivot points, as well as a spring and piston rod along which a piston guide can move. The relative direction of a force applied by the spring and a conversion axis defined by two pivot points can define which state the bistable hinge pushes or pulls into. The bistable hinge can provide a nice tactile feel when the lid for the case opens or closes, and can also minimize the number of magnets needed to keep the lid closed. Details of example bistable hinges are discussed herein with respect to FIGS. 27 and 28A-28C.

In certain instances, the case can also include a hybrid retention and sensor shunt for detecting when the lid of the case is in the closed position. The hybrid shunt can allow a magnet in the lid to pull toward the body to keep the lid closed, while also providing a body through which magnetic fields from the magnet can traverse to a region below the shunt to be detected by a sensor. That way, the sensor can utilize the space provided for the hybrid shunt instead of being placed elsewhere around the case and occupying valuable real estate. Details of example hybrid retention and sensor shunts are discussed herein with respect to FIGS. 26A-26B.

I. Wireless Listening Device

FIG. 1A is a block diagram illustrating a portable electronic listening device system 100 including an exemplary wireless listening device 101, according to some embodiments of the present disclosure. Wireless listening device 101, as mentioned above, can include a housing 105. Housing 105 can be an electronic device component that generates and receives sound to provide an enhanced user interface for a host device 130. Housing 105 can include a computing system 102 coupled to a memory bank 104.

Computing system 102 can execute instructions stored in memory bank 104 for performing a plurality of functions for operating housing 105. Computing system 102 can be one or more suitable computing devices, such as microprocessors, computer processing units (CPUs), graphics processing units (GPUs), field programmable gate arrays (FPGAs), and the like.

Computing system 102 can also be coupled to a user interface system 106, communication system 108, and a sensor system 110 for enabling housing 105 to perform one or more functions. For instance, user interface system 106 can include a driver (e.g., speaker) for outputting sound to a user, microphone for inputting sound from the environment or the user, and any other suitable input and output device. Communication system 108 can include Bluetooth components for enabling housing 105 to send and receive data/commands from host device 130. Sensor system 110 can include optical sensors, accelerometers, microphones, and any other type of sensor that can measure a parameter of an external entity and/or environment.

Housing 105 can also include a battery 112, which can be any suitable energy storage device, such as a lithium ion battery, capable of storing energy and discharging stored energy to operate housing 105. The discharged energy can be used to power the electrical components of housing 105. In some embodiments, battery 112 can also be charged to replenish its stored energy. For instance, battery 112 can be coupled to power receiving circuitry 114, which can receive current from receiving element 116. Receiving element 116 can electrically couple with a transmitting element 118 of an case 103 in embodiments where receiving element 116 and transmitting element 118 are configured as exposed electrical contacts. Case 103 can include a battery 122 that can store and discharge energy to power transmitting circuitry 120, which can in turn provide power to transmitting element 118. The provided power can transfer through an electrical connection 128 and be received by power receiving circuitry 114 for charging battery 112. While case 103 can be a device that provides power to charge battery 112 through receiving element 116, in some embodiments, case 103 can also be a device that houses wireless listening device 101 for storing and provide protection to wireless listening device 101 while it is stored in case 103.

Case 103 can also include a case computing system 119 and a case communication system 121. Case computing system 119 can be one or more processors, ASICs, FPGAs, microprocessors, and the like for operating case 103. Case computing system 119 can be coupled to power transmitting circuitry 120 for operating the charging functionalities of case 103, and case computing system 119 can also be coupled to case communication system 121 for operating the interactive functionalities of case 103 with other devices, e.g., housing 105. In some embodiments, case communication system 121 is a Bluetooth component, or any other suitable communication component, that sends and receives data with communication system 108 of housing 105, such as an antenna formed of a conductive body. That way, case 103 can be apprised of the status of wireless listening device 101 (e.g., charging status and the like). Case 103 can also include a speaker 123 coupled to case computing system 119 so that speaker 123 can emit audible noise capable of being heard by a user for notification purposes.

Host device 130, to which housing 105 is an accessory, can be a portable electronic device, such as a smart phone, tablet, or laptop computer. Host device 130 can include a host computing system 132 coupled to a battery 135 and a host memory bank 134 containing lines of code executable by host computing system 132 for operating host device 130. Host device 130 can also include a host sensor system 136, e.g., accelerometer, gyroscope, light sensor, and the like, for allowing host device 130 to sense the environment, and a host user interface system 138, e.g., display, speaker, buttons, touch screen, and the like, for outputting information to and receiving input from a user. Additionally, host device 130 can also include a host communication system 140 for allowing host device 130 to send and/or receive data from the Internet or cell towers via wireless communication, e.g., wireless fidelity (WIFI), long term evolution (LTE), code division multiple access (CDMA), global system for mobiles (GSM), Bluetooth, and the like. In some embodiments, host communication system 140 can also communicate with communication system 108 in housing 105 via wireless communication line 142 so that host device 130 can send sound data to housing 105 to output sound, and receive data from housing 105 to receive user inputs. Communication line 142 can be any suitable wireless communication line such as Bluetooth connection. By enabling communication between host device 130 and housing 105, wireless listening device 101 can enhance the user interface of host device 130.

Figure 1B:
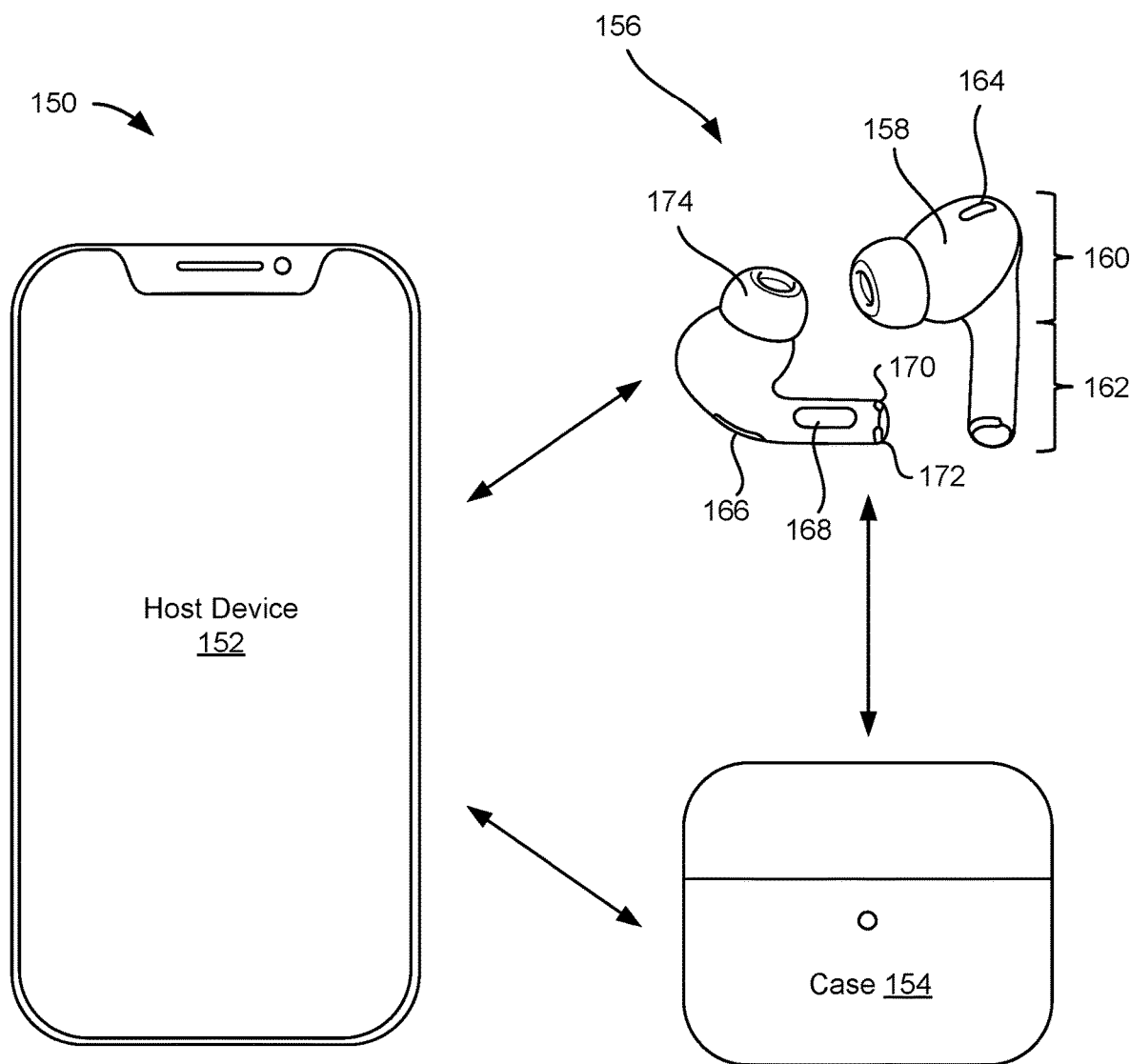
FIG. 1B is a simplified illustration of an exemplary portable electronic listening device system having a host device configured as a smart phone, a case, and a pair of wireless listening devices configured as earbuds, according to some embodiments of the present disclosure.

An example of such portable electronic listening device system is shown in FIG. 1B, which is a simplified illustration of an exemplary portable electronic listening device system 150 having a host device 152 configured as a smart phone, a case 154, and a pair of wireless listening devices 156 configured as a pair of in-ear hearing devices, according to some embodiments of the present disclosure. Host device 152 can be wirelessly communicatively coupled with case 154 so that host device 152 can receive the charge level data for case 154 and/or the charge level data for wireless listening devices 156. Host device 152 can also be wirelessly communicatively coupled with wireless listening devices 156 so that audio data can be transmitted to wireless listening devices 156 for play back to a user, and audio data can be received by host device 152 as recorded/inputted from microphones in wireless listening devices 156. Wireless listening devices 156 can be wirelessly communicatively coupled with case 154 so that audio data from case 154 can be transmitted to wireless listening devices 156. As an example, case 154 can be coupled to an audio source different than host device 152 via a physical connection, e.g., an auxiliary cable connection. The audio data from the audio source can be outputted to case 154, which can then wirelessly transmit the data to wireless listening devices 156. That way, a user can hear audio by way of wireless listening devices 156 even though the audio device does not have wireless audio output capabilities.

According to some embodiments of the present disclosure, each wireless listening device 156 can include a housing 158 formed of a body 160 and a stem 162 extending from body 160, where housing 158 is formed of a monolithic outer structure. Body 160 can include an internally facing microphone 164 and an externally facing microphone 166 for purposes discussed herein with respect to FIGS. 7-10. Externally facing microphone 166 can be positioned within an opening defined by portions of body 160 and stem 162 as shown in FIG. 1B. By extending into both body 160 and stem 162, microphone 166 can be large enough to receive sounds from a broader area around the user. In some embodiments, housing 158 can be attached to an eartip 174 that can direct sound from an internal audio driver out of housing 158 and into a user's ear canal. Thus, wireless listening devices 156 can be configured as in-ear hearing devices. Stem 162 can be substantially cylindrical in construction, but it can include a planar region 168 that does not follow the curvature of the cylindrical construction. Planar region 168 can indicate an area where the wireless listening device is capable of receiving user input. For instance, a user input can be inputted by squeezing stem 162 at planar region 168. Stem 162 can also include electrical contacts 170 and 172 for making contact with corresponding electrical contacts in case 154, as will be discussed further herein with respect to FIG. 20A.

As will be appreciated herein, wireless listening devices 156 can include several features can enable them to be worn by a user all day. Its eartip can be soft and pliable, and can include control leaks to release trapped pressure in an ear canal so that it is comfortable to wear. Its functionality can also enable wireless listening devices 156 to provide an audio interface to host device 152 so that the user may not need to utilize a graphical interface of host device 152. In other words, wireless listening devices 156 can be so sophisticated that it can enable the user to perform day-to-day operations from host device 152 solely through interactions with wireless listening devices 156. This can create further independence from host device 152 by not requiring the user to physically interact with, and/or look at the display screen of, host device 152, especially when the functionality of wireless listening devices 156 is combined with the voice control capabilities of host device 152. Furthermore, wireless listening devices 156 can function in transparent mode where audible sounds from the surrounding environment can be recorded by externally facing microphone 166 and immediately replicated to the user by outputting the sound through eartip 174 to be heard by the user. Additionally, for those users that are hard of hearing, wireless listening devices 156 can increase the volume of the sounds in the surrounding environment for the user to hear. Moreover, for those users that are in an extremely loud environment, such as a user at a music concert, wireless listening devices 156 can decrease the volume of the sounds in the surrounding environment to a more acceptable level. This adjustment between increasing and decreasing volume can occur automatically to maintain a certain decibel range, in some embodiments. Thus, wireless listening devices 156 can enable a true hands free experience for the user.

Figure 2A:
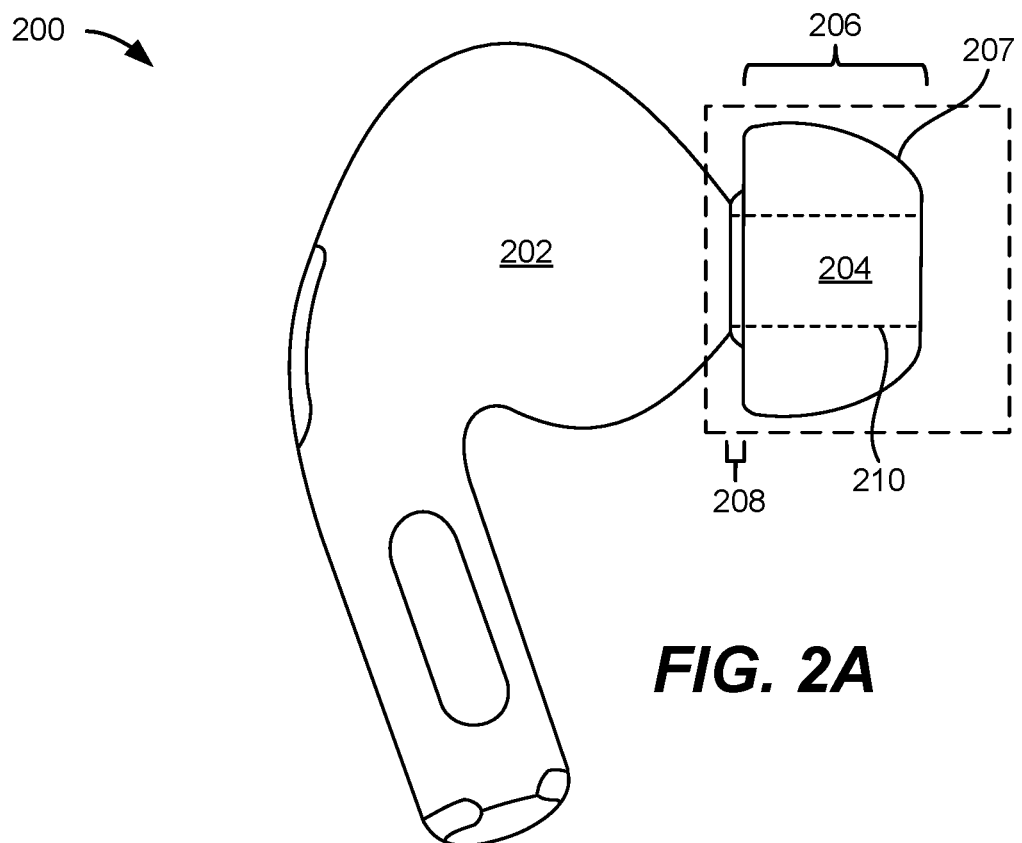
FIG. 2A is a side-view illustration of an exemplary wireless listening device where an eartip is attached to a housing, according to some embodiments of the present disclosure.
Figure 2B:
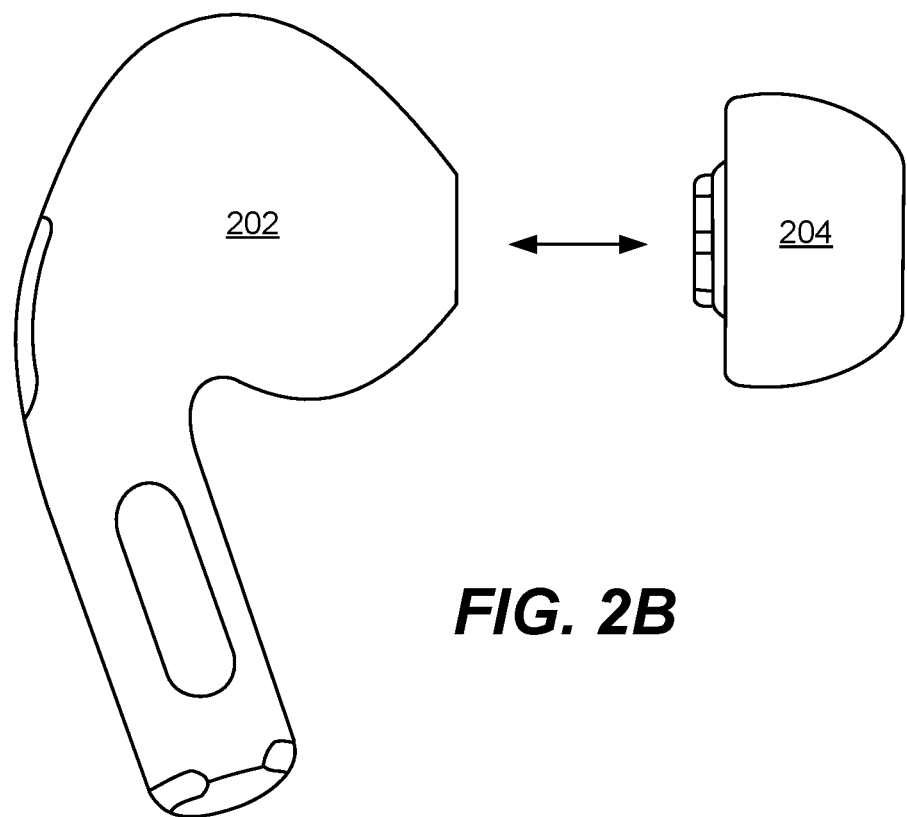
FIG. 2B is a side view illustration of a wireless listening device where an eartip is detached from a housing, according to some embodiments of the present disclosure.

According to some embodiments of the present disclosure, eartip 124 can attach to, and detach from, housing 105, as shown in FIGS. 2A and 2B. FIG. 2A is a side-view illustration of an exemplary wireless listening device 200 including an eartip 204 and a housing 202, where eartip 204 is attached to housing 202, according to some embodiments of the present disclosure; and FIG. 2B is a side view illustration of wireless listening device 200 where eartip 204 is detached from housing 202, according to some embodiments of the present disclosure. As shown in FIG. 2A, eartip 204 can include a tip region 206 and a base region 208 that together form a monolithic structure, and a sound channel 210 that extends through both tip region 206 and base region 208. Tip region 206 can include a curved, annular surface 207 that inserts into an ear canal for directing sound from housing 202 to the user, and can be formed of a pliable material that can easily bend to conform to the inner surfaces of the ear canal for forming an acoustic seal.

Eartip 124 can attach to housing 105 in various ways. For instance, eartip 124 can be magnetically attached to housing using magnets to magnetically attract eartip 124 to housing 105. Eartip 124 can also be attached to housing 105 using mechanical means, such as a screw and threaded hole attachment. In such instances, an opening of housing 105 can be threaded and base region 208 can be correspondingly threaded so that eartip 124 can be screwed into housing 105. Furthermore, eartip 124 can be simply adhered to housing 105 using an adhesive or any other chemical bonding. In certain embodiments, eartip 124 can have features that hook onto housing 105, or a separate wireform attachment mechanism can be implemented in housing 105 to latch onto eartip 124. Further details of the construction of eartip 204 will be discussed further herein with respect to FIGS. 3A-3C and 3E. Eartip 204 can be detached from housing 202, as shown in FIG. 2B, so that damaged eartips can be easily replaced or so that different types and/or sizes of eartips can be used to more comfortably fit in ear canals of different anatomical shapes and sizes.

It is to be appreciated that eartip 204 and housing 202 can have different configuration and functionality that result in improved sound quality and user experience. The details of such configurations and functionalities are discussed further herein.

II. Eartip

As mentioned above, an eartip can be attached to, and detached from, the housing of a wireless listening device. When configured as an in-ear hearing device or a hearing aid, the eartip can be positioned inside the ear canal of a user and direct sound outputted by the housing into the ear canal. In some embodiments, an attachment mechanism can be implemented in the base of the eartip to enable the eartip to attach to, and detach from, the housing as discussed herein with respect to FIGS. 3A-3C.

A. Construction of an Eartip and an Attachment Mechanism

Figures 3A, 3B:
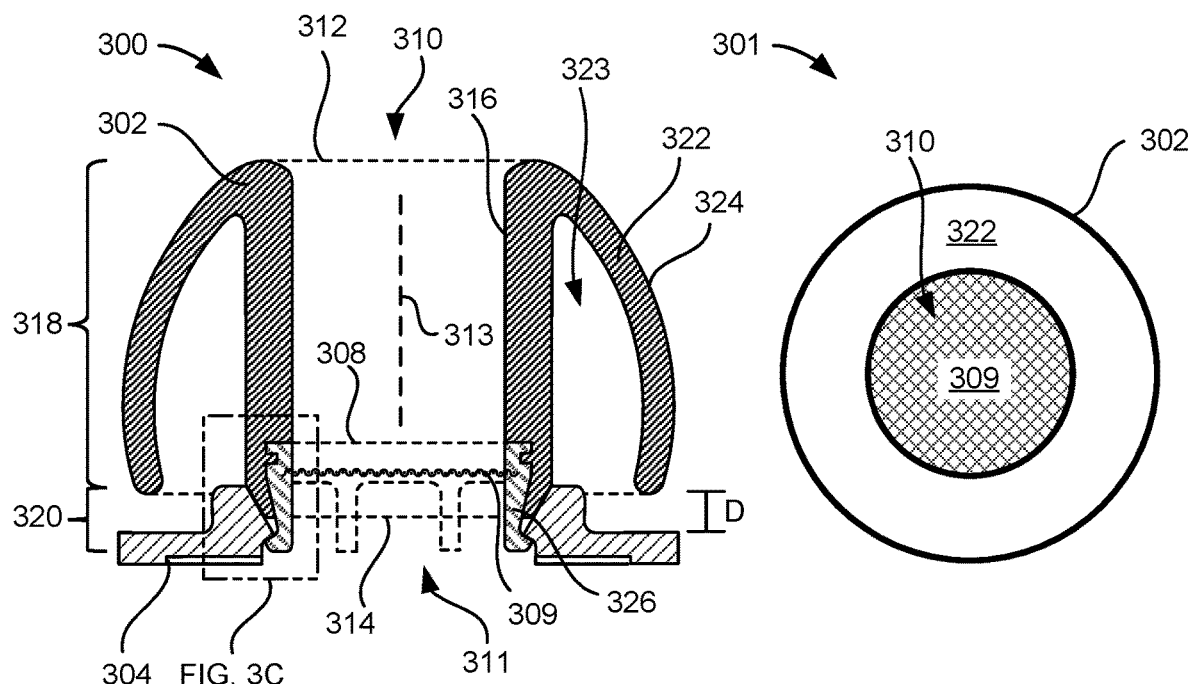
FIG. 3A is a cross-sectional view illustration of an eartip attached to an outer structure of a housing via an attachment mechanism, according to some embodiments of the present disclosure.
FIG. 3B is a top-down view illustration of an eartip, according to some embodiments of the present disclosure.

FIG. 3A is a cross-sectional view 300 of an eartip 302 attached to an outer structure 304 of a housing via an attachment structure 308, according to some embodiments of the present disclosure. It is to be appreciated that discussion of FIG. 3A may refer to FIG. 3B for a better understanding of the structure of eartip 302. FIG. 3B is a top-down view 301 of eartip 302, according to some embodiments of the present disclosure.

With reference to FIG. 3A, eartip 302 can include an eartip body formed of an inner eartip body 316 and an outer eartip body 322 that together form a monolithic structure. Outer eartip body 322 can extend around a perimeter/circumference of inner eartip body 316 and during manufacturing, can initially be formed together as a deformable tube that is later folded over so that outer eartip body 322 is positioned outside of inner eartip body 316 as shown. Inner eartip body 316 can be centered along a central axis 313 and define a sound channel 310 that extends through eartip 302 between an interfacing end 312 and an attachment end 314 of the eartip body. Sound channel 310 can be vacant space through which sound can travel from attachment end 314 to interfacing end 312. In some embodiments, attachment end 314 can be an end of eartip 302 that is configured to attach to outer structure 304 of the housing so that sound generated by the housing can pass into sound channel 310 through an acoustic opening 311 of outer structure 304; and, interfacing end 312 can be an end of eartip 302 opposite from attachment end 314 where outer eartip body 324 begins to extend from inner eartip body 316 (such as at the top end of eartip 302) and that is configured to interface with (e.g., insert into) an ear canal of a user. When eartip 302 is attached to outer structure 304, sound channel 310 can be substantially aligned with acoustic opening 311 of outer structure 304 so that sound the from the housing can easily propagate into sound channel 310.

Inner eartip body 316, in certain embodiments, can be substantially cylindrical and can define a cylindrical sound channel 310. Thus, as shown in the top-down view 301 of FIG. 3B, sound channel 310 can be substantially circular. It is to be appreciated that a circular profile is merely exemplary and that the top-down profile of sound channel 310 can have other profiles, such as ovular, triangular, rectangular, oblong, and the like without departing from the spirit and scope of the present disclosure.

With reference back to FIG. 3A, in some embodiments, eartip 302 can include a tip region 318 and a base region 320 (e.g., tip region 206 and base region 208 in FIG. 2). Tip region 318 can be a part of eartip 302 that inserts into the ear canal of the user while base region 320 can be a part of eartip 302 that extends toward and attaches to outer structure 304 of the housing. Base region 320 can be configured so that eartip 302 minimally protrudes from outer structure 304. For instance, base region 320 can be configured so that tip region 318 is positioned a distance D away from a non-protruding surface of outer structure 304 that is less than 3 mm, particularly less than 2 mm in some embodiments. By having eartip 302 protrude a minimal distance away from outer structure 304 of the housing, eartip 302 may better resist inadvertent separation forces to minimize accidental detachment, as well as minimally protrude from the user's ear when worn for a pleasing appearance.

In some embodiments, outer eartip body 322 can be a part of tip region 318 that extends from, and is coupled to, inner eartip body 316 at interface end 312 of eartip 302 toward attachment end 314. Outer eartip body 322 can bend and conform to the contours of the ear canal to form an acoustic seal to prevent sound from leaking out of the ear canal. Thus, according to some embodiments of the present disclosure, outer eartip body 322 can be formed of a thin, compliant material, e.g., silicone, thermoplastic urethane, thermoplastic elastomer, or the like, that can easily bend and deflect inward and outward to conform to various contours of the ear canal. To allow outer eartip body 322 to deflect inward and outward, outer eartip body 322 can be like a cantilever where its end closest to attachment end 314 is positioned a distance away from inner eartip body 316 to define a deflection zone 323 formed of vacant space within which outer eartip body 322 can freely deflect. In some additional and alternative embodiments, inner eartip body 316 can also be formed of the same material as outer eartip body 322 but of a different, e.g., larger, thickness so that a substantial portion of eartip 300 as a whole can be formed of the compliant material. Inner eartip body 316 can have a larger thickness than outer eartip body 322 because it does not contact the ear canal and provides some structural integrity to eartip 300; thus, it does not need to be as compliant as outer eartip body 322 for conforming to the ear canal.

Outer eartip body 322 can include a curved interface surface 324 that is sized and shaped to make contact with the inner surfaces of the ear canal for forming an acoustic seal when the wireless listening device is worn by the user. Outer eartip body 322 can taper toward interfacing end 312 to make it easier for the user to insert eartip 302 into his or her ear canal. In some embodiments, a part of outer eartip body 322 closest to attachment end 314 can bend back toward inner eartip body 316 to reduce the chances of outer eartip body 322 flipping inside-out.

According to some embodiments of the present disclosure, eartip 302 can include attachment structure 308 for securely attaching to outer structure 304. As mentioned herein, eartip 302 can be formed of a compliant material such as silicone. Compliant materials may not easily attach to stiff structures alone. Thus, attachment structure 308 can be implemented to provide some rigidity for certain parts of eartip 302 to enable eartip 302 to securely attach to outer structure 304. In some embodiments, attachment structure 308 is positioned within base portion 320 and may extend into a portion of tip portion 318 closest to attachment end 314 so that attachment structure 308 can help attach eartip 302 to outer structure 304 of the housing. Attachment structure 308 can be formed of a stiff, rigid material such as plastic or thermal plastic urethane (TPU) that is strong enough to achieve the desired attachment characteristics suitable for attaching eartip 302 with outer structure 304. In some embodiments, attachment structure 308 is formed to be more rigid than inner eartip body 316 and outer eartip body 322.

Attachment structure 308 can include a mesh 309 for preventing debris and other unwanted particles from falling into the housing through acoustic opening 311. Mesh 309 can be an interlaced structure formed of a network of wire that allows sound to propagate through but prevents debris from passing through. In some embodiments, mesh 309 extends into a portion of attachment structure 308 so that mesh 309 can be securely fixed within eartip 302 by the rigid structure of attachment structure 308. Attachment structure 308 can also include a plurality of attachment features 326 that protrude out of attachment end 304 and are configured to physically couple with outer structure 304. In some instances, attachment features 326 can be separately positioned around a perimeter of attachment structure 308 so that attachment features 326 can attach to discrete locations of outer structure 304. Each attachment feature 326 can include an arm and a hook that secures to outer structure 304, as better shown in FIG. 3C.

Figure 3C:
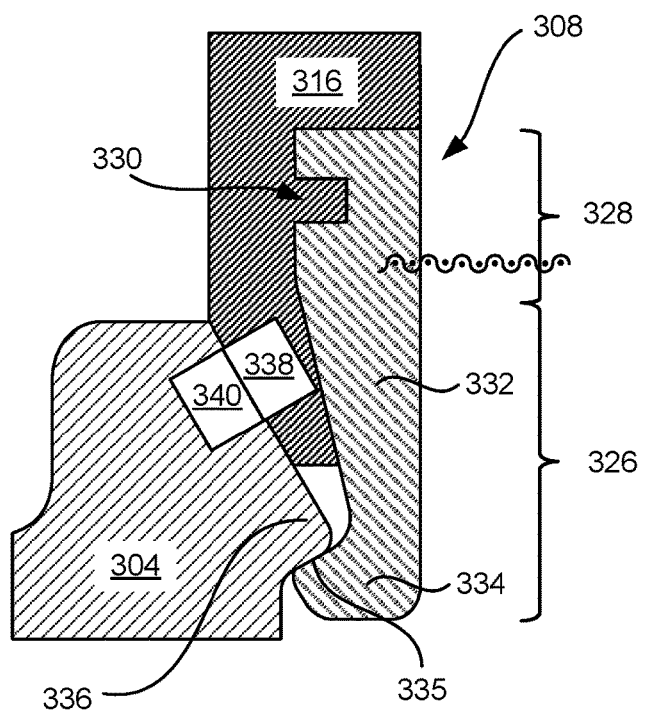
FIG. 3C is a close-up, cross-sectional view illustration of attachment mechanism attached to an outer structure via attachment features, according to some embodiments of the present disclosure.

FIG. 3C is a close-up, cross-sectional view illustration of attachment structure 308 attached to outer structure 304 via attachment features 326, according to some embodiments of the present disclosure. Attachment structure 308 can include a frame portion 328 and attachment features 326 that together form a monolithic structure. Frame portion 328 can be a ring positioned around central axis 313, and can include a groove 330 extending around an outer circumference of frame portion 328. Groove 330 can increase the surface area that contacts inner eartip body 316 to enhance the structural coupling between inner eartip body 316 and attachment structure 308. In some embodiments, attachment features 326 can extend from frame portion 328 in a direction that is parallel to the central axis 313 so that attachment features 326 can attach to outer structure 304 and position central axis 313 at an angle that is substantially perpendicular to the plane in which outer structure 304 is oriented at the attachment location (which is shown to be horizontal in FIG. 3A). Each attachment feature 326 can include an arm 332 and a hook 334 for attaching to outer structure 304. Hook 334 can be a portion of attachment feature 326 that bends away from central axis 313 of attachment structure 308 so that hook 334 can grab onto a lip 336 of outer structure 304 that protrudes into acoustic opening 311 of outer structure 304. In some embodiments, lip 336 extends into acoustic opening 311 and includes an attachment surface 335 to which hook 334 can attach. Arm 332 can be a cantilevered structure that applies outward force when hook 334 is engaged with lip 336 to secure eartip 302 to outer structure 304 of the housing. In some embodiments, lip 336 can extend a short distance away from outer structure 304 and provide a slanted surface upon which base portion 320 of eartip 302 can rest as shown in FIG. 3C to further secure a robust attachment.

In some embodiments, the plurality of attachment features 326 can secure eartip 302 to outer structure 304 with a force that is strong enough to withstand inadvertent detachment (e.g., when the listening device is repositioned in an ear canal or is being held in a user's hand), but weak enough to allow intentional detachment by the user (e.g., when the user wants to change eartip types or when the user wants to clean eartip 302). The plurality of attachment features 326 can also provide tactile feedback when engaged, such as a snapping sensation, when hooks 334 engage with lip 336. Furthermore, as can be appreciated herein, attachment structure 308 allows eartip 302 to attach to outer structure 304 by inserting into an opening of outer structure 304, instead of wrapping around a rigid protrusion of outer structure 304 as is conventionally done. Accordingly, when attached, a portion of eartip 302 may be positioned within outer structure 304 of the housing. In such embodiments, attachment structure 308 requires less total space to securely attach eartip 302 with outer structure 304, and moves the failure point in the event of a drop/bend/pinch event to base region 320 of eartip 302 as opposed to outer structure 304 of the housing. This substantially reduces the cost of replacement/repair of the wireless listening device/in-ear hearing device.

Constructing eartip 302 with a circular profile as shown in the top-down view in FIG. 3B simplifies alignment with acoustic opening 311 of outer structure 304. However, alignment may be more difficult to achieve when eartip 302 is intended to be oriented a certain way when attached to outer structure 304, even more so when eartip 302 is non-circular. Thus, in some embodiments, alignment magnets can be implemented in eartip 302 and outer structure 304 to guide them into proper alignment when they are placed proximate to one another. For instance, a first magnet 338 can be positioned within bottom region 320 of eartip 302 adjacent to a surface that makes contact with outer structure 304, and a second magnet 340 can be positioned within lip 336 of outer structure 304 adjacent to a surface that makes contact with eartip 302 so that magnet 338 can attract magnet 340 to properly orient eartip 302 with outer structure 304 during attachment. Implementing magnets 338 and 340 into both eartip 302 and outer structure 304 of the housing, respectively, can ease the way in which the two components achieve alignment when attaching together.

Although FIGS. 3A-3C illustrate attachment structure 308 as having a plurality of discrete attachment features 326, embodiments are not limited to such configurations. For instance, instead of having a plurality of attachment features that each have an individual arm and hook, some embodiments can have a single, annular attachment feature that attaches to an entire perimeter of acoustic opening 311 of outer structure 304. It is to be appreciated that attachment features having a variety of other types of hooks that extend into acoustic opening 311 for attaching to outer structure 304 can be envisioned herein. For example, various attachment feature designs incorporating wireform attachment mechanisms for attaching an eartip with a housing according to some embodiments of the present disclosure are further discussed and illustrated herein with respect to FIGS. 3D-3Q.

Figure 3D:
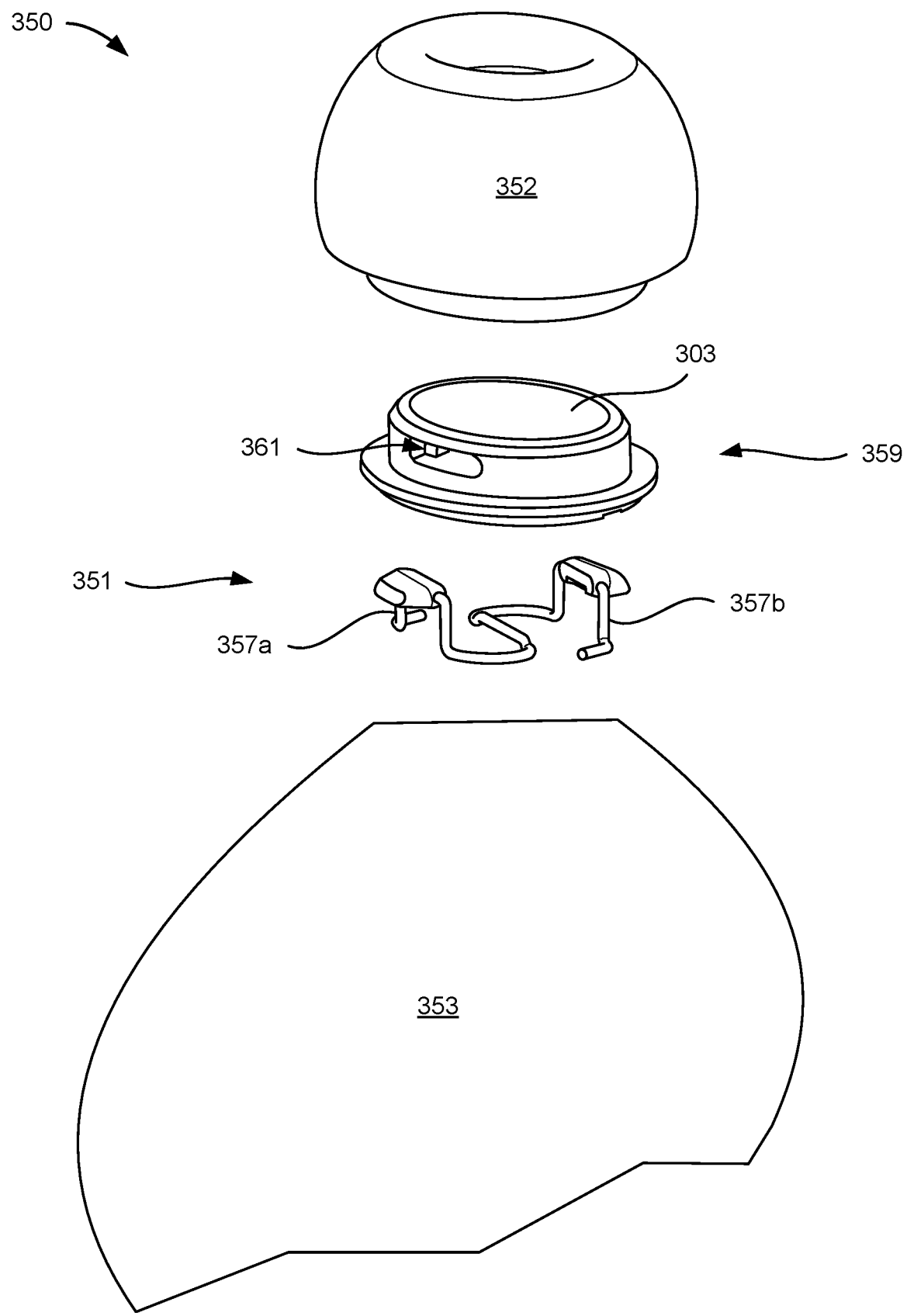
FIG. 3D is an exploded view illustration of an exemplary wireless listening device including a wireform attachment mechanism for attaching an eartip to a housing, according to some embodiments of the present disclosure.

FIG. 3D is an exploded view illustration of an exemplary wireless listening device 350 including a wireform attachment mechanism 351 for attaching an eartip 352 to a housing 353, according to some embodiments of the present disclosure. In some instances, eartip 352 can be attached to a nozzle 359, and nozzle 359 can be securely attached to, or be a portion of, housing 353. When configured to be securely attached to housing 353, nozzle 359 can be a separate structure from housing 353 that is attached via welding or adhesive so that nozzle 359 cannot separate from housing 353. Alternatively, when configured to be a portion of housing 353, nozzle 359 can be a monolithic portion of housing 353 that protrudes outward away from housing 353. Nozzle 359 can include openings 361 through which portions of wireform attachment mechanism 351 can extend to latch eartip 352 to housing 353, and nozzle 359 can include a mesh 303 to cover the opening of nozzle 359 and prevent dust and debris from entering housing 353, as will be discussed further herein with respect to FIG. 3I. Wireform attachment mechanism 351 can be an independent and separate structure from nozzle 359 and housing 353 that makes contact with both components. Because eartip 352 attaches to housing 353 by way of wireform attachment mechanism 351, eartip 352 may be configured to complement the design of wireform attachment mechanism 351, as will be discussed further herein.

Figure 3E:
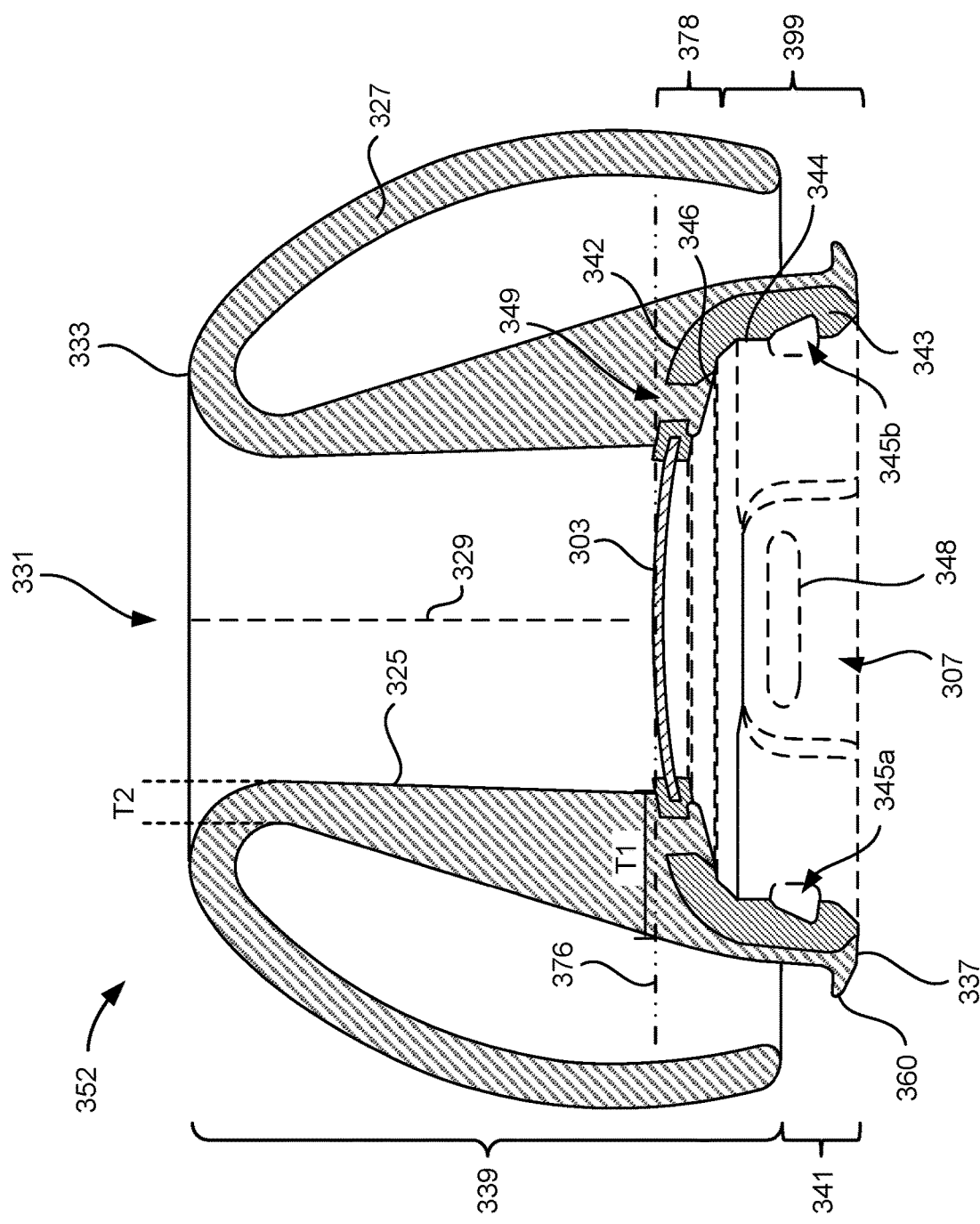
FIG. 3E is a cross-sectional view illustration of an eartip configured to attach to a housing by way of a wireform attachment mechanism, according to some embodiments of the present disclosure.

FIG. 3E is a cross-sectional view illustration of eartip 352 configured to attach to a housing by way of a wireform attachment mechanism, according to some embodiments of the present disclosure. Like eartip 302 in FIG. 3A, eartip 352 can include an eartip body formed of an inner eartip body 325 and an outer eartip body 327 that together form a monolithic structure. Outer eartip body 327 can extend around a perimeter/circumference of inner eartip body 325 and during manufacturing, can initially be formed together as a deformable tube that is later folded over so that outer eartip body 327 is positioned outside of inner eartip body 325 as shown in FIG. 3E. Inner eartip body 325 can be centered along a central axis 329 and define a sound channel 331 that extends through inner eartip body 325 between an interfacing end 333 and an attachment end 337 of the eartip body. In some embodiments, attachment end 337 can be an end of the eartip body that is configured to attach to the housing via a nozzle and a wireform attachment feature so that sound generated by the housing can pass into sound channel 331 through an acoustic opening of the housing; and, interfacing end 333 can be an end of eartip 352 opposite from attachment end 337 where outer eartip body 327 begins to extend from inner eartip body 325, such as at the top end of the eartip body.

Inner eartip body 325, in certain embodiments, can be substantially ovular and can define a sound channel 331; thus, the top-down outer profile of eartip 352 can also be substantially ovular or oblong in some instances. However, embodiments are not limited to such configurations and can have other profiles, such as circular, triangular, rectangular, and the like without departing from the spirit and scope of the present disclosure.

Like eartip 302 in FIG. 3A, eartip 352 can also include a tip region 339 and a base region 341. Tip region 339 can be a part of eartip 352 that inserts into the ear canal of the user while base region 341 can be a part of eartip 352 that extends toward and attaches to the housing. Base region 341 can be configured so that eartip 352 minimally protrudes from the outer structure of the housing, e.g., distance D in FIG. 3A, thereby enabling eartip 352 to better resist inadvertent separation forces to minimize accidental detachment, as well as minimally protrude from the user's ear when worn for a pleasing appearance.

In some embodiments, eartip 352 can include an attachment structure 343 that is formed of a different and stiffer material than what is used to construct the eartip body. Attachment structure 343 can be formed of a stiffer material so that its rigidity can be more suitable for attaching to the housing. Attachment structure 343 can include an upper region 378 and a lower region 399 that extends from upper region 373. Upper region 378 can have a more horizontal disposition than lower region 399, which may be more vertical than upper region 378, thereby being an inverted u-shaped profile as shown. Unlike attachment structure 308 in FIG. 3A which has features that actively grip onto the housing, attachment structure 343 instead includes recesses 345a-b around lower region 399 for providing latching points for wireform attachment mechanism 351 for attachment. Recesses 345a-b can be cavities defined by an inner surface 344 of lower region 399 of attachment structure 343 that passively allow a wireform attachment mechanism to secure eartip 352 to a housing. For instance, portions of the lower region below recesses 345a-b can form an inverted overhang structure that hooks onto an external structure, such as an end cap of a wireform attachment structure, as will be discussed further herein with respect to FIGS. 3J-3L. Inner eartip body 325 can interface with attachment structure 343 at a boundary 376 where inner eartip body 325 initially makes contact with attachment structure 343 as shown by a dashed and dotted line. Boundary 376 can be defined by an imaginary horizontal line positioned between interfacing end 333 and attachment end 337, as shown in FIG. 3E.

According to some embodiments of the present disclosure, the thickness of a sidewall of inner eartip body 325 can gradually change from one end to the other. The sidewall of inner eartip body 325 can be defined by a portion of inner eartip body 325 disposed between boundary 376 and interfacing end 333. As an example, inner eartip body 325 can have a first sidewall thickness T1 closest to boundary 376 and a second sidewall thickness T2 closest to interfacing end 333 that is smaller than the first sidewall thickness T1. In some instances, the thickness of the sidewall gradually decreases from first sidewall thickness T1 to second sidewall thickness T2, as shown in FIG. 3E. Furthermore, in some embodiments, the inner surface of inner eartip body 325 may be substantially vertical while the outer surface of inner eartip body 325 may be sloped so that the gradual change in thickness is created by the sloped surface of the outer surface of inner eartip body 325. Having a thinner sidewall thickness at interfacing end 333 enables the eartip body to be more pliable at interfacing end 333 so that eartip 352 can be more comfortable to the user when worn. In certain embodiments, the thickness of outer eartip body 327 can be the same as the second sidewall thickness T2 of inner eartip body 325.

Although FIG. 3E illustrates the eartip body that includes inner eartip body 325 separated from outer eartip body 327 by a deflection zone, embodiments are not so limited. In some embodiments, inner eartip body 325 and outer eartip body 327 can be one solid, compliant structure formed of silicone. Thus, a deflection zone may not be defined between inner eartip body 325 and outer eartip body 327. Any other type of configuration is envisioned herein without departing from the spirit and scope of the present disclosure.

Eartip 352 can also include a mesh 303 for preventing debris and other unwanted particles from falling completely through sound channel 331. Mesh 303 can be a soft, porous fabric that allows sound to propagate through but prevents debris from passing through. For instance, mesh 303 can be formed of a polyester fabric. In some embodiments, mesh 303 extends into upper region 378 of attachment structure 343 so that mesh 303 can be securely fixed within eartip 352 by the rigid structure of attachment structure 343.

As can be appreciated from the illustration of FIG. 3E, the structure of the eartip body (i.e., inner eartip body 325 and outer eartip body 327) can be formed of a different, more pliable material than what is used for forming attachment structure 343. For instance, inner eartip body 325 and outer eartip body 327 can be formed of silicone, while attachment structure 343 is formed of a stiff polymer, such as polycarbonate. Thus, to form eartip 352, the soft pliable structure of inner eartip body 325 may be securely attached to attachment structure 343. In some embodiments, inner eartip body 325 and outer eartip body 327 are molded over attachment structure 343 so that a degree of chemical bonding is achieved at the interface between the two structures during the manufacturing process. However, in some additional embodiments, several through-holes 349 can be positioned around an upper region of attachment structure 343 to allow the soft material of which inner eartip body 325 is formed to pass from an outer surface 342 of attachment structure 343 to an inner surface 344 of attachment structure 343. In some instances, the amount of material that passes through through-holes 349 can result in a formation of a thin, annular structure 346 that extends across a part of inner surface 344 of attachment feature 343 near through-holes 349. The combination of annular structure 346 and structural pass-throughs between inner eartip body 325 and attachment structure 343 creates a mechanical interlocking feature that further strengthens the bond between inner eartip body 325 and attachment structure 343. In some instances, annular structure 346 can be an extension of inner eartip body 325 that covers at least part of inner surface 344 of attachment structure 343. Thus, annular structure 346, material within pass-throughs 349, inner eartip body 325, and outer eartip body 327 can all be part of a same monolithic structure.

In some embodiments, attachment structure 343 also includes a control leak 348 set in a cavity region 307, as will be discussed further herein with respect to FIG. 6D. Control leak 348 can provide an atmospheric pass-through between an outside environment and sound channel 331 so that eartip 352 does not completely seal the ear canal and trap pressure within the ear canal. This can allow for a more comfortable user experience and can also improve the acoustic performance of the listening device. Cavity region 307 can be a shallow cavity defined by inner surface 344 of attachment structure 343 to mitigate the chances of control leak 348 from being occluded from the inside of inner eartip body 325, as will be discussed further herein with respect to FIG. 6E. In some embodiments, outer eartip body 327 can be modified to mitigate the changes of control leak 348 from being occluded from the outside of inner eartip body 325, as will be discussed further here with respect to FIGS. 6F-6H.

In some instances, inner eartip body 325 can further include an annular attachment flange 360 extending around a perimeter of attachment structure 343 at attachment end 337. Attachment flange 360 can form an acoustic seal by pressing against an inner side surface of a housing, e.g., housing 353 in FIG. 3D. Attachment flange 360 can extend away from center line 329 of inner eartip body 325 and in an upward and lateral direction as shown in FIG. 3E. By configuring attachment flange 360 to extend upward and laterally, the directionality of the collapse of attachment flange 360 when it makes contact with the housing can be controlled. Because attachment flange 360 is part of inner eartip body 325, attachment flange 360 can be formed of the same material as inner eartip body 325, such as silicone. In some instances, attachment flange 360 can be an extension of inner eartip body 325 that covers at least part of outer surface 342 of attachment structure 343. Thus, attachment flange 360, inner eartip body 325, and outer eartip body 327 can all be part of a same monolithic structure.

With reference back to FIG. 3D, according to some embodiments of the present disclosure, wireform attachment mechanism 351 can attach eartip 352 to nozzle 359, and thus to housing 353. Wireform attachment mechanism 351 can be configured to enable eartip 352 to mechanically attach to and detach from housing 353. In some embodiments, wireform attachment mechanism 351 can enable eartip 352 to latch onto nozzle 359 with application of low insertion force and resist separation from housing 353 once eartip 352 is latched onto nozzle 359. Once eartip 352 is attached to nozzle 359, wireform attachment mechanism 351 does not have to apply active force to maintain attachment. Rather, the physical structure of wireform attachment mechanism 351 can allow eartip 352 to remain attached to nozzle 359. That way, wireform attachment mechanism 351 does not have to apply a high amount of active force to keep eartip 352 attached to nozzle 359 and allow attachment by application of a low insertion force, as will be discussed further herein with respect to FIG. 3I.

Figures 3F, 3G:
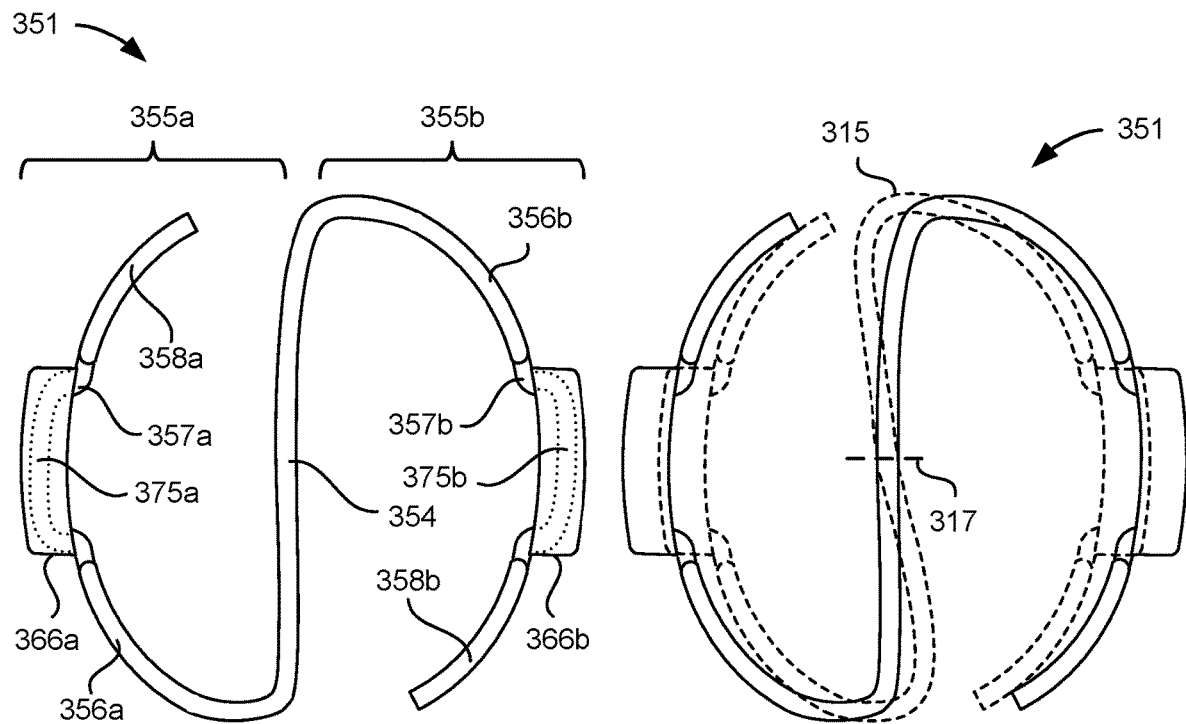
FIGS. 3F-3H are illustrations of a wireform attachment mechanism that has an s-shaped profile configured to compress toward its center when engaging with an eartip, according to some embodiments of the present disclosure.
Figure 3H:
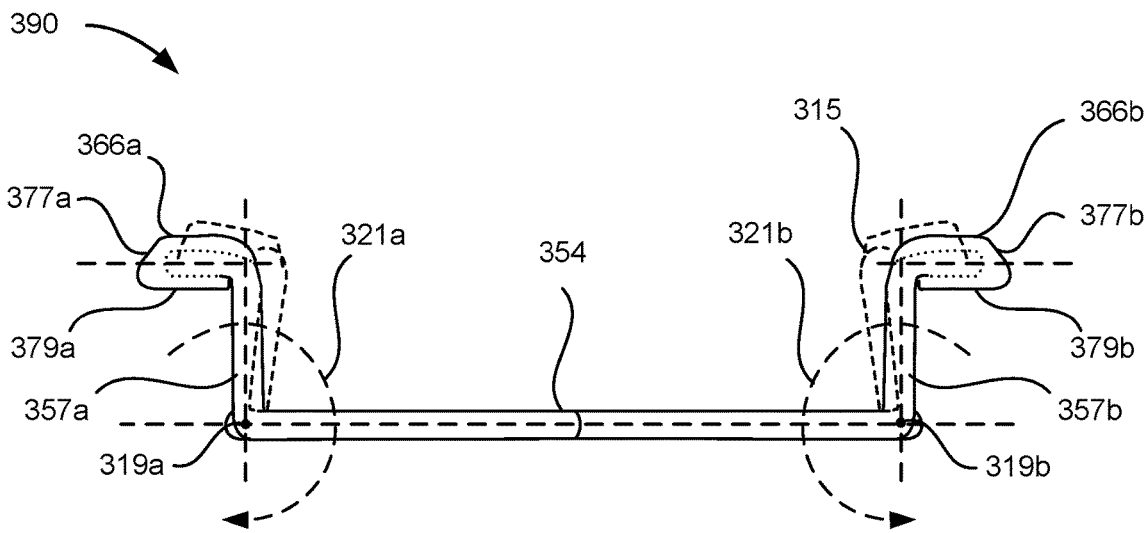

Wireform attachment mechanism 351 can include a body formed of a single, contiguous strip of wire that is bent in various directions to create a compressible spring that can apply pressure in a lateral direction to attach eartip 352 to nozzle 359. FIGS. 3F-3H are illustrations of wireform attachment mechanism 351 that has an s-shaped profile configured to compress toward its center when engaging with an eartip, according to some embodiments of the present disclosure. Specifically, FIG. 3F is a top-down view illustration of wireform attachment mechanism 351 in its uncompressed state, FIG. 3G is a top-down view illustration of uncompressed wireform attachment mechanism 351 superimposed over its compressed state, and FIG. 3H is a side-view illustration of wireform attachment mechanism 351 superimposed over its release state, according to some embodiments of the present disclosure.

As shown in FIG. 3F, the strip of wire forming wireform attachment mechanism 351 can have an s-shape profile that includes a center segment 354 having opposing ends from which two wireform features extend. The two wireform features can include a first wireform feature 355a and a second wireform feature 355b that each includes respective intermediate segments 356a-b, u-shaped segments 357a-b, and end segments 358a-b. U-shaped segments 357a-b can be positioned between intermediate segments 356a-b and end segments 358a-b as shown in FIG. 3F. U-shaped segments 357a-b may not appear to have a u-shaped profile from the top-down view in FIG. 3F because the u-shaped profile of the bent wire extends into/out of the page, but its u-shaped profile may be more apparent in FIG. 3D which shows a perspective view of wireform attachment mechanism 351. With reference back to FIG. 3F, in some embodiments, center segment 354 can have a substantially straight profile/construction, and intermediate segments 356a-b extending from center segment 354 can have an arcuate profile/construction. The curvature of intermediate segments 356a-b can conform to a segment of a corresponding outer profile of nozzle 359 so that intermediate segments 356a-b can achieve a better fit with nozzle 359. Wireform attachment mechanism 351 can also include end caps 366a-b that cover respective lateral bend portions 375a-b of u-shaped segments 357a-b. As shown in the side-view illustration in FIG. 3H, end caps 366a-b can have a beveled top corner 377a-b and a flat bottom surface 379b. Beveled top corner 377a-b can transition vertical insertion force into lateral force to bend wireform attachment mechanism 380 during attachment, and flat bottom surface 379b can resist separation of the eartip once attached and lock onto respective portions of an attachment structure (e.g., portions of the lower region of the attachment structure below recesses 345a-b discussed herein with respect to FIG. 3E).

In some embodiments, center segment 354, intermediate segments 356a-b and end segments 358a-b can be substantially positioned in a same first plane, while u-shaped segments 357a-b can be substantially positioned in different but parallel second and third planes. The first plane can be positioned at an angle from the second and third planes. For instance, the first plane can be substantially perpendicular to the second and third planes, or at any other suitable angle without departing from the spirit and scope of the present disclosure. In some embodiments, wireform features 355a-b can each include respective end caps 366a-b that cover the center portion of u-shaped segments 357a-b to provide a better fit with nozzle 359 and eartip 352 when eartip 352 is attached to housing 353 via wireform attachment mechanism 351.

During attachment, the eartip can press against end caps 366a-b until end caps 366a-b snap into the recesses in the nozzle, as will be discussed further herein with respect to FIGS. 3J-3L. When pressing against end caps 366a-b, wireform attachment mechanism 351 can bend into a compressed state 315, as shown in FIG. 3G represented by a dotted silhouette of parts of wireform attachment mechanism 351, to allow the attachment structure of the eartip to slide over the nozzle. In some embodiments, opposite halves of wireform attachment mechanism 351 can be cantilever beams that bend from a midpoint 317 of center segment 354. Each half of wireform attachment mechanism 351 can have a long beam length so that they bend at a lower insertion forces than other configurations with shorter beam lengths. The beam length can be defined by the length of wireform attachment mechanism 351 from midpoint 317 to one of its ends.

During extraction, the eartip can be pulled away from the housing to release end caps 366a-b from the recesses of the eartip. Instead of resulting in a bending motion as shown in FIG. 3G to release end caps 366a-b from the recesses, extraction can result in a torsional motion as shown in FIG. 3H. During the torsional motion, wireform attachment mechanism 351 can rotate the u-shaped segments 357a-b around axes defined by a line perpendicular to the page that intersects the two points where the end segments 358a-b and intermediate segment 356a-b meet u-shaped segments 357a-b, as shown by axes 319a-b in FIG. 3H. That way, when u-shaped segments 357a-b rotate along curves 321a-b around axes 319a-b, end caps 366a-b can move inwards to allow the eartip to be released from the housing and separated. The direction of curves 321a-b along which u-shaped segments 357a-b rotate can be opposite from one another. For instance, curve 321a can be clockwise while curve 321b can be counter-clockwise, as shown in FIG. 3H.

According to some embodiments of the present disclosure, wireform attachment mechanism 351 may be easier to bend than it is to move in a torsional rotation, and thus have a high torsional force to bending force ratio. This characteristic can be attributed in part to the long beam length resulting from the s-shape profile, as well as the properties of the wire itself, which can have a torsional rigidity that is higher than its bending rigidity due to the nature of a long and thin wire. This high ratio can allow wireform attachment mechanism 351 to allow an eartip to attach to a housing with a low insertion force while requiring a higher extraction force to release the eartip from the housing. This force profile enhances user experience because it enables the eartip to be easily yet robustly connected to the housing. In some embodiments, the force at which end caps 366a-b set into recesses of the eartip can generate an audible noise that can give the user another degree of feedback to confirm that the eartip has been attached.

To attach eartip 352 and nozzle 359 to housing 353, wireform attachment mechanism 351 can apply lateral force at the end caps 366a-b in the horizontal direction away from center segment 354. End caps 366a-b can fit through openings 361 of nozzle 359 and within respective recesses in eartip 352 to attach eartip 352 to housing 353, which is better illustrated in FIG. 3I.

Figure 3I:
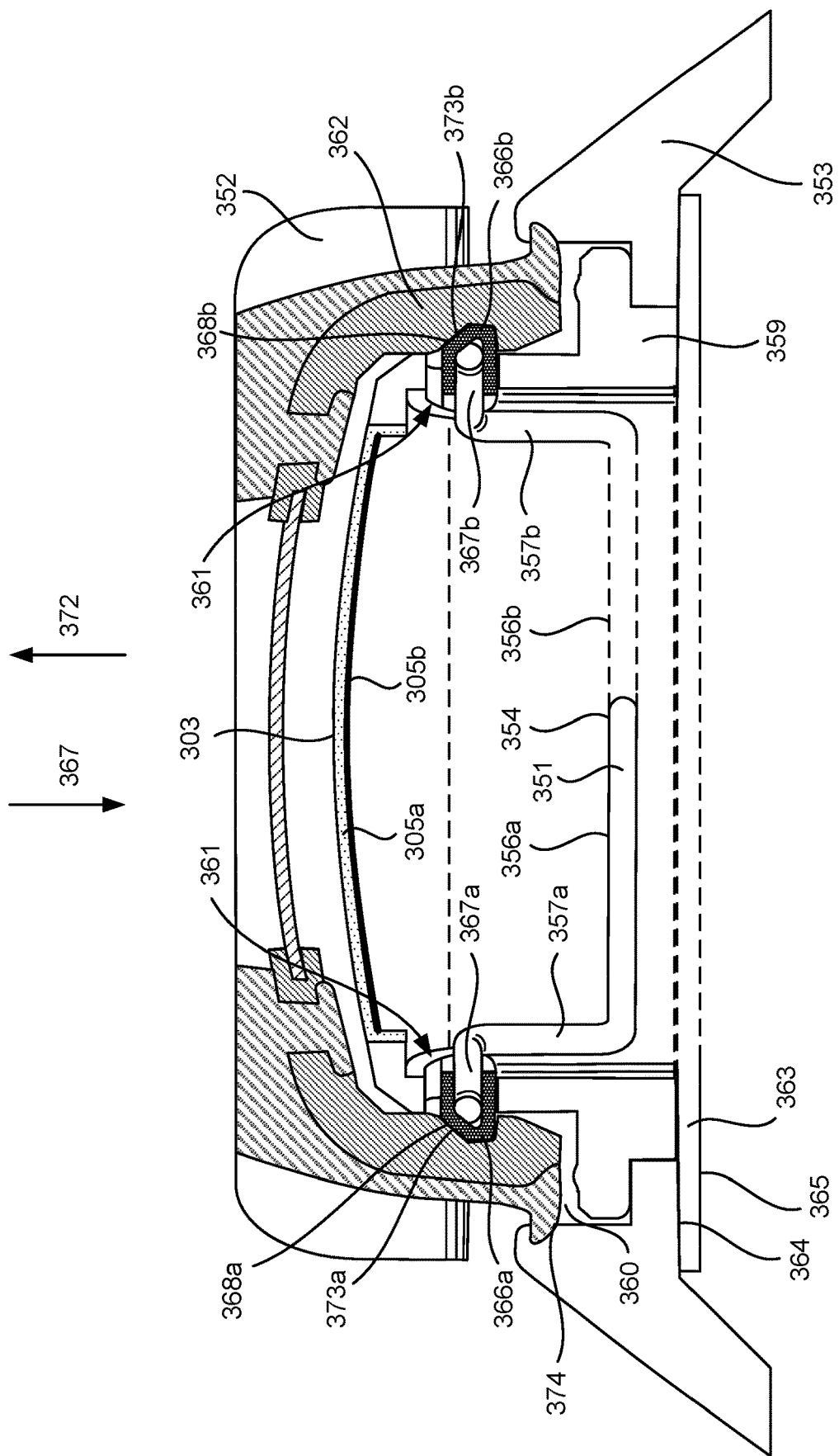
FIG. 3I is a cross-sectional view illustration of an eartip attached to a housing via a wireform attachment mechanism, according to some embodiments of the present disclosure.

FIG. 3I is a cross-sectional view illustration of eartip 352 attached to housing 353 via wireform attachment mechanism 351, according to some embodiments of the present disclosure. Eartip 352 can be directly attached to nozzle 359, which can be (1) a separate structure that is securely attached to housing 353 as shown in FIG. 3I, or (2) a protruding monolithic portion of housing 353 (not shown). Nozzle 359 can include mesh 303 that covers the opening of nozzle 359 to prevent dust and debris from entering housing 353. Mesh 303 can be formed as a multi-layered structure including a cosmetic mesh 305a and an acoustic mesh 305b adhered to the cosmetic mesh, where cosmetic mesh 305a forms an outer surface of nozzle 359 and is formed of an interlaced network of stiff wire, while acoustic mesh 305b is adhered to an inner surface of cosmetic mesh 305a and is formed of a porous fabric. For instance, cosmetic mesh 305a can be formed of interlaced stainless steel and acoustic mesh 305b can be formed of polyester. To securely attach nozzle 359 to housing 353, a welding ring 363 can be used to securely attach housing 353 to nozzle 359. Welding ring 363 can be a stiff structure in the shape of a flat ring having a top surface 364 and bottom surface 365 opposite from top surface 364. In some embodiments, housing 353 and nozzle 359 can be welded to top surface 364 of welding ring 363 so that housing 353 and nozzle 359 are securely attached to one another. Welding ring 363 can be formed of any suitable material, such as a metal. It is to be understood that FIG. 3I is a close-up view of how wireform attachment mechanism 351 attaches eartip 352 housing 353 and nozzle 359, so only portions of eartip 352 and housing 353 are shown.

As shown in FIG. 3I, wireform attachment mechanism 351 can include u-shaped segments 357a-b whose center portions are covered by end caps 366a-b. End caps 366a-b can extend through openings 361 in nozzle 359 and into eartip 352. In some embodiments, end caps 366a-b can extend into respective recesses 368a-b in eartip 352. Recesses 368a-b can be formed in a frame portion 362 of eartip 352. As mentioned herein, eartip 352 can be formed of a compliant material such as silicone, which may not easily attach to stiff structures, e.g., end caps 366a-b, alone. Thus, frame portion 362 can be implemented in eartip 352 to provide some rigidity for securely attaching eartip 352 to nozzle 359 via wireform attachment mechanism 351. Frame portion 362 can be formed of a stiff, rigid material such as plastic or thermal plastic urethane (TPU) that is strong enough to achieve the desired attachment characteristics suitable for attaching eartip 352 with nozzle 359. In some embodiments, frame portion 362 is formed to be more rigid than the inner eartip body and outer eartip body, e.g., inner eartip body 316 and outer eartip body 322 in FIG. 3A, of eartip 352.

Figure 3J:
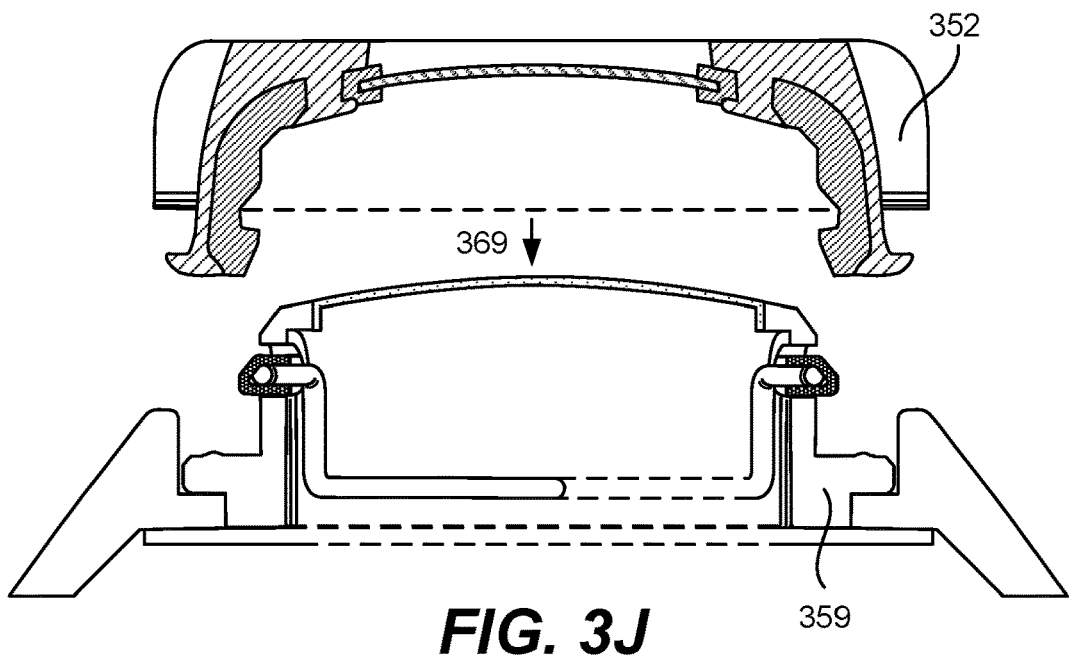
FIGS. 3J-3L are a series of illustrations showing different points along the process of attaching an eartip to a nozzle, according to some embodiments of the present disclosure.
Figure 3K:
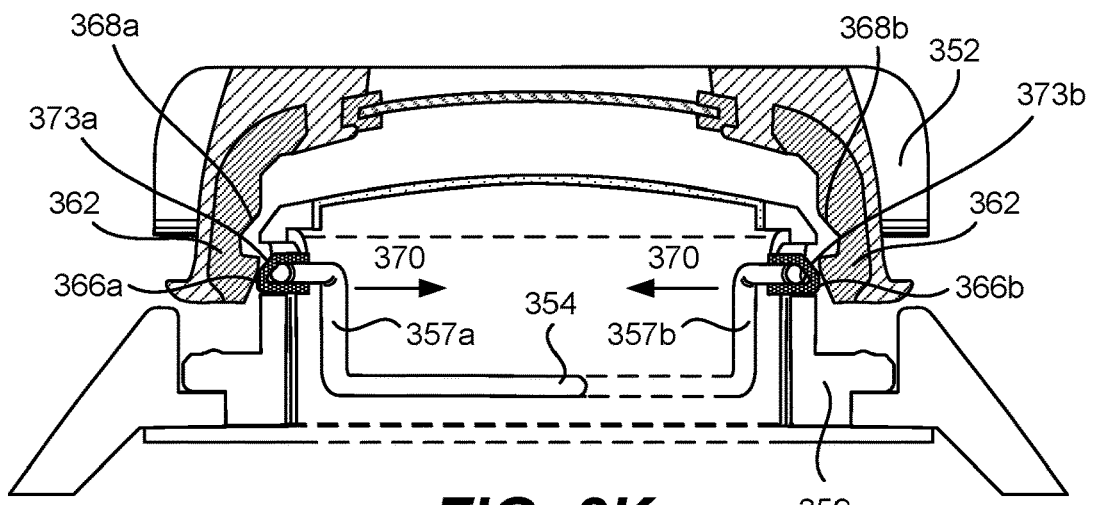
Figure 3L:
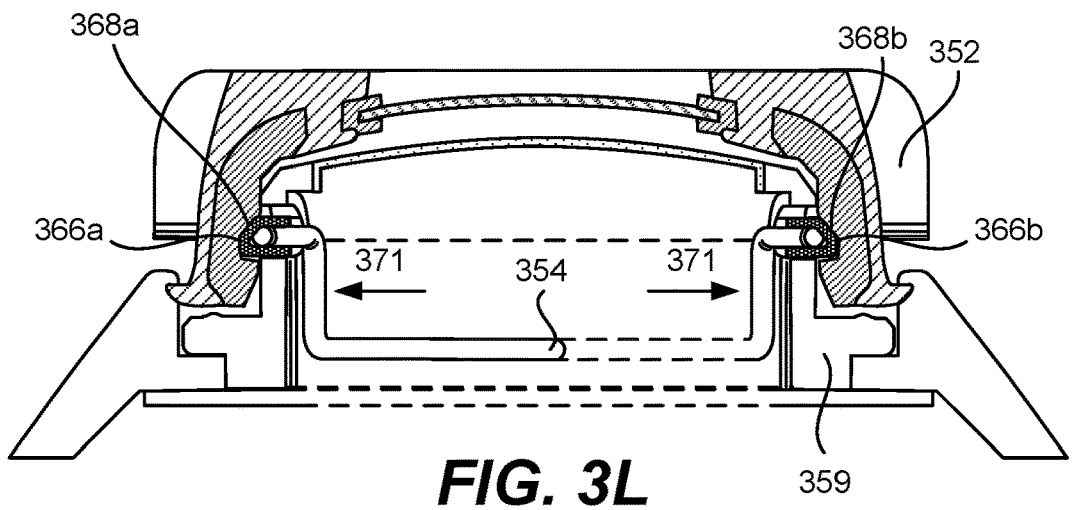

FIGS. 3J-3L are a series of illustrations showing different points along the process of attaching eartip 352 to nozzle 359, according to some embodiments of the present disclosure. To attach eartip 352 to nozzle 359 (and thus to housing 353), eartip 352 can be pressed into housing 353 in a downward direction 369 as shown in FIG. 3J. Pressing eartip 352 downward causes frame portion 362 of eartip 352 to press against end caps 366a-b of wireform attachment mechanism 351, as shown in FIG. 3K. In some instances, frame portion 362 of eartip 352 presses against end caps 366a-b with a force in a lateral inward direction 370 toward center segment 354 such that end caps 366a-b deflect inward as it slides along frame portion 362. Center segment 354 of wireform attachment mechanism 351 can allow each wireform feature to shift laterally toward center segment 354. In some embodiments, u-shaped segments 357a-b can move horizontally toward center segment 354 as a whole, as shown in FIG. 3K. End caps 366a-b can include respective beveled corners 373a-b so that end caps 366a-b can transition vertical downward force into lateral inward force that presses end caps 366a-b inward toward center segment 354 when force in downward direction 369 is applied to attach eartip 352 to nozzle 359. Once end caps 366a-b reach recesses 368a-b as shown in FIG. 3L, end caps 366a-b can click into place as the spring forces generated by the s-shape profile of wireform attachment mechanism 351 press in a lateral outward direction 371 away from center segment 354. When end caps 366a-b are clicked into place, eartip 352 can be successfully attached to nozzle 359 and housing 353, and an acoustic seal can be formed by attachment flange 360 at interface 374. Attachment flange 360 can press against the inner surface of housing 353 in a lateral direction; thus, attachment flange 360 can form a radial seal with housing 353. In some embodiments, clicking end caps 366a-b into recesses 368a provides a tactile feel that gives the user feedback to indicate when successful attachment has occurred, which can result in an enhanced user experience.

With reference back to FIG. 3I, when eartip 352 is attached to nozzle 359 and housing 353, wireform attachment mechanism 351 can resist separation forces in an upward direction 372 by blocking the upward movement of eartip 352 with end caps 366a-b. In some embodiments, end caps 366a-b are positioned to interfere with the vertical movement of frame portion 362 so that their structure passively resists separation of eartip 352 from housing 353. Thus, wireform attachment mechanism does not need to apply active clamping force to hold eartip 352 in place. This design is robust and reliable and does not lose resistance strength over time. In certain embodiments, the slope of beveled corners 373a-b allow end caps 366a-b to easily press inward toward center segment 354 when force in downward direction 369 is applied to attach eartip 352 to nozzle 359. Conversely, the bottom corner of end cap 366a-b may not include beveled corners so that end caps 366a-b can resist substantially greater separation forces in upward direction 372. Thus, eartip 352 can be attached under the application of low insertion force in downward direction 367 and separated under the application of high force in upward direction 372. This force profile enabled by wireform attachment mechanism 351 can provide improved user experience and attachment reliability. In some embodiments, the attachment force sufficient to attach eartip 352 to nozzle 359 can be applied by a set of magnets (not shown). The magnets can be placed at regions in eartip 532 and nozzle 359 near interface 374 or any other interface where eartip 532 and nozzle 359 meet so that attractive magnetic forces can draw eartip 532 to nozzle 359 with enough force to effectuate attachment.

In some embodiments, u-shaped segments 357a-b can include respective lateral bend portions 367a-b to which end caps 366a-b are attached, as shown in FIG. 3I. Lateral bend portions 367a-b can extend in a horizontal plane parallel to the plane in which center segment 351 and intermediate segments 356a-b are positioned in a non-overlapping manner. Thus, lateral bend portions 367a-b can be positioned at an angle with respect to the rest of the u-shaped segment 357a-b, such as at a 90 degree angle. Lateral bend portions can improve the structural strength of end caps 366a-b and provide a stiff frame to which it can attach.

Although FIGS. 3D-3L discuss wireform attachment mechanisms configured with s-shape profiles, embodiments are not limited to such configurations. It is to be appreciated that any wireform shape can be used to attach eartips to housings without departing from the spirit and scope of the present disclosure. Examples of some suitable variations of wireform attachment mechanisms are discussed herein with respect to FIGS. 3M-3O and FIGS. 3P-3Q.

Figure 3M:
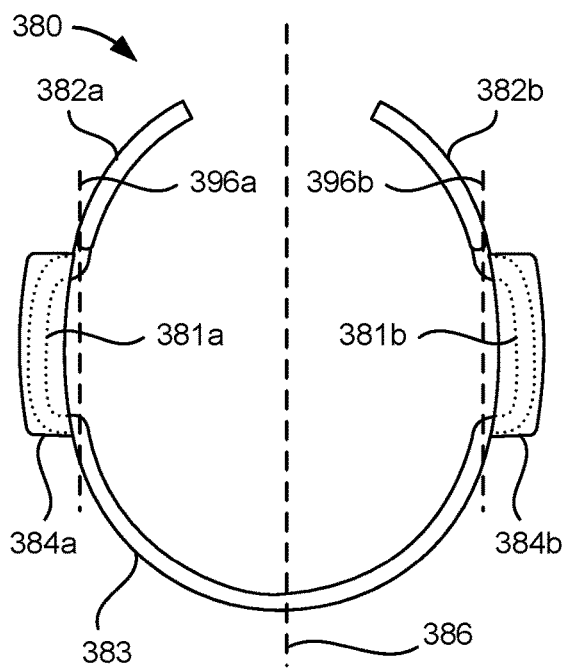
FIGS. 3M-3O are illustrations of an exemplary wireform attachment mechanism that has a u-shaped profile configured to compress toward its center when engaging with an eartip, according to some embodiments of the present disclosure.
Figure 3N:
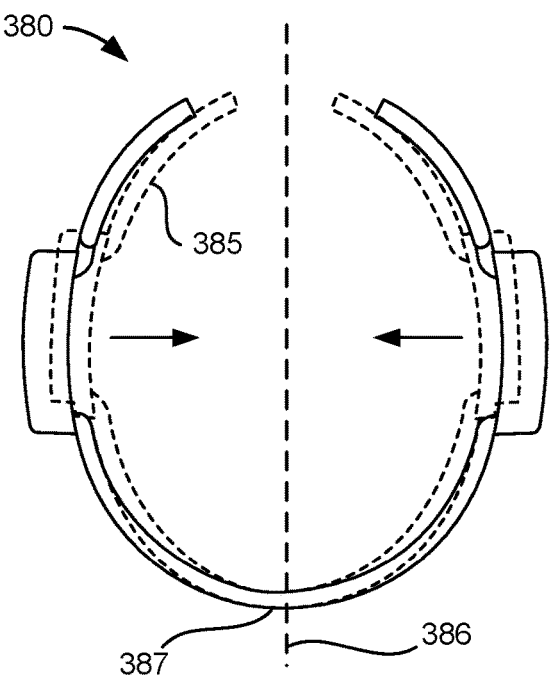
Figure 3O:
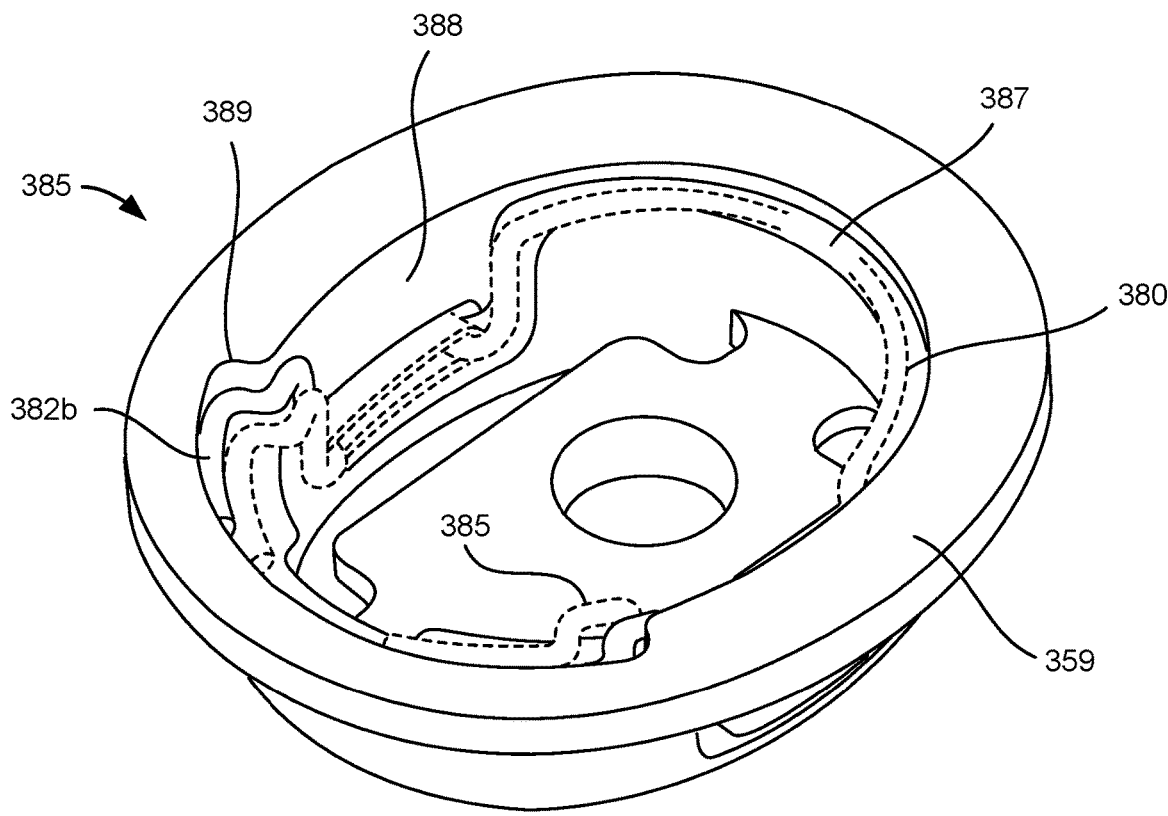

FIGS. 3M-3O illustrate an exemplary wireform attachment mechanism 380 that has a u-shaped profile configured to compress toward its center when engaging with an eartip, according to some embodiments of the present disclosure. Specifically, FIG. 3M is a top-down view illustration of wireform attachment mechanism 380 in its uncompressed state, FIG. 3N is a top-down view illustration of uncompressed wireform attachment mechanism 380 superimposed over its compressed state, and FIG. 3O is a bottom-up perspective view illustration of wireform attachment mechanism 380 positioned in a nozzle, according to some embodiments of the present disclosure.

As shown in FIG. 3M, wireform attachment mechanism 380 can be constructed of a single, contiguous strip of wire that is bent to have a u-shaped profile that includes u-shaped segments (not seen from this view) having respective lateral bend portions 381a-b coupled to respective end segments 382a-b. Each end segment 382a-b can have a first end coupled to a respective u-shaped segment and an opposite second end that is dangling, e.g., not connected to any other part of wireform attachment mechanism 380. Unlike wireform attachment mechanism 351 in FIG. 3D, wireform attachment mechanism 380 may not include a center segment, but instead may just have an connecting segment 383 formed of a single curve of wire having an arcuate profile. Thus, according to some embodiments of the present disclosure, wireform attachment mechanism 380 can include two wireform features that are delineated by a center line 386 and configured as mirror images of one another where each wireform feature includes an intermediate segment formed by a respective half of connecting segment 383. Connecting segment 383 can be coupled to ends of lateral bend portions 381a-b opposite from the ends to which lateral bend portion 381a-b are attached. In some embodiments, end caps 384a-b can be attached over lateral bend portions 381a-b, similar to end caps 366a-b and lateral bend portions 375a-b discussed herein with respect to FIG. 3I, for inserting into respective openings in the nozzle for attaching an eartip to the nozzle.

During attachment, as discussed herein with respect to FIGS. 3J-3L, the eartip can press against end caps 384a-b until a certain point at which end caps 384a-b snap into the recesses in the nozzle. When pressing against end caps 384a-b, wireform attachment mechanism 380 can bend into a compressed state 385, as shown in FIG. 3N represented by a dotted silhouette of parts of wireform attachment mechanism 380, to allow the frame portion of the eartip to slide over the nozzle. In some embodiments, opposite halves of wireform attachment mechanism 380 (when divided by a center line 386) can be cantilever beams that are fixed at a joint region 387 of connecting segment 383. During compression, in some instances, each entire half can move toward center line 386 in a horizontal direction while bending at joint region 387. In the compressed state, opposite halves of wireform attachment mechanism 380 divided by a center line 381 can be positioned closer to center line 381 than when wireform attachment mechanism 380 is in an uncompressed state. Furthermore parts of wireform attachment mechanism 380 positioned farther away from joint region 387 may move more during compression than parts of wireform attachment mechanism 380 positioned closer to joint region 387.

As shown in FIG. 3O, nozzle 359 can have an inner surface 388 that matches the curvature of wireform attachment mechanism 380. Inner surface 388 can include a recess 389 that provides space for end segments 382a-b to be positioned, as well as to provide clearance space for allowing end segments 382a-b to move when wireform attachment mechanism 380 transitions from an uncompressed state to a compressed state, as discussed herein with respect to FIG. 3N. In some embodiments, joint region 387 of wireform attachment mechanism 380 can be freely resting on inner surface 388, or joint region 387 can be securely attached to inner surface 388 via an adhesive, welding, or any other suitable attachment method. Joint region 387 can be relatively small to allow a substantial majority of wireform attachment mechanism 380 move during compression, as shown in FIG. 3N. However, in some embodiments, joint region 387 can be relatively large to allow only a small portion of wireform attachment mechanism 380 move during compression, as discussed herein with respect to FIGS. 3P-3Q.

Figure 3P:
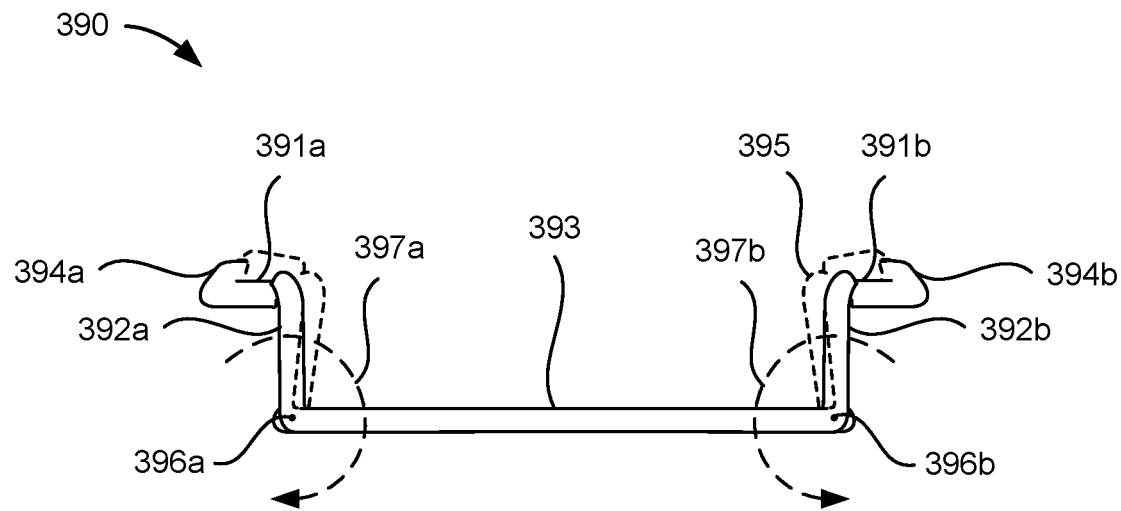
FIGS. 3P-3Q are illustrations of an exemplary wireform attachment mechanism that has a u-shaped profile configured to rotate its end caps around an axis when engaging with an eartip, according to some embodiments of the present disclosure.
Figure 3Q:
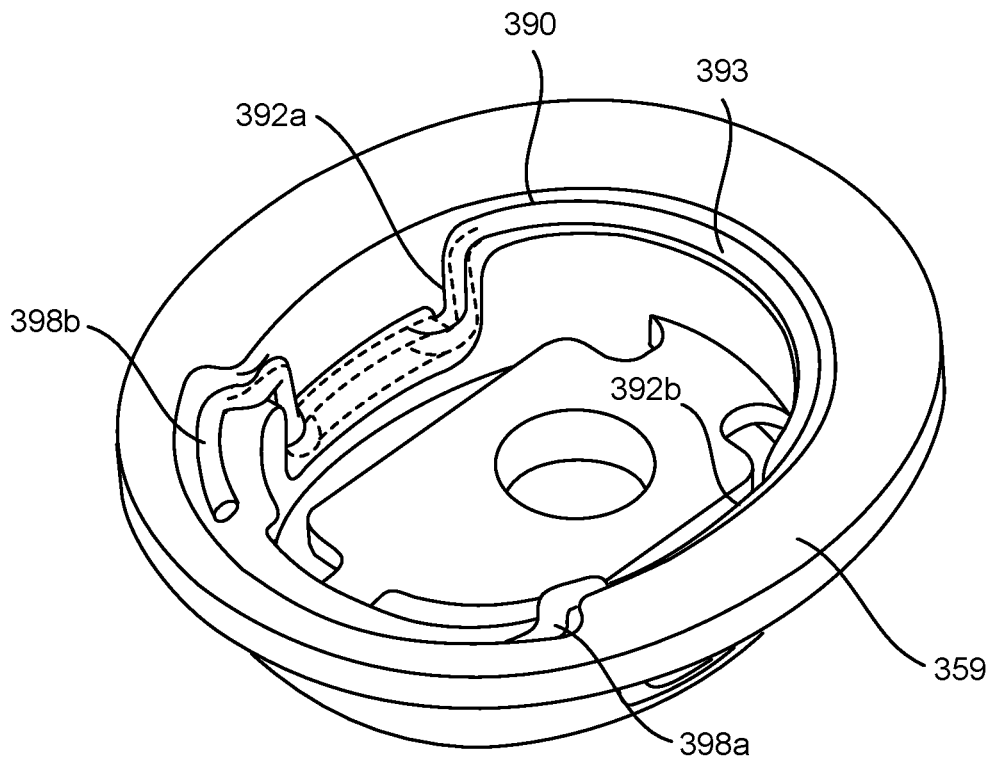

FIGS. 3P-3Q illustrate an exemplary wireform attachment mechanism 390 that has a u-shaped profile configured to rotate its end caps around an axis when engaging with an eartip, according to some embodiments of the present disclosure. Specifically, FIG. 3P is a side view illustration of uncompressed wireform attachment mechanism 390 superimposed over its compressed state, and FIG. 3Q is a bottom-up perspective view illustration of wireform attachment mechanism 390 positioned in a nozzle, according to some embodiments of the present disclosure.

Similar to wireform attachment mechanism 380, wireform attachment mechanism 390 shown in FIG. 3P can be constructed of a single, contiguous strip of wire that is bent to have a u-shaped profile substantially similar to that shown in FIG. 3M. Accordingly, wireform attachment mechanism 390 can include a pair of lateral bend portions 391a-b coupled to respective u-shaped segments 392a-b that are coupled together via a connecting segment 393 formed of a single curve of wire. According to some embodiments of the present disclosure, wireform attachment mechanism 390 can include two wireform features that are delineated by a center line 396 and configured as mirror images of one another. Each wireform feature can include an end segment, a u-shaped segment including a lateral bend portion, and an intermediate segment formed by a respective half of connecting segment 393. Connecting segment 393 can be coupled to ends of lateral bend portions 391a-b opposite from the ends to which lateral bend portion 391a-b are attached. End caps 394a-b can be attached over lateral bend portions 391a-b for inserting into respective openings in the nozzle for attaching an eartip to the nozzle.

When the eartip presses against end caps 394a-b during attachment, wireform attachment mechanism 390 can bend into a compressed state 395, as shown in FIG. 3P and represented by a dotted silhouette of parts of wireform attachment mechanism 390, to allow the frame portion of the eartip to slide over the nozzle. Unlike wireform attachment mechanism 380 where the entire halves compresses laterally during attachment, wireform attachment mechanism 390 can instead rotate only the u-shaped segments 392a-b around an axis. The axis can be defined by a line that intersects the two points where the end segments and intermediate segment meet u-shaped segments 392a-b, as shown by axes 396a-b in FIG. 3M. That way, when u-shaped segments 392a-b rotate along curves 397a-b around axes 396a-b, end caps 394a-b can move inwards to allow the eartip to move toward the nozzle until end caps 394a-b snap into recesses of the eartip, as discussed herein with respect to FIG. 3L. The direction of curves 397a-b along which u-shaped segments 392a-b rotate can be opposite from one another. For instance, curve 397a can be clockwise while curve 397b can be counter-clockwise, as shown in FIG. 3P.

As shown in FIG. 3Q, wireform attachment mechanism 390 can rest on inner surface 388 of nozzle 359. In some embodiments, connecting segment 393 can be freely resting on inner surface 388, or connecting segment 393 can be securely attached to inner surface 388 via an adhesive, welding, or any other suitable attachment method. In certain embodiments, a vast majority of connecting segment 393, such as the entire length of connecting segment 393, can be securely attached to inner surface 388. Furthermore, end segments 398a-b can also be securely attached to inner surface 388 of nozzle 359. That way, only u-shaped segments 392a-b can rotate around axes 396a-b during compression, as discussed herein with respect to FIGS. 3P-3N.

B. Capacitive Eartip

According to some embodiments of the present disclosure, an eartip can be configured as a sensor for detecting when the wireless listening device is worn by a user. For instance, the eartip can be configured as a capacitive sensor that changes in capacitance when the eartip is inserted in an ear canal.

FIG. 4A is an exemplary eartip 400 configured as a capacitive sensor, according to some embodiments of the present disclosure. As a capacitive sensor, eartip 400 can include a first conductive structure 402 and a second conductive structure 404 positioned within tip region 318 of eartip 400 and separated by deflection zone 323. First conductive structure 402 can be a metal plate bent into a inner eartip body-like shape that can be positioned on an outer surface of inner eartip body 316 in some embodiments, or a conductive inner eartip body 316 by doping inner eartip body 316 with conductive material to convert inner eartip body 316 into a conductive structure. Similarly, second conductive structure 404 can be a metal plate bent and curved to conform to an inner surface of outer eartip body 322, or be a conductive outer eartip body 322 by doping outer eartip body 322 with conductive material to convert outer eartip body 322 into a conductive structure. With this construction, the two conductive structures 402 and 404 and deflection zone 323 can define a first capacitance when eartip 300 is not inserted into an ear canal, but change in capacitance (e.g., increase in capacitance) when eartip 300 is inserted into an ear canal due to the deflection of outer eartip body 322 toward inner eartip body 316 when eartip 300 is inserted into the ear canal, as shown in FIGS. 4B and 4C. In some embodiments, each conductive structure 402 and 404 extends around the entire circumference of eartip 400. However, in some other embodiments, each conductive structure 402 and 404 may extend around only a portion of the entire circumference of eartip 400. In such instances, each conductive structure 402 and 404 can be configured as a strip of conductive plating that are positioned directly across from one another to form a capacitor.

FIGS. 4B and 4C are cross-sectional views of eartip 400 when it is inserted into an ear canal, according to some embodiments of the present disclosure. As shown in FIG. 4B, eartip 400 can bend and conform to the inner surfaces of ear canal 406 when eartip 400 is inserted into ear canal 406. Housing 202 may not bend or conform when the wireless listening device, e.g., in-ear hearing device, is worn by the user. As shown in FIG. 4C, outer eartip body 322 may bend into deflection zone 323 when the wireless listening device is worn, thereby causing some parts of first and second conductive structures 402 and 404 to be positioned closer to one another. As such, the capacitance created by conductive structures 402 and 404 and the smaller separation distance between them may be different from, e.g., greater than, the capacitance when eartip 400 is not inserted into an ear canal, which is shown in FIG. 4A for instance. Thus, eartip 400 can be configured to have a first capacitance when it is not inserted into an ear canal, and a second capacitance when it is inserted into an ear canal. By modifying eartip 400 to be a capacitive sensor, additional, bulkier sensors are not needed in the housing, thereby helping the housing achieve a smaller form factor.

The wireless listening device can be configured to measure the difference in capacitance and determine that the wireless listening device has been worn by the user. This determination can be made when the capacitance of eartip 400 changes past a threshold value. By being able to determine when the device is worn, the wireless listening device can enhance user experience by automatically initiating specific, targeted UI controls related to the wireless listening device when it detects that it is worn, such as automatically providing play/pause options for music, answering/ending phone calls, and the like.

C. Patterned Eartip

Instead of, or in addition to, configuring the eartip as a capacitive sensor, some embodiments can configuring the eartip as an optical indicator that changes when the eartip is inserted into an ear canal. For instance, the eartip can include a pattern of lines and spaces on an inner surface of the outer eartip body that can be observed by an optical sensor in the housing to determine if the wireless listening device is worn by a user, as discussed further herein with respect to FIGS. 5A-5C. Specifically, FIG. 5A is a bottom-up view of an exemplary eartip 500 configured with patterned lines 502 separated by spaces 504 on an inner surface of its outer eartip body 506, FIG. 5B is a side-view of an exemplary wireless listening device 501 with eartip 500 and a housing 510 with an optical sensor 508 for observing the inner surface of outer eartip body 506, and FIG. 5C is a bottom-up view of eartip 500 after deflection from being inserted into an ear canal, according to some embodiments of the present disclosure.

Figure 5A:
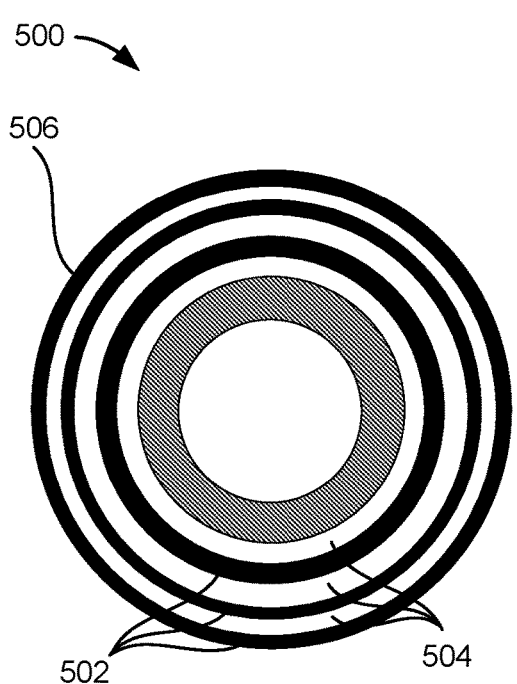
FIG. 5A is a bottom-up view illustration of an exemplary eartip configured with patterned lines separated by spaces on an inner surface of its outer eartip body, according to some embodiments of the present disclosure.
Figure 5B:
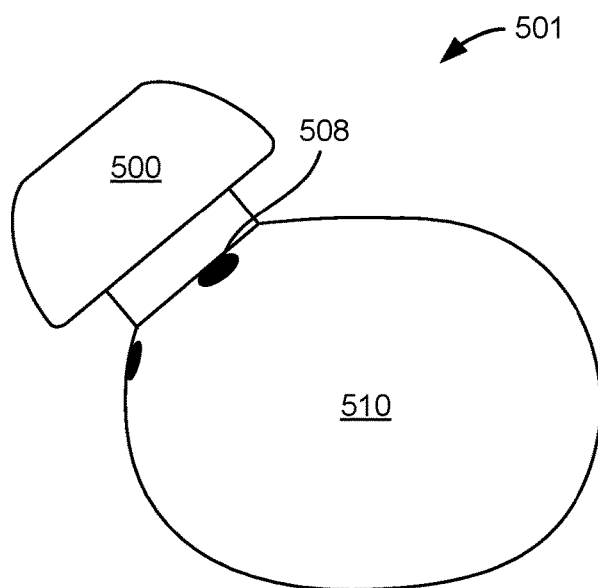
FIG. 5B is a side-view illustration of an exemplary wireless listening device with an eartip and a housing having an optical sensor for observing the inner surface of the outer eartip body, according to some embodiments of the present disclosure.
Figure 5C:
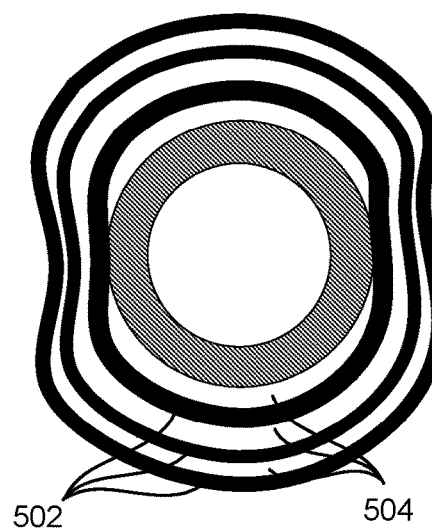
FIG. 5C is a bottom-up view of an eartip after deflection from being inserted into an ear canal, according to some embodiments of the present disclosure.

As shown in FIG. 5A, the inner surface of outer eartip body 506 can have a series of patterned lines 502 separated by gaps 504. Lines 502 can extend along the entire circumference of outer eartip body 506 and thus can have a substantially circular shape. The thickness of each line can be the same as or different from other patterned lines, and the size of each gap can similarly be the same as or different from the size of other gaps. The series of patterned lines 502 can be observed by an optical sensor 508 that faces eartip 500. In some embodiments, optical sensor 508 can detect changes in patterned lines 502 when eartip 500 is inserted into an ear canal. For instance, as shown in FIG. 5C, patterned lines 502 and gaps 504 can alter in shape due to outer eartip body 506 deflecting and conforming to an inner surface of an ear canal. In certain embodiments, optical sensor 508 can observe pattern lines 502 and gaps 504 as a whole, or observe a portion 510 of patterned lines 502 and gaps 504. Optical sensor 508 can, in some embodiments, observe only a portion of the series of patterned lines 502 and gaps 504 in front of optical sensor 508. And, in some embodiments, more than one optical sensor can be implemented to observe the entire patterned lines 502 and gaps 504 around the circumference of eartip 500. When more than one optical sensor is used, they can be positioned axially symmetrical around the opening in housing to which eartip 500 is attached.

Wireless listening device 501 can determine that it is worn by a user when patterned lines 502 and gaps 504 deflect a threshold distance away from its initial position when it is not inserted into an ear canal, e.g., as shown in FIG. 5A. Thus, eartip 500 can be configured to have a first line pattern when it is not inserted into an ear canal, and a second line pattern different from the first line pattern when it is inserted into an ear canal. Each line pattern can be substantially circular and extend around a circumference of eartip 500. By modifying eartip 500 to have patterned lines 502 and gaps 504 and configuring housing 510 to have an optical sensor for observing patterned lines 502 and gaps 504, eartip 500 may not have conductive structures, thereby making it simpler to manufacture and having less avenues for failure.

Being able to determine when the device is worn by measuring a deflection of patterned lines and gaps, the wireless listening device can, enhance user experience by automatically initiating specific, targeted UI controls related to the wireless listening device when it detects that it is worn, such as automatically providing play/pause options for music, answering/ending phone calls, and the like. Additionally, the wireless listening device can be configured to detect unique deflection patterns and associate those unique deflection patterns with individual users. By doing this, the wireless listening device can automatically set its operational settings to reflect specific predefined preferences of that user. Furthermore, being able to detect unique patterns can allow the wireless listening device to be able to identify which eartip type is attached to the housing. For instance, different sizes of eartips can have different, unique patterns of lines and gaps. The housing can be configured to observe the unique patterns of lines and gaps when the eartips are not inserted into an ear canal and automatically determine which eartip is attached to the housing by matching the observed patterns of lines and gaps with a list of known patterns of lines and gaps for the different types of eartips. In some embodiments, instead of observing the individual line and gap patterns, optical sensor 508 can measure the observed color of the inner surface of eartip 500 as a whole. That way, a less expensive optical sensor can still be used to detect the identity of eartip 500.

D. Control Leak for Eartip

As can be appreciated herein, the outer eartip body of an eartip according to some embodiments of the present disclosure can press against an inner surface of an ear canal to form an acoustic seal. This acoustic seal can enhance the quality of sound experience by the user, but it can also sometimes trap pressure in the ear canal, potentially causing an unpleasant sensation to the user. Thus, in some embodiments, the eartip can include a control leak for preventing the trapping of pressure in the ear canal while still enabling the outer eartip body to form an acoustic seal.

Figure 6A:
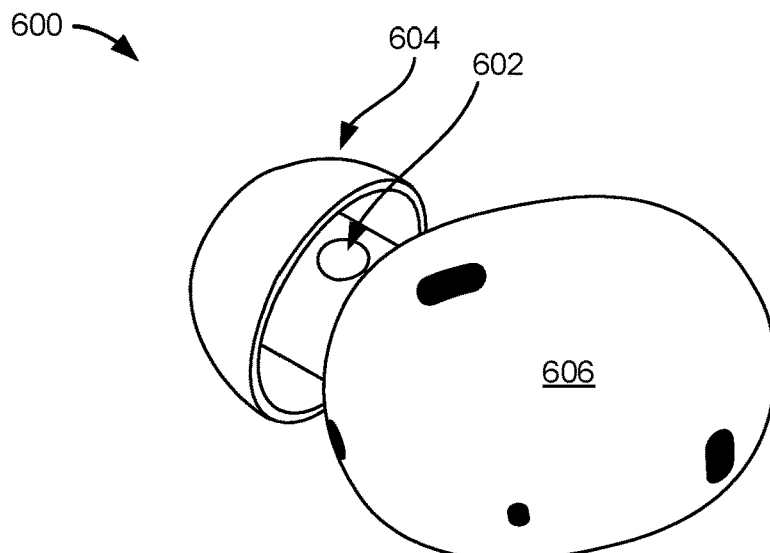
FIG. 6A is a perspective view illustration of an exemplary wireless listening device having a control leak in its eartip, according to some embodiments of the present disclosure.

FIG. 6A is a perspective view of an exemplary wireless listening device 600 having a control leak 602 in eartip 604, according to some embodiments of the present disclosure. Control leak 602 can be positioned in an inner eartip body of eartip 604. In some embodiments, control leak 602 is an opening that provides an avenue through which pressure built up in the ear canal can be released to atmosphere, thereby relieving the ear canal of any trapped pressure and preventing the user from experiencing any unpleasant sensation from trapped pressure. Control leak 602 can be a circular hole or be configured with any other shape, such as an ovular, oblong, rectangular, square-like, triangular, octagonal, and the like without departing from the spirit and scope of the present disclosure.

As shown in FIG. 6A, control leaks positioned in eartip 604 can be located closer to the ear drum than control leaks implemented in housing 606. Locating control leak 602 close to the ear drum can improve the effectiveness of control leak 602 by virtue of their close proximity to the ear drum alone. Furthermore, implementing control leaks in the eartip avoids the formation of an additional opening in the outer structure of housing 606, thereby resulting in a housing that has fewer debris ingress points for better product reliability. Moreover, implementing control leaks in the inner eartip body of eartip 604 mitigates the chances of the control leaks from being blocked by the physical contours and protrusions of a user's ear because the outer eartip body can shield them from those surfaces. Additionally, moving the control leak into eartip 604 allows the control leak to be easily accessed by the user by merely removing eartip 604 from housing 606. Thus, the control leak can be regularly cleaned and easily replaced.

Control leaks of different shapes and sizes can have more or less resistance to occlusion. For instance, elongated control leaks that are in the shape of ovals, rectangles, or oblong openings can be more resistant to occlusion from debris than control leaks that are in the shape of circles or squares because elongated control leaks have greater opening areas than non-elongated control leaks. In some embodiments, eartip 604 includes a single control leak 602, while other embodiments can have more than one control leak, as shown in FIGS. 6B and 6C.

Figure 6B:
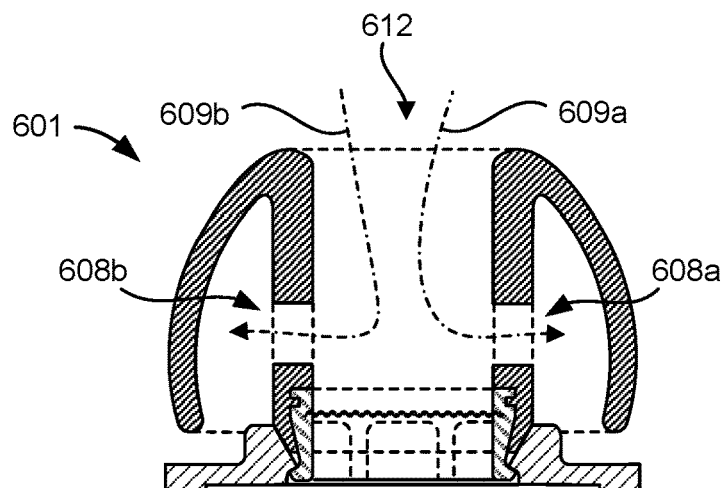
FIGS. 6B and 6C are cross-sectional view illustrations of different eartips with different control leak configurations, according to some embodiments of the present disclosure.
Figure 6C:
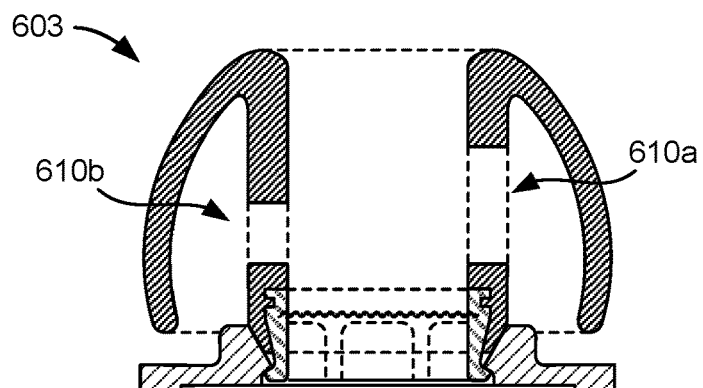

FIGS. 6B and 6C are cross-sectional view illustrations of different eartips with different control leak configurations. As shown in FIG. 6B, eartip 601 can have a control leak configuration that includes at least two control leaks: a first control leak 608a and a second control leak 608b. First and second control leaks 608a and 608b can be positioned in the same plane but in opposite hemispheres of the inner eartip body so that pressure can be released from the ear canal through pressure release pathways 609a and 609b through opening 612. Having a larger number of control leaks decreases the chances of complete occlusion because having more control leaks means greater redundancy, where even if one control leak is occluded, the other control leaks may not be occluded and still enable trapped pressure to be released. In certain embodiments, both control leaks 608a and 608b can be configured to have the same size and shape. However, in some embodiments, control leaks 608a and 608b can be configured to have different sizes and shapes, as shown in FIG. 6C. That is, eartip 603 in FIG. 6C can have a first control leak 610a that is elongated and a second control leak 610b that is not elongated, or a first control leak 610 that is the same shape as second control leak 610b but just larger in size. It is to be appreciated that any number, shape, and size of control leak(s) implemented in the inner eartip body of an eartip are envisioned herein, without departing from the spirit and scope of the present disclosure.

Although FIGS. 6A-6C illustrate control leaks being formed by the inner eartip body of an eartip, embodiments are not limited to such embodiments. Rather, one or more control leaks can be formed in the attachment structure of an eartip, as further discussed herein with respect to FIGS. 6D-6E.

Figure 6D:
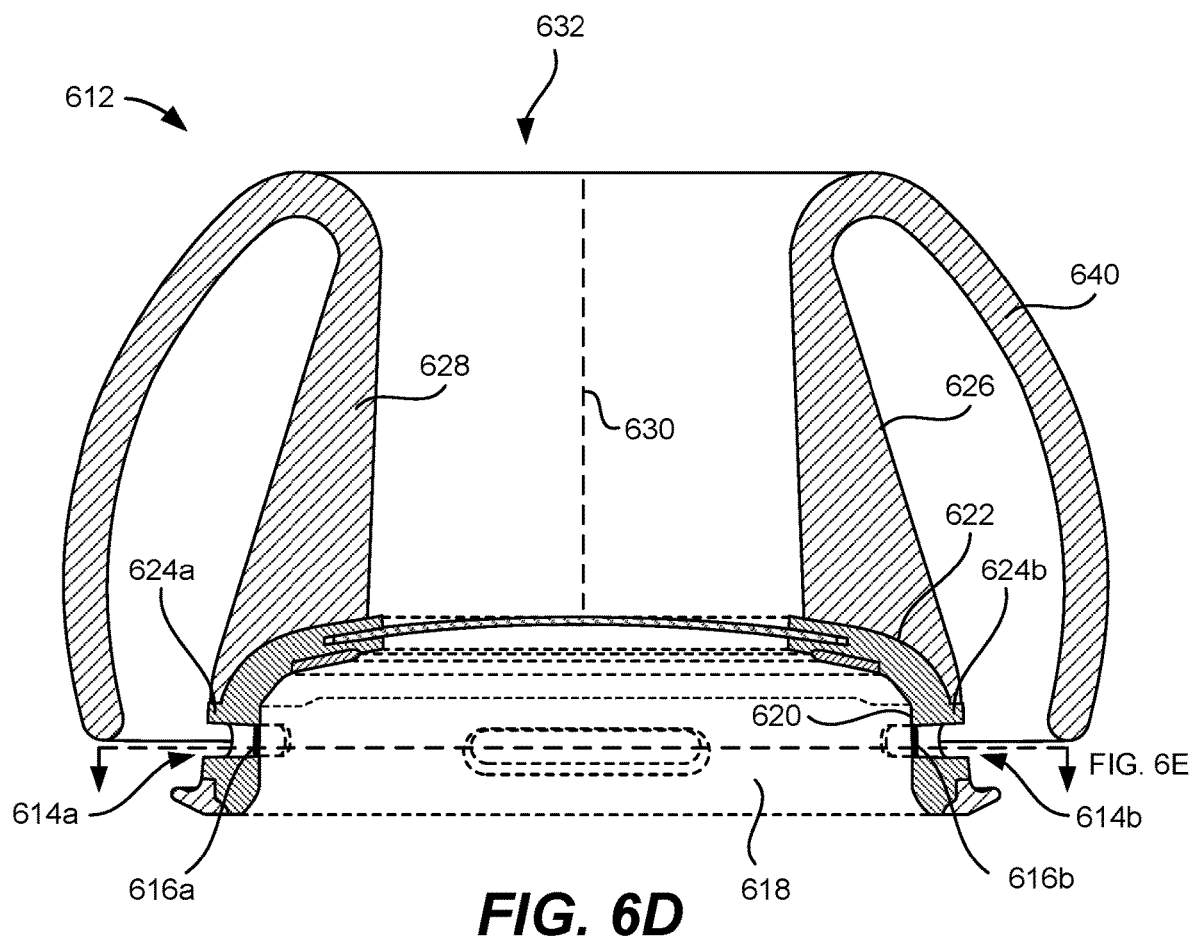
FIG. 6D is a cross-sectional view illustration of an eartip across a vertical cutting plane, according to some embodiments of the present disclosure.
Figure 6E:
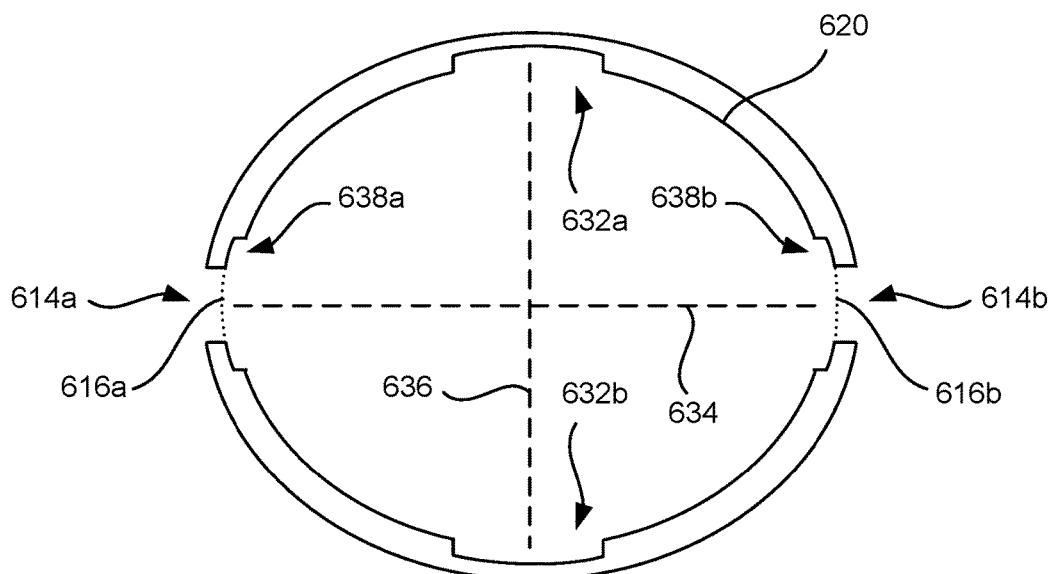
FIG. 6E is a cross-sectional view illustration of an eartip across a horizontal cutting plane, according to some embodiments of the present disclosure.

FIGS. 6D-6E are cross-sectional views of an exemplary eartip 612 having control leaks 614a-b formed in its attachment mechanism, according to some embodiments of the present disclosure. Specifically, FIG. 6D is a cross-sectional view across a vertical cutting plane of eartip 612, and FIG. 6E is a cross-sectional view across a horizontal cutting plane of eartip 612. Eartip 612 is shown to be configured as eartip 352 in FIG. 3E. Thus, similar features discussed herein with respect to eartip 352 apply to eartip 612 and are not discussed here for brevity.

Like control leaks 602, 608a-b, and 610a-b in FIGS. 6A-6C, each control leak 614a-b is an opening that opens sound channel 632 to the atmosphere. Thus, control leaks 614a-b provide avenues through which pressure built up in the ear canal/sound channel 632 can passively release into the atmosphere, thereby relieving the ear canal of any trapped pressure and preventing the user from experiencing any unpleasant sensation from trapped pressure. Each control leak 614a-b can extend from an inner surface 620 to an outer surface 622 of a sidewall of attachment structure 618. The sidewall of attachment structure 618 can extend around a periphery of attachment structure 618. Regions of outer surface 622 proximate to control leaks 614a-b can protrude outward to form respective lips 624a-b so that those regions of outer surface 622 are coplanar/flush with an outer surface 626 of inner eartip body 628 of eartip 612. Lips 624a-b can provide structural rigidity and integrity for control leaks 614a-b. In some embodiments, control leak 614a-b can be an oblong hole or be configured with any other shape, such as an circular, ovular, rectangular, square-like, triangular, octagonal, and the like without departing from the spirit and scope of the present disclosure. In particular embodiments, control leaks 614a-b are oblong openings that are arranged horizontally, e.g., arranged so that their long axis extends along a perimeter of attachment structure 618 around center line 630.

As shown in FIG. 6E, eartip 312 can include two control leaks 614a-b and two recesses 632a-b. Control leaks 614a-b can be positioned on opposite sides of attachment structure 618 along a first axis 634, while the recesses 632a-b are positioned on opposite sides of attachment structure 618 along a second axis 636. In some instances where eartip 312 has an ovular cross-sectional shape, as shown in FIG. 6E, first axis 634 can be the long axis of the ovular eartip while second axis 636 can be the short axis of the ovular eartip. Positioning recesses 632a-b on the long axis of the eartip allows end caps for a wireform attachment mechanism to make greater surface area contact with eartip 312 so that a more secure attachment can be achieved as well as a louder snapping sound can be emitted when the end caps snap into recesses 632a-b. While FIG. 6E illustrates two control leaks 614a-b and two recesses 632a-b positioned along axes that are perpendicular to one another, it is to be appreciated that any number of control leaks and recesses can be positioned along any location around attachment structure 618 without departing from the spirit and scope of the present disclosure.

In some embodiments, cavity regions 638a-b can be formed around respective control leaks 614a-b. Cavity regions 638a-b can be shallow cavities formed by inner surface 620 of attachment structure 618 to mitigate the chances of occlusion of control leaks 614a-b from inside eartip 612. For instance, if an object presses against inner surface 620 of eartip 612, cavity regions 638a-b can still provide an opening through which pressure can be released from sound channel 632.

In some embodiments, as shown in FIGS. 6D and 6E, meshes 616a-b can be positioned within respective control leaks 614a-b to prevent ingress of debris. Meshes 616a-b can be an interlaced structure formed of a network of wire that allows air to pass through but resists debris from passing through. In some embodiments, meshes 616a-b are each attached to inner surface 620 of attachment structure 618, or extend into attachment structure 618, so that meshes 616a-b can be securely fixed within eartip 612.

As can be appreciated herein, when eartip 612 is inserted into the ear canal, outer eartip body 640 can bend and deform when it presses against the ear canal. The bending and deforming of outer eartip body 640 can potentially cause it to occlude one or more control leaks 614a-b. Thus, to mitigate such occlusion, outer eartip body 640 can be modified to maintain an air pathway for control leaks 614a-b even when outer eartip body 640 bends and deforms when eartip 612 is inserted into an ear canal, as will be discussed further herein with respect to FIGS. 6F-H.

Figure 6F:
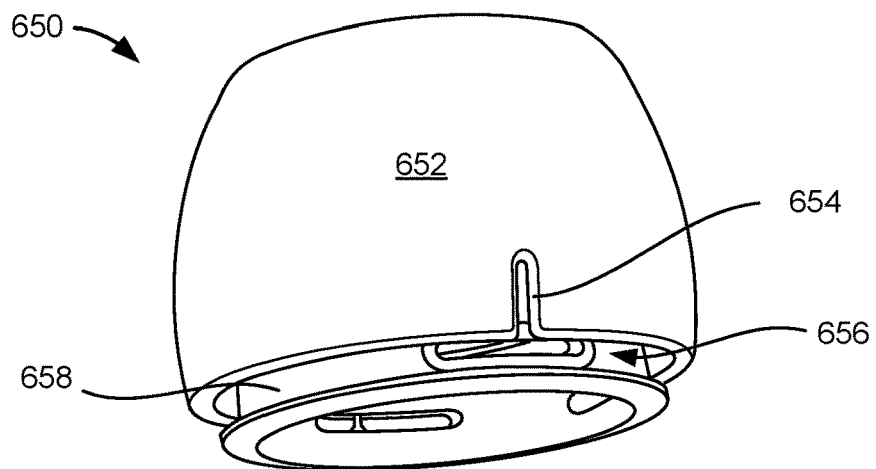
FIGS. 6F-6H are perspective view illustrations of exemplary eartips having different modifications for mitigating the occlusion of a control leak when the outer eartip body is bent and deformed when inserted into an ear canal, according to some embodiments of the present disclosure.
Figure 6G:
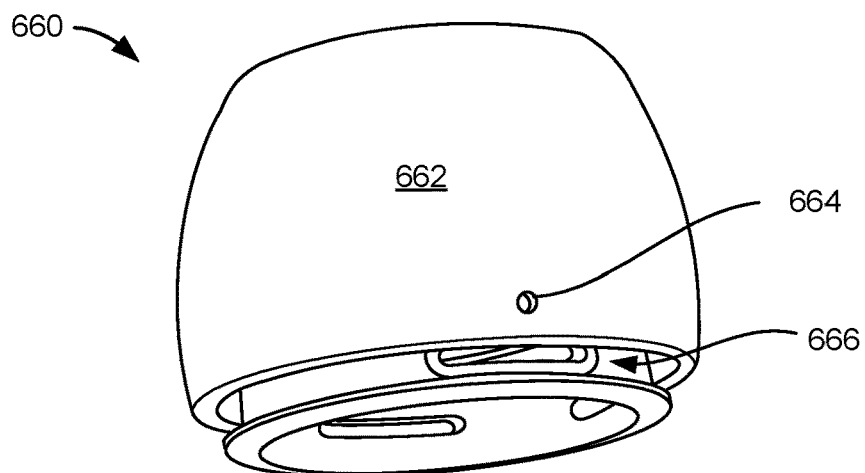
Figure 6H:
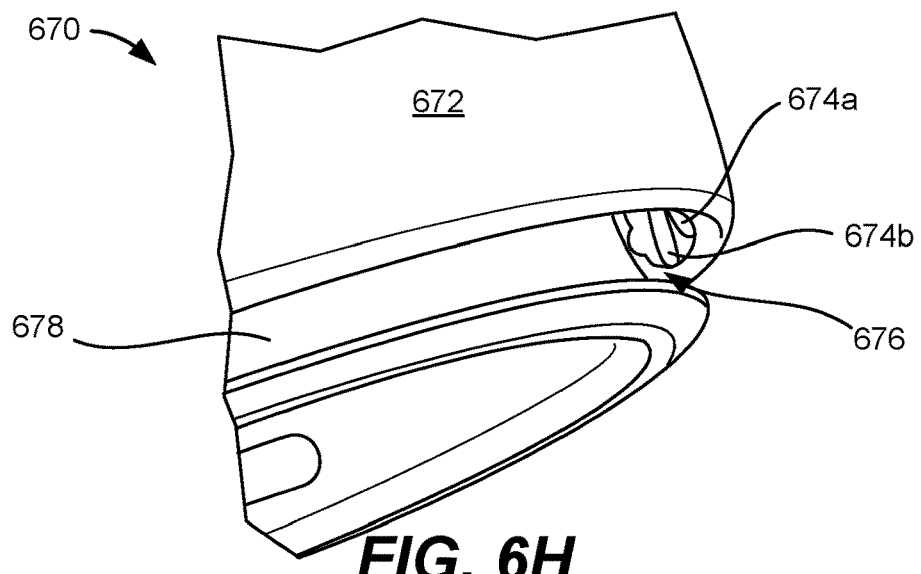

FIGS. 6F-6H are perspective view illustrations of exemplary eartips having different modifications for mitigating the occlusion of a control leak when the outer eartip body is bent and deformed when inserted into an ear canal, according to some embodiments of the present disclosure. As shown in FIG. 6F, eartip 650 can have an outer eartip body 652 that is modified to include a slit 654 at an end of outer eartip body 652 closest to the attachment end of eartip 650. Slit 654 can extend all the way through to the end of outer eartip body 652 and can be positioned over control leak 656 so that when outer eartip body 652 is bent and presses against attachment structure 658, slit 654 can provide an opening through which air can pass to enable the functionality of control leak 656 as discussed herein with respect to FIGS. 6A-6E. As can be appreciated herein, many other types of modification to enable an opening through which air can pass for the control leak are envisioned herein.

As an example shown in FIG. 6G, eartip 660 can have an outer eartip body 662 that is modified to include a hole 664 positioned near the attachment end of eartip 660 and positioned over control leak 666. Although hole 664 is shown as a circular hole, any other shape can be used to form hole 664, such as an ovular, oblong, rectangular, square, triangular, and the like.

As another example shown in FIG. 6H, eartip 670 can have an outer eartip body 672 that is modified to include one or more bumps 674a-b positioned at an end of outer eartip body 672 closest to the attachment end of eartip 670 and positioned over control leak 676. Bumps 674a-b can be protrusions that extend from an inner surface of outer eartip body 672 toward control leak 676. That way, when outer eartip body 672 is bent and presses against attachment structure 678, bumps 674a-b can prevent sealing flange 672 from completely sealing control leak 676 so that an opening through which air can pass to enable the functionality of control leak 656 as discussed herein with respect to FIGS. 6A-6E can be maintained.

III. Housing

As can be understood by the disclosures herein, a wireless listening device also includes a housing to which the eartip couples. The housing can be an electronic device that can be configured to communicate with a host device, such as a smart phone, tablet, laptop, and the like. As an example, a housing can receive digitized sound data/commands for outputting sound to a user. Furthermore, the housing can also send digitized sound data received from a microphone, and/or send commands from a user input to the host device. Thus, the housing can include one or more processors, memory, communication systems, sensor systems, user interface systems, power sources, and power receiving circuitry, as discussed herein with respect to FIG. 1A. As will be appreciated herein, various additional features and configurations of the housing can be implemented to enhance the user experience of the wireless listening device. For instance, one or more sound ports, control leaks, and microphones can be implemented in the housing to improve output sound quality, comfort, and user interface methods of the wireless listening device, as will be discussed further herein.

Figure 7:
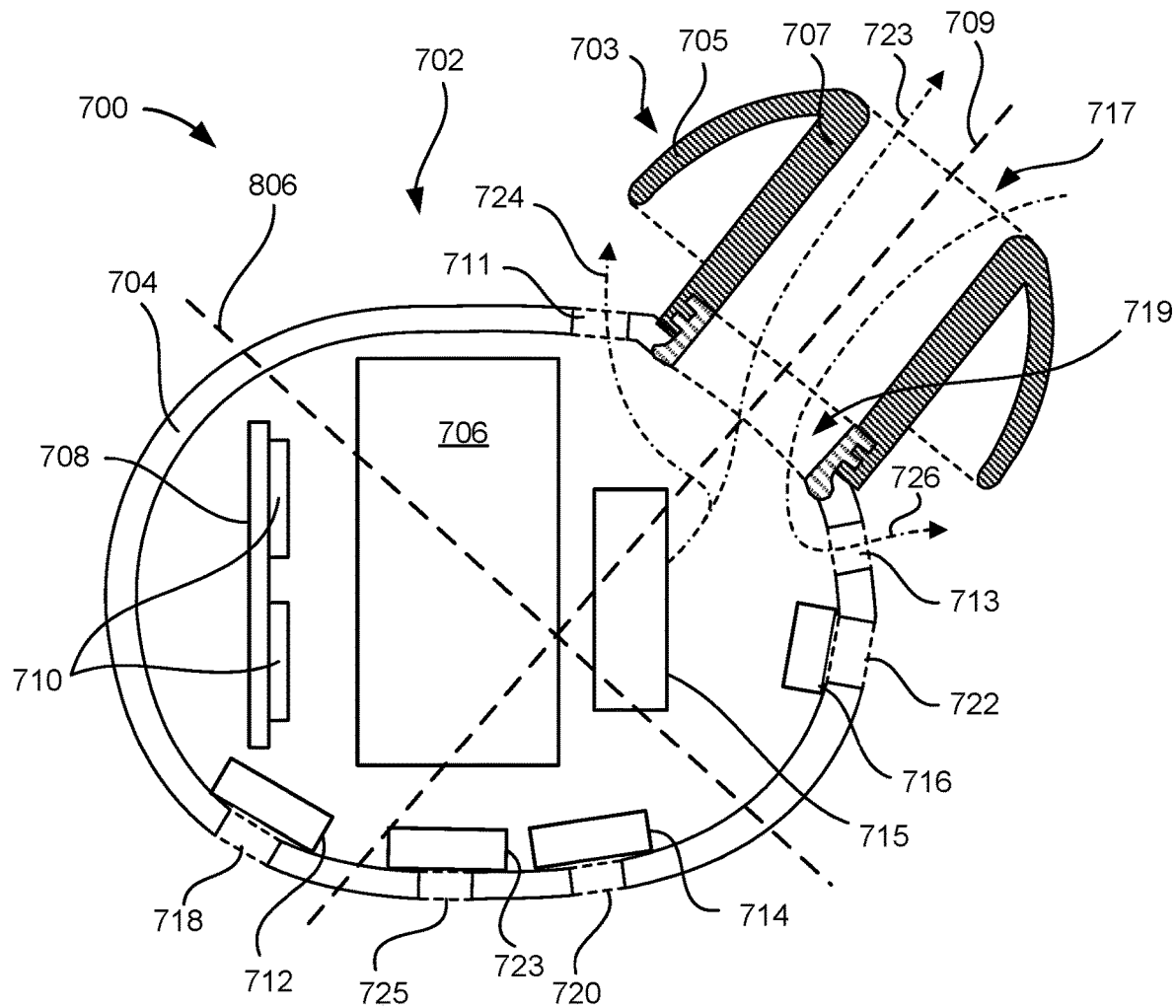
FIG. 7 is a cross-sectional view of an exemplary wireless listening device showing further details of a housing, according to some embodiments of the present disclosure.

FIG. 7 is a cross-sectional view of an exemplary wireless listening device 700 showing further details of a housing 702, according to some embodiments of the present disclosure. As shown, housing 702 can include a plurality of internal components and an outer structure 704 formed of a rigid material, e.g., plastic, that defines an internal cavity within which internal components can be housed and protected from the environment and physical damage during drop events. Outer structure 704 can also include an acoustic opening 719 through which sound can exit outer structure 704 into sound channel 717 of eartip 703. The internal components can include a battery 706, interconnection structure 708, electronic devices 710, and a driver 715. Battery 706 can be any suitable energy storage device that can store and discharge stored energy, such as a lithium ion battery, and the like. Battery 706 can be electrically coupled to electronic devices 710 and driver 715 through interconnection structure 708 so that when discharging, the discharged energy can be used to power electronic devices 710 and driver 715. Interconnection structure 708 can be any suitable component that can route signals and power between electronic devices, such as a printed circuit board (PCB) or a flexible PCB. Electronic devices 710 can be any suitable semiconductor devices for operating wireless listening device 700, such as microcontrollers, processors, field programmable gate arrays (FPGA), application specific integrated circuits (ASIC), dynamic random-access memory (DRAM) and the like. Electronic devices 710 can be configured to interact with one another and various other internal components to perform various functions that improve the user experience as well as the sound quality of wireless listening device 700, as will be discussed in detail further herein. Driver 715 can be an electrical device that generates sound waves, such as a speaker and/or a subwoofer. Driver 715 can be coupled to, and operated by, the one or more electronic devices 710. When wireless listening device 700 is worn by a user, wireless listening device 700 can provide sound to an ear canal through eartip 703, which is better shown in FIG. 8.

Figure 8:
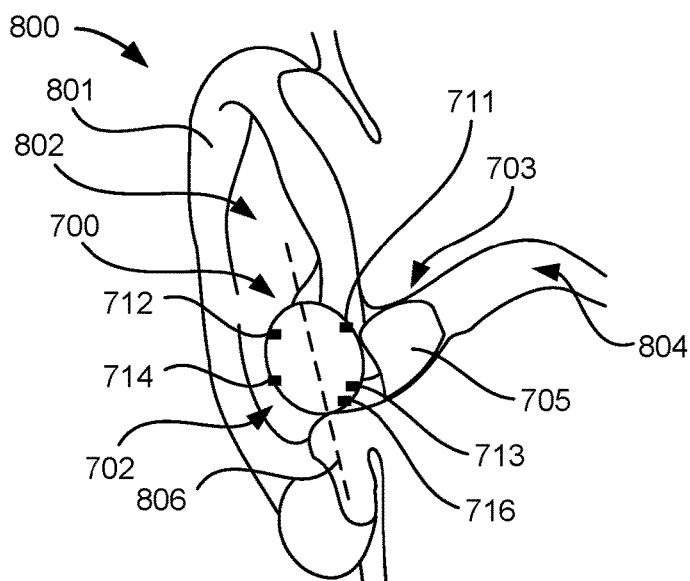
FIG. 8 is a cross-sectional view illustration of a wireless listening device when it is worn by a user to show the positioning of the wireless listening device with respect to an ear canal and the auricle of an ear, according to some embodiments of the present disclosure.

FIG. 8 is a cross-sectional view 800 of wireless listening device 700 when it is worn by a user to show the positioning of wireless listening device 700 with respect to an ear canal 804 and the auricle of ear 801, according to some embodiments of the present disclosure. Wireless listening device 700 is shown as an in-ear hearing device. When wireless listening device 700 is worn, outer eartip body 705 of eartip 703 can press into the inner surfaces of ear canal 804 to form an acoustic seal so that sounds outputted by wireless listening device 700 can be heard by the user in a sealed environment, which improves sound quality of wireless listening device 700.

According to some embodiments of the present disclosure, wireless listening device 700 can also include one or more sound ports, control leaks, and microphones for improving the functionality and usability of wireless listening device 700 while still enabling wireless listening device 700 to achieve a small form factor.

A. Control Leak and Sound Port

For example, as further shown in FIG. 7, outer structure 704 of housing 702 can include, in some embodiments, a tuned bass port 711 and a tuned control leak 713. Tuned bass port 711 and tuned control leak 713 can be openings that are specifically designed and positioned within outer structure 704 to enable wireless listening device 700 to achieve certain functionalities. For instance, tuned bass port 711 can be an opening positioned beside acoustic opening 719 and coupled to an acoustic pathway 723 via port pathway 724 from driver 715 and allows air to flow easier within the acoustic pathway for low frequency sounds, e.g., bass sound waves that are lower than 20 Hz. For low frequency sounds, a driver may move a large volume of air as it generates sound waves. When it is easier for a driver to move air, the driver can achieve better sound quality. Thus, tuned bass port 711 can provide an opening for the air to easily move out to, and be drawn in from, the atmosphere, thereby allowing wireless listening device 700 to provide higher quality bass notes. Tuned bass port 711 can be configured to achieve a certain rate of airflow when driver 715 is operating. This rate of air flow can be altered by the shape and size of tuned bass port 711, which can be tuned in various ways according to design.

Similar to tuned bass port 711, tuned control leak 713 can be an opening within outer structure 704 for allowing air to flow out of housing 702. However, the result achieved by releasing the air out of housing 702 may be different from the result achieved by tuned bass port 711. For instance, instead of improving bass sound quality, tuned control leak 713 can be configured to relieve pressure trapped the ear canal when a seal is formed between outer eartip body 705 and ear canal 804, such as when wireless listening device 700 is worn by a user. In some embodiments, pressure from the ear canal can flow through a pressure release pathway 726 that flows from opening 717 into outer structure 704 and then out into the atmosphere through tuned control leak 713. Thus, tuned control leak 713 may be similar in function to control leak 602 in eartip 604 discussed herein with respect to FIG. 6A. By relieving trapped pressure in ear canal 804, wireless listening device 700 may be comfortable to wear. In some embodiments, tuned control leak 713 extends from an acoustic pathway from opening 717 of inner eartip body 707 so that pressure trapped in the ear canal can be vented to the atmosphere. Like tuned bass port 711, tuned control leak 713 can be configured to achieve a certain rate of airflow when pressure is built up in the ear canal. This rate of air flow can be altered by the shape and size of tuned control leak 713, which can be tuned in various ways according to design. For instance, tuned control leak 713 can be an opening that is substantially circular in profile, or any other shape and size, such as ovular, oblong, rectangular, hexagonal, and the like without departing from the spirit and scope of the present disclosure.

It is to be appreciated that the specific positions of tuned bass port 711 and tuned control leak 713 may be specifically chosen to minimize occlusion and acoustic coupling with other internal components, as will be discussed further herein with respect to section III, subsection C below.

B. Externally and Internally Facing Microphones

With continued reference to FIGS. 7 and 8, the plurality of internal components in housing 702 can further include one or more externally facing microphones 712 and 714 and one or more internally facing microphones 716. Externally facing microphones 712 and 714 can be configured to receive sounds from the environment outside of housing 702 that are propagating toward the user from regions outside of the user's ear canal while internally facing microphone 716 can be configured to receive sounds from the environment outside of housing 702 that are propagating away from the user from regions in or around the user's ear canal.

Positioning externally facing microphones 712 and 714 and internally facing microphone 716 on opposite sides of housing 702 allows each microphone to receive sound from two different environments for achieving different functionalities. For instance, by receiving sounds from outside of the ear canal with externally facing microphones 712 and 714, wireless listening device 700 can operate in transparency mode where sounds received from outside of the ear canal can be reproduced with or without augmentation by wireless listening device 700 so that the user can hear sounds from the outside environment. This enables the user to still hear sounds from his environment, such as spoken words from a person with which the user is conversing, even though the user's ear canal may be sealed by outer eartip body 705 of eartip 703. Furthermore, receiving sounds outside of the ear canal also enables wireless listening device 700 to perform active noise reduction to selectively minimize distracting noise from the environment. That is, wireless listening device 700 can output sound that specifically negates the sound received from externally facing microphones 712 and/or 714 of the external environment.

By receiving sounds 904 from inside of the ear canal with internally facing microphone 716, wireless listening device 700 can measure sounds within ear canal 804 to determine if sound is leaking across outer eartip body 705. A complete in-ear seal between outer eartip body 705 and ear canal 804 creates a much better acoustic performance for products designed based on an assumption of that seal. In such products, loss of a complete seal can reduce the volume of low frequency sounds experienced by the user and can increase the amount of ambient noise. The loss of complete seal can sometimes be attributed to a mismatch between the user's ear anatomy and the size of the eartip used. Thus, by being able to determine if an improper seal is made between outer eartip body 705 and ear canal 804, wireless listening device 700 can be configured to send the user an alert indicating such and possibly instruct the user to make certain adjustments to the fit of the wireless listening device 700.

In some embodiments, an externally facing speaker 723 can also be implemented within outer structure 704 of housing 702. Externally facing speaker 723 can be an electronic device that generates sound. Externally facing speaker 723 can be positioned beside externally facing microphones 712 and 714 so that externally facing speaker 723 can output sound into an environment outside of the wireless listening device through opening 725 in outer structure 704. The sound can be outputted away from the ear canal of the user so that people beside the user can hear the sounds generated by externally facing speaker 723. The sounds can be music or a conversation that the user intends to share with someone beside him or her.

FIGS. 9A and 9B are cross-sectional illustrations of wireless listening device 700 configured to detect an improper seal with an ear canal when it is worn by a user, according to some embodiments of the present disclosure. Specifically, FIG. 9A is a cross-sectional view illustration 900 of wireless listening device 700 when a leakage is not present, and FIG. 9B is a cross-sectional illustration 901 of wireless listening device 700 when a leakage is present.

As shown in FIG. 9A, wireless listening device 700 can be an in-ear hearing device that is configured to use internally facing microphone 716 to detect a loss of a complete seal. For instance, wireless listening device 700 can generate a test sound 902 into ear canal 804, and internally facing microphone 716 can be activated to receive sound from outside of the seal with ear canal 804. When no leakage is present and a complete seal is made with ear canal 804, internally facing microphone 716 may not detect test sound 902. However, as shown in FIG. 9B, when leakage is present and an improper, leaky seal is made with ear canal 804, internally facing microphone 716 may detect test sound 902 to a certain degree and determine whether the detected sound is caused by a leak in the seal. For instance, wireless listening device 700 can be configured to measure the decibel level of sound resonating within ear canal 804 induced by a control sound tone or pulse, and compare that measured decibel level to an expected decibel level. If the measured decibel level is greater than the expected decibel level, then wireless listening device 700 can determine that an improper seal exists and an alert can be sent to the user to correct the positioning of listening device 700. Having a proper seal can improve attenuation of outside noise, enabling the operation of active noise cancellation to use less power. Furthermore, having a proper seal can imply that the eartip has a solid contact with the ear canal, which can result in improved in-ear stability.

As can be appreciated herein, being in such close proximity to a user's ear often invites the opportunity for occlusions of one or more ports, control leaks, and/or microphones. Occluded bass ports often exhibit an overall decrease in bass/low frequency response; and occluded controlled leaks often exhibit an abnormal increase in bass/low frequency response and a reduction in measurable ambient noise inside the ear canal. Thus, according to some embodiments of the present disclosure, internally facing microphone 716 can also enable wireless listening device 700 to perform acoustic self-testing to determine the presence of occluded ports, control leaks, and/or external microphones, and to inform the user of improper fit or how to change the positioning/use of wireless listening device 700 when occlusion is detected to ensure the best possible acoustic performance.

FIG. 10 is an exemplary side-view illustration 1000 of wireless listening device 1001 worn by a user where one or more ports, control leaks, and/or microphones are occluded. When worn, eartip 1006 can be positioned inside of the ear canal and housing 1008 can be positioned within cavity 1002 defined by the auricle of the user's ear 1004. In some cases, wireless listening device 1001 can be improperly positioned in ear 1004 where the contours of ear 1004 occlude, i.e., cover up, one or more ports, control leaks, and/or microphones, e.g., externally facing microphone 1012, as shown in FIG. 10. Externally facing microphone 1012 may not be able to properly function when it is occluded by ear 1004. Thus, wireless listening device 1001 can be configured to determine that externally facing microphone 1012 is occluded and alert the user and/or instruct the user to move wireless listening device 1001 to the correct position where microphone 1012 is not occluded.

In some embodiments, wireless listening device 1001 can determine that one or more ports, control leaks, and/or microphones are occluded by comparing the current operation of the ports, control leaks, and/or microphones with their expected operation. As an example, wireless listening device 1001 can be configured to define an expected operation of externally facing microphone 1012 by measuring the operation of externally facing microphone 1012 when it is stored in an case. Wireless listening device 1001 can emit a sound in the case and measure the received sound by externally facing microphone 1012. In some embodiments, the case can be configured with one or more cavities that ensure externally facing microphone 1012 is un-occluded and provide a controlled and sealed environment with which wireless listening device 1001 can perform its measurement of the operation of externally facing microphone 1012. The measured operation of externally facing microphone 1012 can be stored in the memory of wireless listening device 1001 or the host device, e.g., a smart phone to which wireless listening device 1001 is wirelessly coupled.

Thus, when wireless listening device 1001 is worn by a user, wireless listening device 1001 can measure the operation of externally facing microphone 1012 and compare the measured operation of externally facing microphone 1012 with the expected operation of externally facing microphone 1012. If the measured operation is different from the expected operation by greater than a threshold amount, wireless listening device 1001 and/or the host device can determine that externally facing microphone 1012 is occluded and send the necessary alerts/instructions to the user to correct the position of wireless listening device 1001. If, however, the measured operation is only different from the expected operation by less than the threshold amount, then wireless listening device 1001 and/or the host device can use that information as another factor in determining that wireless listening device 1001 is worn by the user in conjunction with other factors, such as capacitive sensing or patterned lines in the eartip, as discussed herein with respect to FIGS. 4A-4C and 5A-5C. The same process can be performed for each port, control leak, and microphone for enabling wireless listening device 1001 to determine occlusions. By being able to determine occlusions of one or more ports, control leaks, and/or microphones, wireless listening device 1001 can better ensure that the full potential of the sound quality and usability of wireless listening device 1001 is experienced by the user.

C. Positioning of Microphones, Ports, and Control Leaks

With reference back to FIGS. 7 and 8, the positioning of the microphones, ports, and control leaks are important because they are each designed to receive sound from, and/or output sound to, specific regions around the ear and the ear canal. According to some embodiments of the present disclosure, externally facing microphones 712 and 714 can be positioned in housing 702 so that when wireless listening device 700 configured as an in-ear hearing device is worn, externally facing microphones 712 and 714 face away from the ear canal and internally facing microphone 716 faces toward the ear canal, an example of which is shown in FIG. 8.

FIG. 8 shows the positioning of externally and internally facing microphones 712, 714, and 716, tuned bass port 711, and tuned control leak 713 of wireless listening device 700, according to some embodiments of the present disclosure. As shown, externally facing microphones 712 and 714 are positioned inside of ear cavity 802 and face away from ear canal 804, while internally facing microphone 716 is positioned inside of ear cavity 802 and face toward ear canal 804. Ear cavity 802 can be a cavity defined by the auricle of ear 801, and can abut ear canal 804.

In some embodiments, externally facing microphones 712 and 714 and internally facing microphone 716 are positioned on opposing halves of housing 702 when divided in half by dividing line 806. Dividing line 806 can be a line that divides housing 702 in two halves, where one half is positioned closer to ear canal 804 than the other half. In some embodiments, with reference back to FIG. 7, dividing line 806 can be perpendicular to axis 709 of acoustic opening 719 and inner eartip body 707. And, dividing line 806 can be positioned so that housing 702 is divided into two halves. Thus, as shown in FIG. 7, dividing line 806 can be diagonally oriented when housing 702 is laid on its side, where externally facing microphones 712 and 714 are positioned on one half of housing 702 and internally facing microphone 716 is positioned on the other half of housing 702. In some embodiments, internally facing microphone 716 and eartip 703 are positioned in the same half of housing 702 when halved by dividing line 806.

As can be appreciated from disclosures herein, tuned bass port 711 and tuned control leak 713 are openings through which channels within housing 702 are coupled to the atmosphere. Thus, in order for tuned bass port 711 and tuned control leak 713 to operate properly, port 711 and control leak 713 should be free of occlusion. Thus, tuned bass port 711 and tuned control leak 713 can be positioned at locations that are least likely to be occluded by surface features of the user's ear. As an example, as shown in FIG. 7, tuned bass port 711 and tuned control leak 713 can be positioned in outer structure 704 at areas that are directly below the umbrella covering of outer eartip body 705. That way, outer eartip body 705 can provide clearance for space around tuned bass port 711 and tuned control leak 713.

When placed close to externally facing microphones 712 and 714, tuned bass port 711 and tuned control leak 713 can cause echo and feedback distortion. Thus, in some embodiments, tuned bass port 711 and tuned control leak 713 can be positioned away from externally facing microphones 712 and 714. For instance, where dividing line 806 divides housing 702 in half and externally facing microphones 712 and 714 are positioned on one half of housing 702, tuned bass port 711 and tuned control leak 713 can be positioned on the other half of housing 702 next to eartip 703.

D. Acoustic Shielding Component of Microphones

To enable microphones 712, 714, and 716 to accurately measure sound, microphones 712, 714, and 716 can be positioned adjacent to outer structure 704, and outer structure 704 can include openings 718, 720, and 722 for providing an avenue through which sound can travel from outside of outer structure 704 to microphones 712, 714, and 716, respectively. The open cavities defined by openings 718, 720, and 722 form step differentials between an outer surface of housing 704 and the outermost surface of respective microphones 712, 714, and 716. When air blows across each of these step differentials (such as when the wireless listening device is being used outside, wind noise can be generated and cause audible interference. Thus, each opening can include an acoustic shielding component that is configured to be flush with the outer surface of housing 704 to remove the aforementioned step differential and mitigate wind noise, as discussed herein with respect to FIGS. 11A-11B.

Figure 11A:
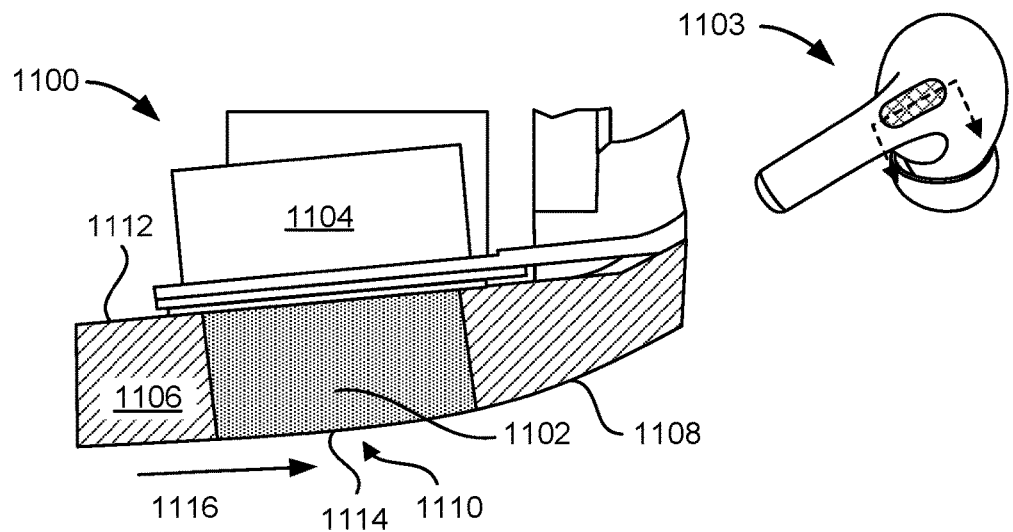
FIGS. 11A and 11B are cross-sectional view illustrations of exemplary configurations having different acoustic shielding components for microphones in a housing, according to some embodiments of the present disclosure.
Figure 11B:
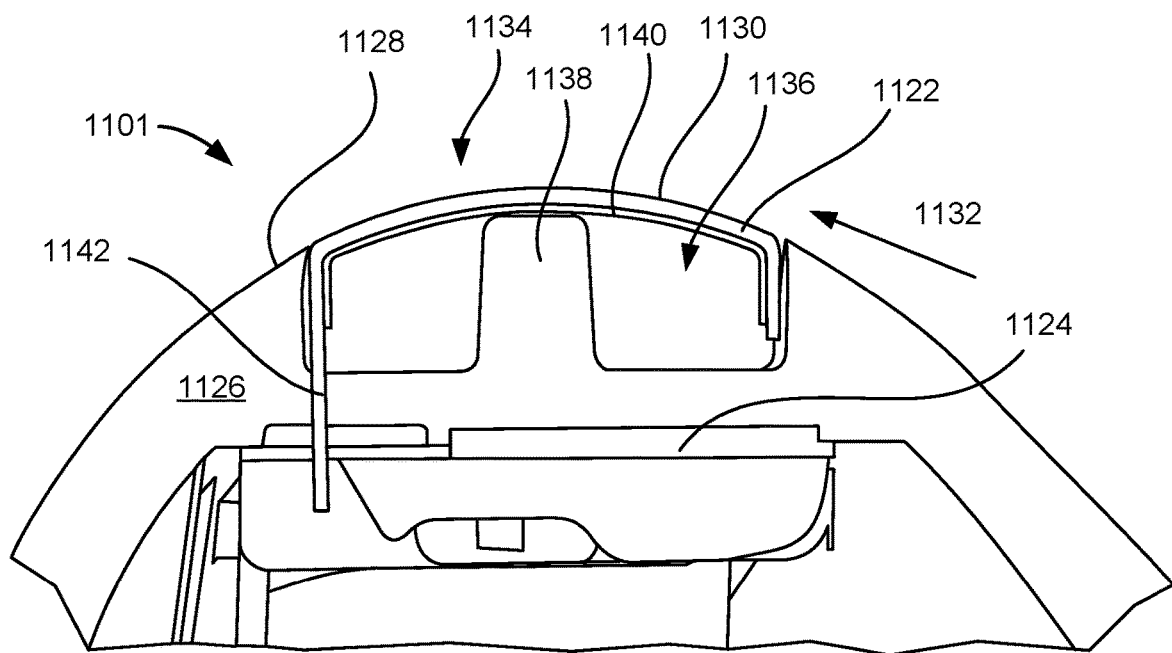

FIGS. 11A and 11B are cross-sectional view illustrations of exemplary listening device configurations across the cut-line shown in side image 1103 that have different acoustic shielding components for microphones in a housing, according to some embodiments of the present disclosure. Specifically, FIG. 11A is a cross-sectional view illustration of a first configuration 1100 including acoustic shielding component 1102 for protecting microphone 1104 of a housing 1106, and FIG. 11B is a cross-sectional view illustration of a second configuration 1101 including a multi-layer mesh 1122 for protecting microphone 1124 of a housing 1126.

As shown in FIG. 11A, acoustic shielding component 1102 can be formed of a porous plastic material constructed of a solid matrix defining a plurality of pores that allows the microphone to be exposed to the atmosphere but resists liquid and debris from entering housing 1106. According to some embodiments of the present disclosure, acoustic shielding component 1102 can be a three-dimensional porous structure that extends at least partially between externally facing microphone 1104 and an outer surface 1108 of housing 1106. In some instances, acoustic shielding component 1102 can completely fill in opening 1110 so that acoustic shielding component 1102 extends from an inner surface 1112 of housing 1106 to outer surface 1108 of housing 1106. External surface 1114 of acoustic shielding component 1102 can face outside of housing 1106 and be substantially planar with the immediately adjacent regions of external surface 1108 of housing 1106. In some embodiments, external surface 1114 of acoustic shielding component 1102 is curved to seamlessly integrate with the curvature/profile of outer surface 1108 of housing 1106. The substantial planarity and seamless integration between external surface 1114 and outer surface 1108 can avoid any structural step formations and recesses at their interface, thereby substantially mitigating the formation of acoustic turbulence as air 1116 moves quickly past opening 1110 while still enabling external noise to filter through to microphone 1104. Mitigating acoustic turbulence increases microphone performance in outdoor environments.

It is to be appreciated that, using acoustic shielding component to protect microphones in a housing can achieve additional benefits. For instance, acoustic shielding component can improve the congruency of housing aesthetics by blending in with the appearance of housing 1106, especially when acoustic shielding component is formed of similar material used to form outer housing 1106. Furthermore, using porous plastic can achieve better protection from liquid and debris ingress because of its array of small openings in a three-dimensional structure.

Alternative to the porous plastic embodiment shown in FIG. 11A, an acoustic shielding component can be configured as a multi-layer mesh structure in some embodiments for mitigating wind noise and improving sound capture, as shown in FIG. 11B. An acoustic shielding component 1122 can be constructed as a multi-layer mesh structure that extends at least partially between externally facing microphone 1104 and an outer surface 1128 of housing 1126. For instance, like acoustic shielding component 1102 in FIG. 11A, an external surface 1130 of acoustic shielding component 1122 can face outside of housing 1126 and be substantially planar with the immediately adjacent regions of external surface 1128 of housing 1126. External surface 1130 of acoustic shielding component 1112 can be curved to seamlessly integrate with (i.e., be flush with) the curvature/profile of outer surface 1128 of housing 1126 so that structural step formations and recesses at their interface can be avoided, thereby substantially mitigating the generation of acoustic turbulence as air 1132 moves quickly past opening 1134 while still enabling external noise to filter through to microphone 1124.

Unlike acoustic shielding component 1102 in FIG. 11A, however, acoustic shielding component 1122 can be formed of more than one distinct layers. For instance, acoustic shielding component 1122 can include a cosmetic mesh and an acoustic mesh, as will be discussed in detail further herein with respect to FIG. 12. In some instances, the multi-layer mesh structure of acoustic shielding component 1122 is relatively thin compared to the depth of opening 1134. Thus, because external surface 1130 of acoustic shielding component 1122 is positioned planar with external surface 1128 of housing 1126, a cavity 1136 within opening 1134 and below external surface 1130 of acoustic shielding component 1122 can be defined by the structure of acoustic shielding component 1122. The relatively large surface area of external surface 1130 of acoustic shielding component 1122 along with its thin construction and position relative to cavity 1136, acoustic shielding component 1122 may be particularly vulnerable to deformation during drop events. Thus, to resist such deformation, a support post 1138 can be abutted against an inner surface 1140 of acoustic shielding component 1122 opposite from external surface 1130. Support post 1138 can be an extension of housing 1126 that extends toward, and in some instances makes contact with, acoustic shielding component 1122. Support post 1138 can be positioned so that it makes contact with a central region of acoustic shielding component 1122. In addition to support post 1138, a stiffener can be implemented to provide structural rigidity to acoustic shielding component 1122, and a grounding tab 1142 can couple acoustic shielding component 1122 to ground, as will be discussed further herein with respect to FIG. 12.

Figure 12:
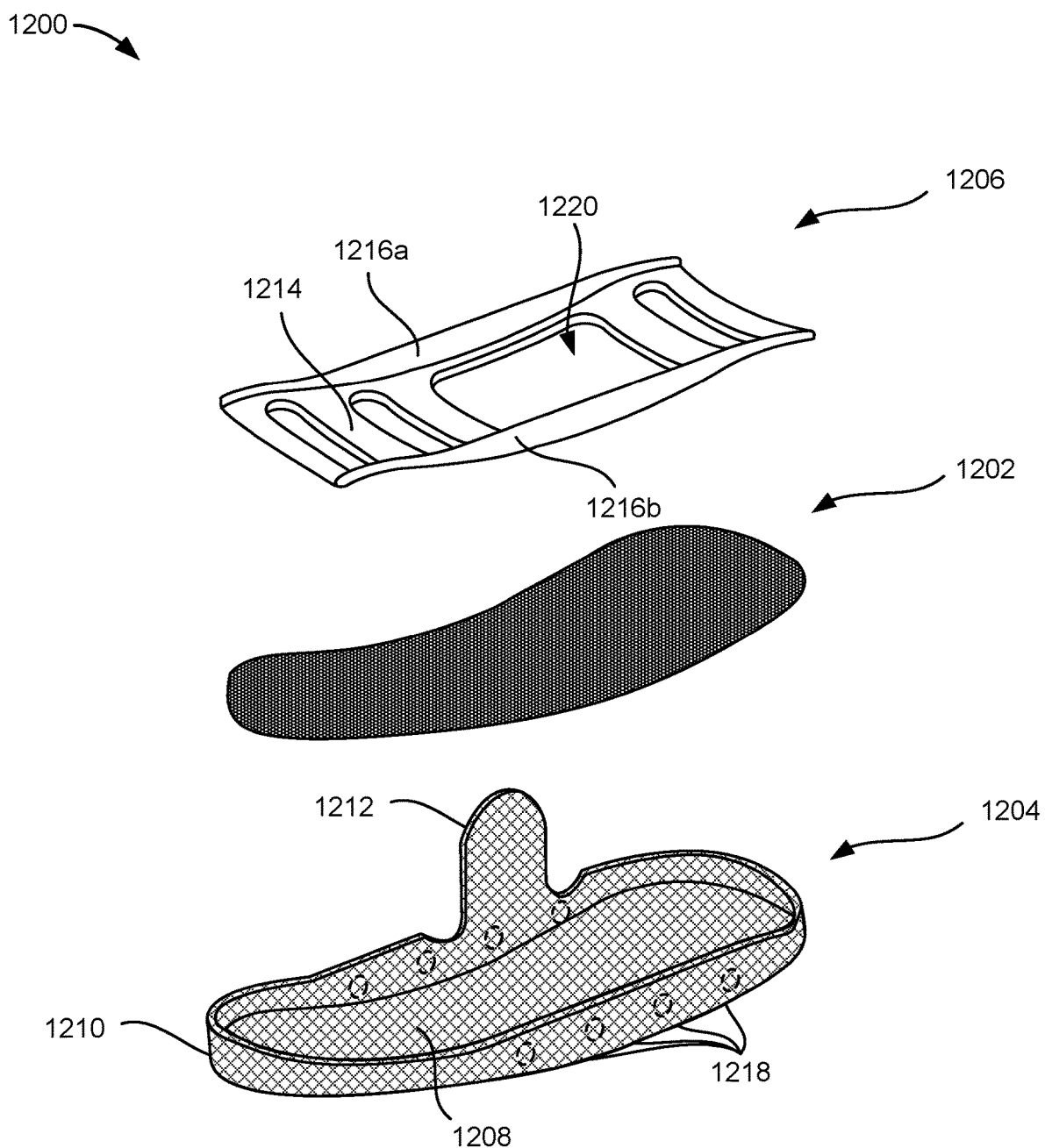
FIG. 12 is an exploded view of an exemplary acoustic shielding component constructed as a multi-layer mesh, according to some embodiments of the present disclosure.

FIG. 12 is an exploded view of an exemplary acoustic shielding component 1200 constructed as a multi-layer mesh, according to some embodiments of the present disclosure. Acoustic shielding component 1200 can include an acoustic mesh 1202 positioned between a cosmetic mesh 1204 and a stiffener 1206. Acoustic mesh 1202 can be constructed as a single layer with contours that conform to a topography of an external surface of a housing. In some instances, acoustic mesh 1202 can be a porous layer that is tuned to a specific acoustic impedance to enable proper operation of an underlying microphone. In some embodiments, acoustic mesh 1202 is formed of a pliable, porous material, such as a porous polyester. Acoustic mesh 1202 can be covered with a hydrophobic coating that enables acoustic mesh 1202 to resist ingress of water into the housing of the wireless listening device.

Cosmetic mesh 1204 can be an interlaced structure formed of a network of stiff wire for providing a visible mesh texture to acoustic shielding component 1200 when the wireless listening device is viewed from the outside. A mesh cover 1208 of cosmetic mesh 1204 may be positioned external to the housing of the wireless listening device. Thus, an outer surface of mesh cover 1208 can form an external surface of acoustic shielding component 1200, such as external surface 1130 of acoustic shielding component 1101 in FIG. 11B. Accordingly, mesh cover 1208 can be constructed as a single layer with contours that conform to a topography of an external surface of a housing. The porosity of cosmetic mesh 1204 may lend itself to have negligible acoustic impact on the sounds passing through porous shield 1200, while having a degree of aesthetic appeal so that its design complements the appearance of the wireless listening device. In some embodiments, cosmetic mesh 1204 is formed of a stainless steel mesh. Acoustic mesh 1202 can be adhered to cosmetic mesh 1204 via any suitable adhesive, such as pressure sensitive adhesive (PSA).

In some embodiments, an outer periphery of an inner surface of mesh cover 1208 can extend upward to form a mesh wall 1210, which can make contact with the housing to improve stability when installed in the housing. Mesh wall 1210 can be substantially perpendicular to mesh cover 1208. In certain embodiments, mesh wall 1210 can define a tab 1212 that extends from a portion of mesh wall 1210. Tab 1212 can extend away from mesh cover 1208 so that when installed, tab 1212 can couple to an internal grounding feature, such as a grounding plane for an antenna. This may be better shown with brief reference to FIG. 11B, where tab 1142 of acoustic shielding component 1122 extends away from external surface 1130 and past microphone 1124 to couple to an internal grounding component. By grounding cosmetic mesh 1204, damage to the device from electric static discharge can be avoided. In some embodiments, mesh cover 1208, mesh wall 1210, and tab 1212 can together be a monolithic structure that forms cosmetic mesh 1204.

Stiffener 1206 can be a solid, instead of porous, structure that has high rigidity for providing structural integrity to acoustic shielding component 1200 to resist deformation during drop events. Stiffener 1206 can include a plurality of ribs 1214 positioned between stiffener walls 1216a and 1216b. Ribs 1214 can follow a contour of cosmetic mesh 1204; thus, ribs 1214 can also include contours that conform to the topography of the external surface of the housing. Ribs 1214 can be evenly spaced apart from one another and be distributed across a length of acoustic shielding component 1200 to provide structural rigidity across the length of acoustic shielding component 1200. In some embodiments, a distance between ribs 1214 near the center of stiffener 1206 can be greater than the distances between other pairs of ribs so that a gap 1220 can be formed to allow space for a support post, e.g., support post 1138 in FIG. 11B, to be positioned to provide additional support to acoustic shielding component 1200. Although gap 1220 is shown to be formed by stiffener 1206, other stiffeners may not have a gap and can instead have ribs in position of gap 1220 in the equally-spaced apart configuration. Stiffener 1206 can be formed of any suitable stiff material, such as stainless steel, and can be attached to cosmetic mesh 1204 via a plurality of laser welding points 1218 on stiffener walls 1216a-b. Stiffener walls 1216a-b can be portions of stiffener 1206 that bend upward for increasing surface area contact with cosmetic mesh 1204 housing to improve mechanical coupling with cosmetic mesh 1204. When attached, stiffener 1206 can be surrounded by mesh wall 1210.

E. Positioning of Battery and Driver for Defining Acoustic Path

Figure 13:
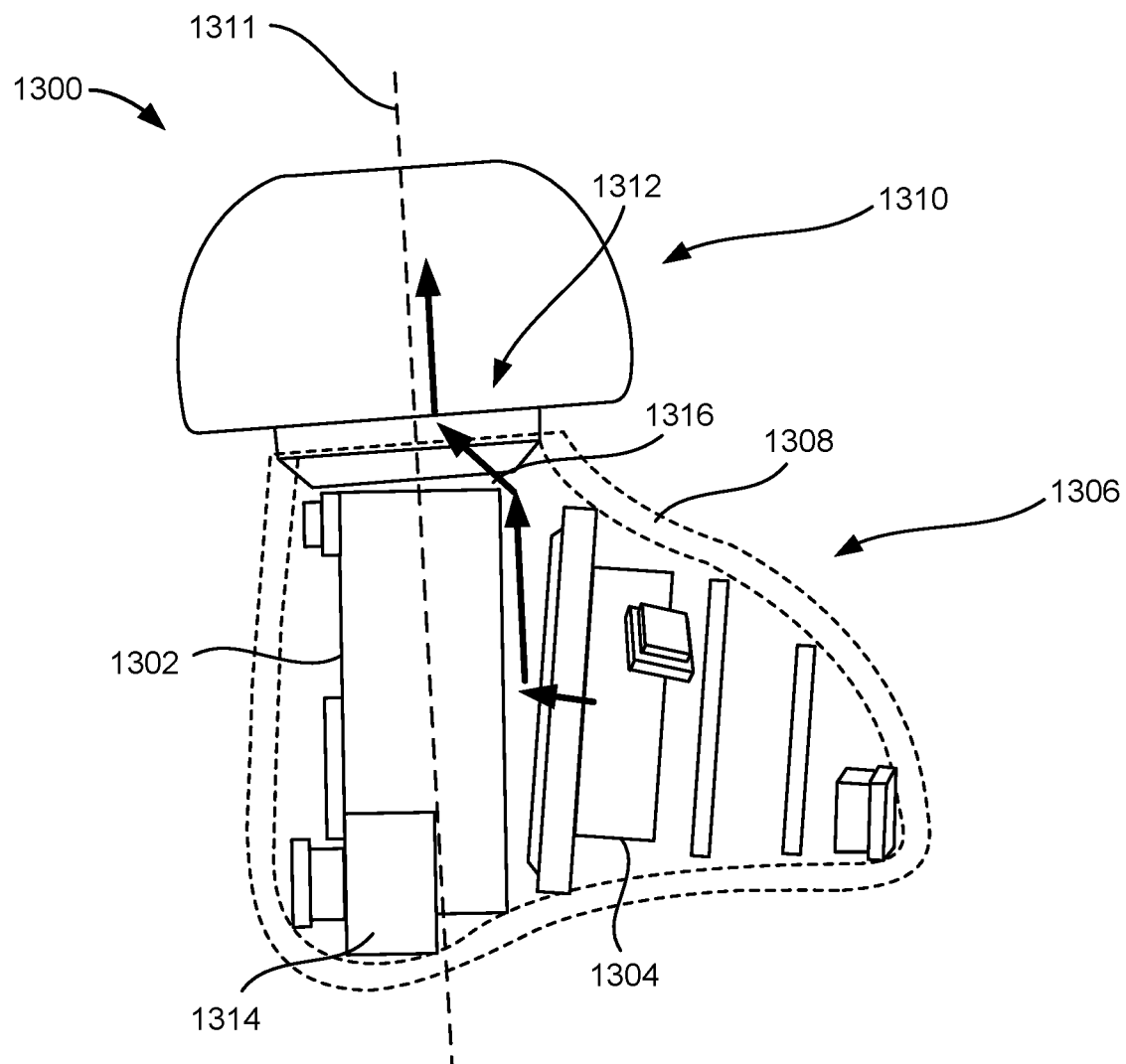
FIG. 13 is a side-view illustration of a wireless listening device whose battery and driver are uniquely positioned to decrease the size of the housing, according to some embodiments of the present disclosure.

According to some embodiments of the present disclosure, the battery and driver for a wireless listening device can be specifically positioned to decrease the size of its housing. FIG. 13 is a side-view illustration of a wireless listening device 1300 whose battery 1302 and driver 1304 are uniquely positioned to decrease the size of housing 1306, according to some embodiments of the present disclosure. When wireless listening device 1300 is worn by a user, eartip 1310 can be inserted into the ear canal. This allows housing 1306 to extend farther into the opening of the ear, and thus opens up more space for housing 1306 to occupy in the ear concha. To take advantage of this enlarged space, larger components can be positioned next to eartip 1310. As an example, battery 1302 can be positioned adjacent to eartip 1310 such that its longest dimension, e.g., its width, is oriented along axis 1311 of eartip 1310.

Furthermore, other larger internal devices can be positioned close to battery 1302 so that larger components can be concentrated in one region of housing 1306 to maximize the larger space immediately outside of the ear canal. For instance, driver 1304 can be positioned immediately beside battery 1302 and oriented so that its longest dimension, e.g., its width can take full advantage of the extra space provided by the ear concha, as shown in FIG. 13. When oriented in this way, an acoustic path 1316 of driver 1304 can be initially directed toward a flat, side surface of battery 1302, but then be redirected by the side surface toward opening 1312 of housing 1306 and ultimately out of opening 1312 and into the ear canal through eartip 1310. Thus, even though battery 1302 is positioned adjacent to opening 1312, battery 1302 can be positioned so that an acoustic pathway can still be provided into opening 1312 beside battery 1302.

By arranging battery 1302 in the largest open area of the ear (e.g., the concha), the size of battery 1302, and thus the product battery life of wireless listening device 1300, can be maximized. Furthermore, by arranging battery 1302 and driver 1304 in this configuration, an antenna 1314 of wireless listening device 1300 can be positioned as far away from the user's body as possible, which can optimize antenna performance. Furthermore, smaller components can be more compactly arranged in the other regions of housing 1306, thereby allowing those regions of housing 1306 to be smaller, which thus reduces the overall size of housing 1306. Having a smaller size can improve the comfort and appearance of wireless listening device 1300 when it is worn.

IV. User Interface for a Wireless Listening Device

According to some embodiments of the present disclosure, one or more processors of a wireless listening device can be configured to display the user's listening status and to interact with one or more sensors of the wireless listening device and execute commands stored in its memory to provide a variety of unique user interface methods for allowing the user to operate the wireless listening device, as will be discussed further herein.

A. Noise Cancelling Status Indicator

Figure 14:
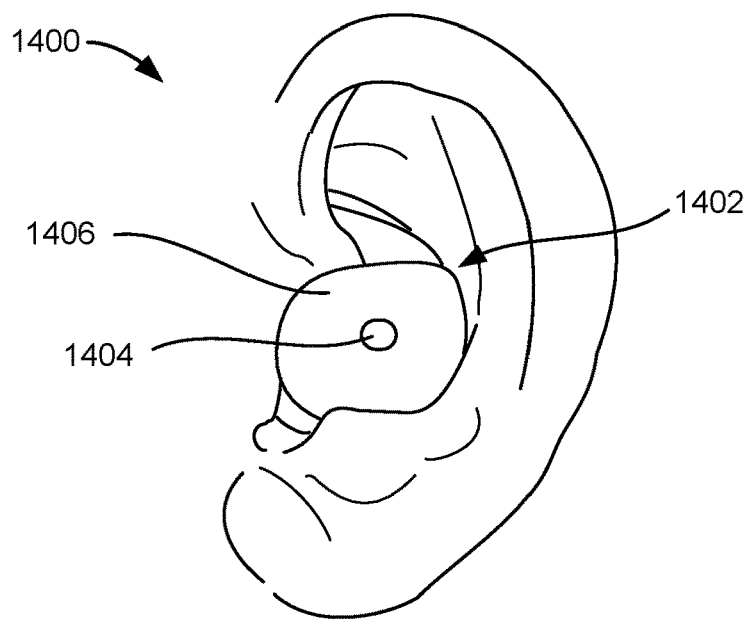
FIG. 14 is a side-view illustration of a wireless listening device configured to display the user's listening status, according to some embodiments of the present disclosure.

FIG. 14 is a side-view illustration 1400 of a wireless listening device 1402 configured to display the user's listening status, according to some embodiments of the present disclosure. As can be appreciated herein, wireless listening device 1402 can perform active noise cancellation functions, which can cancel out external sounds, and can perform transparency functions, which can amplify the external noise to the user. Thus, it may be useful for wireless listening device 1402 to be able to indicate whether the wireless listening device 1402 is in active noise canceling mode where the user and cannot hear external sounds or in transparency mode where the user can hear external sounds.

According to some embodiments of the present disclosure, a dynamic visual indicator 1404 can be implemented by wireless listening device 1402 to display the user's listening status. For instance, visual indicator 1404 can be a light emitting diode that can display different colors of light and be positioned in housing 1406 where it can be seen when wireless listening device 1402 is worn by the user. In some embodiments, visual indicator 1404 can display different colors of light depending on the particular operating mode of wireless listening device 1402. As an example, wireless listening device 1402 can be configured to output red light with visual indicator 1404 when wireless listening device 1402 is in the active noise cancelling mode, green light when wireless listening device 1402 is in the transparency mode, and/or orange light when wireless listening device 1402 is outputting sound, e.g., when the user is on a phone call or is listening to music. That way, people who may want to speak with the user can be apprised of the listening status of the user without needing the user to tell them him or herself.

Other than changing the color of visual indicator 1404, wireless listening device 1402 can be configured to output varied flashing patterns with visual indicator 1404 to show which mode is active. For instance, visual indicator 1404 can blink at a high frequency when wireless listening device 1402 is in the active noise cancelling mode, can output a steady light when wireless listening device 1402 is in the transparency mode, and can blink at a low frequency when wireless listening device 1402 is outputting sound when the user is on a phone call or listening to music. Alternatively, wireless listening device 1402 can be configured to output varied intensity of light with visual indicator 1404 to show which mode is active. For instance, visual indicator 1404 can emit bright light when wireless listening device 1402 is in the active noise cancelling mode, no light when wireless listening device 1402 is in the transparency mode, and dim light when the user is on a phone call or listening to music. Although FIG. 14 shows an embodiments where wireless listening device 1402 only has one visual indicator, embodiments are not so limited. Other embodiments can have more than one visual indicator where different combinations of visual indicators can output light based on which mode is active, without departing from the spirit and scope of the present disclosure.

Furthermore, it is to be appreciated that other types of indicators can be used instead of visual indicator 1404. For instance, an audio indicator can be used to indicate the user's listening status. As an example, the wireless listening device's externally facing speaker can be used as an audio indicator to output sound indicative of the user's listening status. That is, the audio indicator can output be chirping sounds and/or beeping sounds that are outputted at specific frequencies and/or intervals to indicate the user's listening status.

B. User Input by Interacting with User Anatomy

Figure 15:
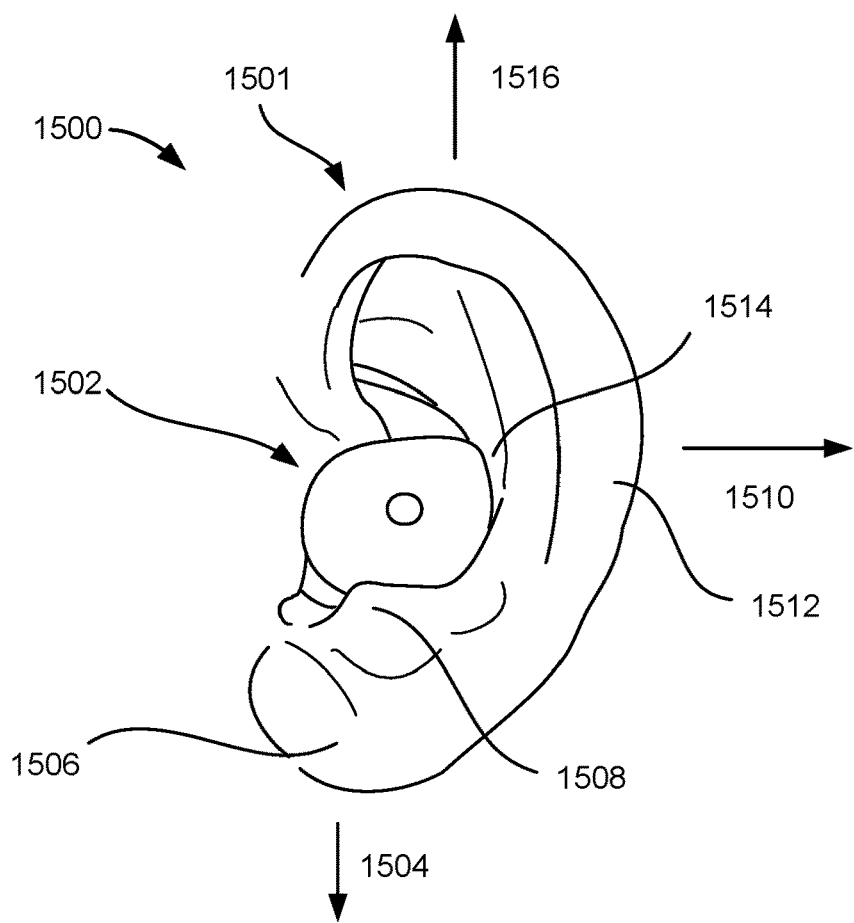
FIG. 15 is a side-view illustration of a wireless listening device configured to receive user input through interactions with the anatomy of a user's ear, according to some embodiments of the present disclosure.

According to some embodiments of the present disclosure, a wireless listening device can also be configured to interact with the anatomy of a user's ear to receive various user inputs. For instance, different parts of an ear can be pulled to effectuate a user input. FIG. 15 is a side-view illustration 1500 of a wireless listening device 1502 configured to receive user input through interactions with the anatomy of a user's ear 1501, according to some embodiments of the present disclosure. In certain instances, wireless listening device 1500 can be configured to receive a user input when the user pulls certain parts of ear 1501.

For example, wireless listening device 1502 can associate a downward pull 1504 of earlobe 1506 as a specific user input. When earlobe 1506 is pulled downward, antitragus 1508 of ear 1501 can also move downward by a lesser degree. This downward motion of antitragus 1508 can be detected by one or more optical sensors or microphones of wireless listening device 1502 to identify that earlobe 1506 has been pulled and thus in turn receive the specific user input associated with downward pull 1504.

In another example, wireless listening device 1502 can associate an outward pull 1510 of the side of helix 1512 as a specific user input. When the side of helix 1512 is pulled outward, antihelix 1514 of ear 1501 can also move outward by a lesser degree. This outward motion of antihelix 1514 can be detected by one or more optical sensors or microphones of wireless listening device 1502 to identify that side of helix 1512 has been pulled outward and thus in turn receive the specific user input associated with outward pull 1510.

In yet another example, wireless listening device 1502 can associate an upward pull 1504 of the top of helix 1512 as a specific user input. When the top of helix 1512 is pulled upward, antihelix 1514 of ear 1501 can also move upward by a lesser degree. This upward motion of antihelix 1514 can be detected by one or more optical sensors or microphones of wireless listening device 1502 to identify that top of helix 1512 has been pulled upward and thus in turn receive the specific user input associated with upward pull 1516.

Although FIG. 15 discusses pulling the ear for various user inputs, embodiments are not so limited. As an example, wireless listening device 1502 can be configured to associate any type of interaction with the ear as a specific user input, such as a flicking of earlobe 1506. When earlobe 1506 is flicked, a vibrating force can be detected by wireless listening device 1502 and a specific input can be received. In addition to the ear, other parts of a user's anatomy can also be used for user input. For instance, the user's teeth can be used to indicate a user input when the teeth are "clicked", e.g., bitten together to generate a clicking or tapping sound. The sound of the teeth clicking can be picked up by one or more microphones, and/or the specific reverberations through skull caused by the teeth clicking can be picked up by one or more sensors, e.g., accelerometers, in wireless listening device 1502. Such flicking vibrations and/or teeth clicking sounds can be learned or set up ahead of time when the user pairs wireless listening device 1502 with a host device for the first time. Furthermore, wireless listening device 1502 can be configured to measure vibrations and/or other signals created by a finger touching and moving along a surface of the wireless listening device 1502. The direction of motion and position of the finger as it touches wireless listening device 1502 can be received as an input by wireless listening device 1502. For instance, a user can run his finger up or down a stem (not shown in FIG. 15, but shown in FIG. 16 as stem 1606) of wireless listening device 1502 to effectuate an input such as increasing volume when the finger is run up the stem and decreasing volume when the finger is run down the stem.

C. User Input by Voice Control

Other than using physical interactions with the user's anatomy, specific user inputs can be effectuated using voice control. For instance, a spoken phrase including one or more words can be received as a user input, e.g., a voice command. Often, electronic devices that enable voice control require the use of a trigger phrase in order for it to receive a user input. A trigger phrase can be a default phrase that is spoken by the user and recognized by the host device. Once the trigger phase is recognized, the host device can treat the next spoken phrase as a user input. Using a trigger phrase to recognize user inputs is a two-step process that can be cumbersome to use because the user has to speak two phrases instead of one. Furthermore, electronic devices may not be able to recognize when a specific user is speaking the command. Often times, an electronic device may mistakenly interpret a phrase spoken by a nearby non-user (e.g., someone who is not authorized to control the device) during the normal course of a conversation as a trigger phrase or a voice command. As a result, the electronic device may inaccurately interpret parts of a conversation as unintentional voice commands. Or, unauthorized users may inappropriately operate the electronic device by simply speaking the trigger phrase followed by a voice command.

According to some embodiments of the present disclosure, a wireless listening device can enable a host device, e.g., smart phone, tablet, laptop, and the like, to identify a spoken phrase as a user input without the need for a trigger phrase, and perform authentication of the spoken phrase before receiving the spoken phrase as a user input by verifying that the spoken phrase is indeed spoken by the user (e.g., a user authorized to control the host device). As an example, the host device can receive a spoken phrase and then cross reference that spoken phrase with a list of predetermined spoken phrases. If the spoken phrase matches with any one of the spoken phrases in the list of predetermined spoken phrases, then the host device can authenticate the spoken phrase by verifying whether the spoken phrase was spoken by the user.

In some embodiments, the host device can authenticate the spoken phrase by comparing the sounds (i.e., frequencies) of the spoken phrase with known sounds of the user's voice. If the sounds match, then the host device can determine that the spoken phrase is an input; otherwise, if the sounds do not match, then the host device can disregard the spoken phrase as not a user input. To further authenticate the spoken phrase, in some embodiments, the host device can utilize an accelerometer of the wireless listening device. For instance, the host device can receive a measurement of vibrational force experienced by an accelerometer in the wireless listening device when the phrase was spoken. If the vibrational force is greater than a threshold value, then the authentication of the spoken phrase can be confirmed, or independently determined. Even further authentication can be performed by the host device by utilizing one or more microphones of the wireless listening device. As an example, the host device can determine a directionality of the sound by analyzing the temporal movement of sound across two microphones. If the direction of the sound is moving away from the wireless listening device, then the authentication of the spoken phrase can be confirmed, or independently determined.

Sometimes, a phrase spoken by the user during a conversation (i.e., a spoken phrase that is not intended to be a user input) may match with a spoken phrase in the list of predetermined spoken phrases. To minimize the chances of the host device determining that a spoken phrase not intended to be a user input is interpreted to be a user input, the host device can be configured to measure temporal spacing before and after the spoken phrase, and compare the measured temporal space with a delay threshold. If the measured temporal spacing is greater than the delay threshold, then the host device can determine that the spoken phrase is a user input; otherwise, if the measured temporal spacing is less than the delay threshold, then the host device can determine that the spoken phrase is not a user input.

In some embodiments, the list of predetermined spoken phrases and the sound of the user's voice can be set during a one-time initialization protocol. During the initialization protocol, the host device can follow a script to walk the user through various functions that can be initiated by voice command, such as turning on active noise cancellation mode, turning on transparency mode, adjusting the volume, playing/pausing music, and various other functions. The host device can also be configured to allow the user to define what the spoken phrases should be, thereby enhancing personal connection to the host device.

V. Stem with Bus Bar and Method of Forming an Eartip

Although embodiments discussed herein have shown housings that are substantially ovular/oblong (see FIGS. 2A-2B, 5B, 6A, 7, 11A-11B), and/or amorphous (see FIG. 13), embodiments are not limited to such configurations. Rather, some embodiments can include a stem that can be an extension of the outer structure, e.g., outer structure 704 in FIG. 7, that protrudes from the body of the housing. As an extension of the outer structure, the stem can also enclose one or more electrical components within it. In some embodiments, the stem can be a tubular structure that has electrical contacts at its far end for interacting with a power source to charge the wireless listening device.

Figure 16A:
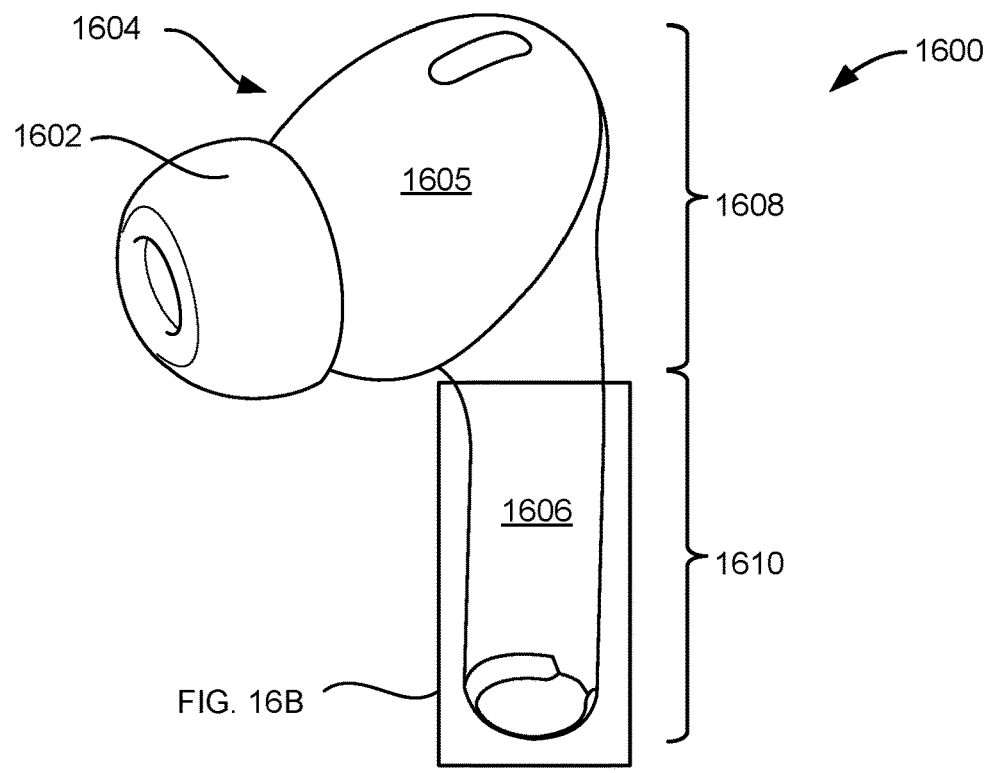
FIG. 16A is a perspective view illustration of an exemplary wireless listening device that includes an eartip coupled to a housing that includes a stem, according to some embodiments of the present disclosure.

FIG. 16A is a perspective view illustration of an exemplary wireless listening device 1600 that includes an eartip 1602 coupled to a housing 1604 that includes a body 1605 and a stem 1606, according to some embodiments of the present disclosure. Housing 1604 can be formed of a monolithic outer structure that forms both body 1605 and stem 1606. Thus, the outer structure can include a body portion 1608 and a stem portion 1610 that extends from body portion 1608. The elongated structure of stem 1606 can be used as an alignment feature for aligning wireless listening device 1606 to a charging device, such as an case, as will be discussed further herein with respect to FIG. 20. Stem 1606 can also house electrical components and allow them to be positioned away from housing 1604 for coupling with the charging device. The different components within stem 1606 are further discussed in detail herein with respect to FIG. 16B.

Figure 16B:
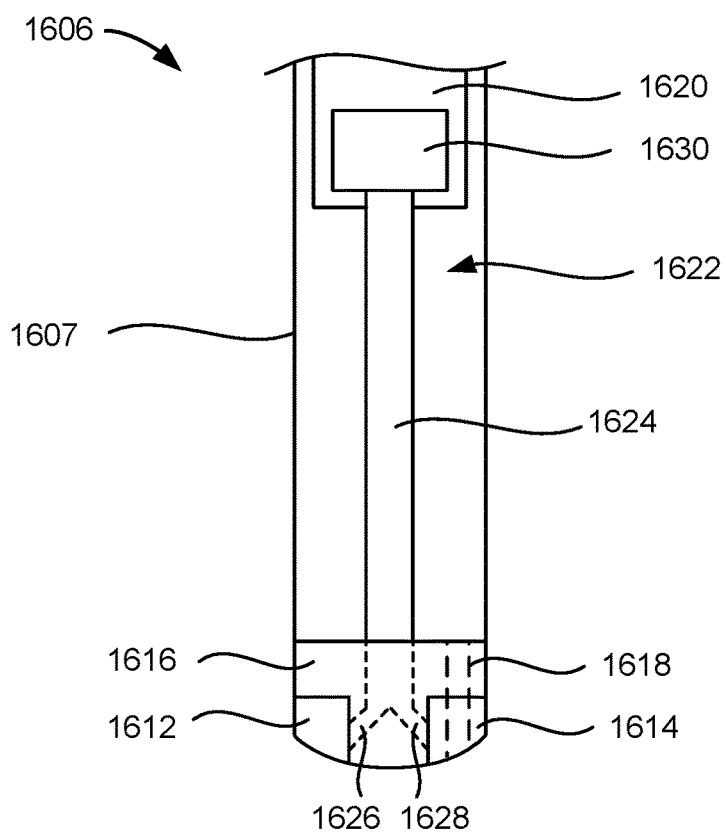
FIG. 16B is a simplified cross-sectional view illustration of the electrical components within stem, according to some embodiments of the present disclosure.

FIG. 16B is a simplified illustration of the electrical components within stem 1606, according to some embodiments of the present disclosure. As shown, stem 1606 can include two external contacts 1612 and 1614 positioned at the very bottom of an outer structure 1607 of stem 1606. External contacts 1612 and 1614 can be conductive structures configured to make contact with leads of an external charging device, such as an case in which wireless listening device 1600 is stored when not used by a user. Contacts 1612 can be securely coupled to an insert mold 1616 that holds contacts 1612 and 1614 in place at the bottom of stem 1606 (e.g., attaches contacts 1612 and 1614 to stem 1606 at the point farthest away from housing 1604). Insert mold 1616 can be a cosmetic piece that has similar aesthetics to outer structure 1607 of stem 1606 to provide an aesthetically pleasing seamless transition between insert mold 1616 and outer structure 1607. In some embodiments, insert mold 1616 and contact 1614 can define an opening 1618 that extends through insert mold 1616 and contact 1614 from an outer surface of contact 1614 to an inner surface of insert mold 1616. Opening 1618 can be an acoustic port that can enable sound waves outside of stem 1606 to enter into stem 1606 so that an internal component, such as a microphone (not shown), can receive the sound waves. Although not shown in FIG. 16B, a gasket can be implemented between insert mold 1616 and outer structure 1607 of stem 1607. That way, a quality seal can be formed between them to prevent intrusion of moisture and/or debris.

Stem 1606 can also include an interconnection structure 1620, e.g., interconnection structure 708 in FIG. 7, that can be any suitable interconnection structure for coupling electronic devices to one another, such as a printed circuit board (PCB). In some embodiments, interconnection structure 1620 is a part of interconnection structure 708 in FIG. 7 that extends into stem outer structure 1607, or a completely separate interconnection structure positioned in stem outer structure 1607. Interconnection structure 1620 can have various electrical components (not shown) mounted on it, such as electronic devices 710 discussed herein with respect to FIG. 7. In some embodiments, external contacts 1612 and 1614 are electrically coupled to interconnection structure 1620. Some ways in which external contacts 1612 and 1614 can be coupled to interconnection structure 1620 can include extending interconnection structure 1620 downward through stem outer structure 1607 so that interconnection structure 1620 can directly attach to external contacts 1612 and 1614 by soldering, hot bar processing, or any other means. In such cases, however, the high heat temperatures from soldering during final assembly, test and pack (FATP) can warp and/or discolor insert mold 1616, which can negatively impact the aesthetics of insert mold 1616 and its seamless aesthetic integration with outer structure 1607.

Thus, according to some embodiments of the present disclosure, a bus bar assembly 1622 can be implemented in stem 1606 to move high-heat processes, such as soldering or hot bar processes, away from insert mold 1616 during FATP. Bus bar assembly 1622 can include a bus bar 1624, two leads 1626 and 1628 at the bottom of bus bar 1624, and a contact head 1630 at the top of bus bar 1624. Bus bar 1624 can be formed of one or more layers of copper traces coated with a protective insulating film, leads 1626 and 1628 can be exposed ends of the one or more layers of copper traces for making contact with external structures, and contact head 1630 can include exposed ends of the one or more layers of copper traces coupled to an alignment frame. Further details of bus bar 1624 and contact head 1630 are discussed further herein with respect to FIGS. 17A-17B and 18A-18B.

In some embodiments, bus bar 1624 can be a flexible cable that electrically couples leads 1626 and 1628 to contact head 1630, so that structures contacting leads 1626 and 1628 can be electrically coupled to structures contacting contact head 1630. As an example, external contacts 1612 and 1614 can be coupled to leads 1626 and 1628, and interconnection structure 1620 can be coupled to contact head 1630 so that external contacts 1612 and 1614 can be electrically coupled to interconnection structure 1620 (or any other electronic components mounted on interconnection structure 1620) via bus bar 1624. By using bus bar 1624, stem 1606 can be constructed without subjecting insert mold 1616 to high temperature processes. For instance, during manufacturing, leads 1626 and 1628 can first be laser welded to external contacts 1612 and 1614 when insert mold 1616 is not present. Then, contacts 1612 and 1614 can be overmolded to form insert mold 1616. Afterwards, at FATP, contact head 1630 of bus bar assembly 1622 can be hot barred or soldered to interconnection structure 1620. Accordingly, the hot temperature process step of hot barring/soldering is moved away from insert mold 1616, and the laser welding process can be performed when insert mold is not present. That way, the cosmetic and structural integrity of insert mold 1616 can be maintained, thereby forming a more aesthetically pleasing and structurally sound product, as well as improving manufacturing yield. Using bus bar assembly 1622 also allows insert mold 1616 along with contacts 1612 and 1614 to move around so that an adhesive can easily be applied to the entire interface surface between insert mold 1616 and outer structure 1607. This eases manufacturing and provides a better seal between them.

Figure 17B:
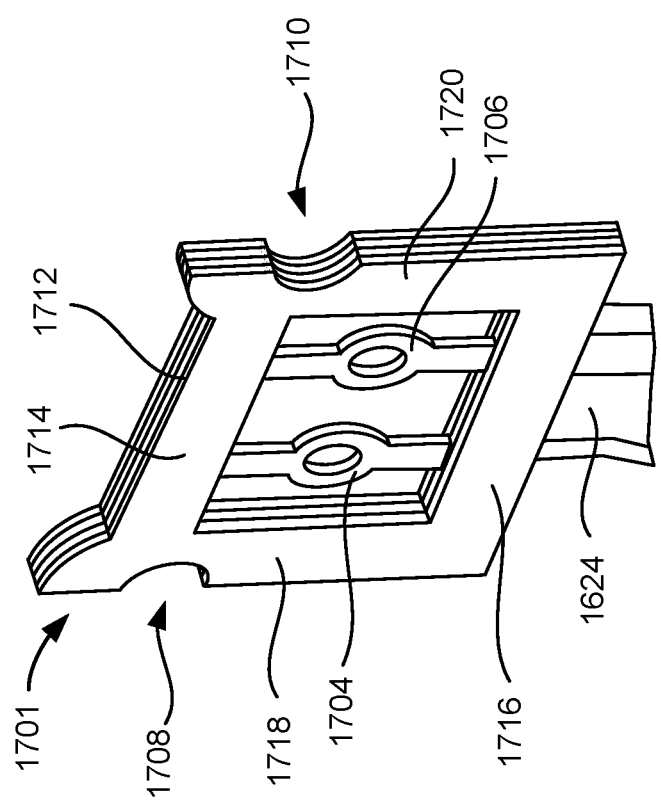
FIG. 17B is a perspective view illustration of an exemplary contact head configured with an alignment frame, according to some embodiments of the present disclosure.
Figure 17A:
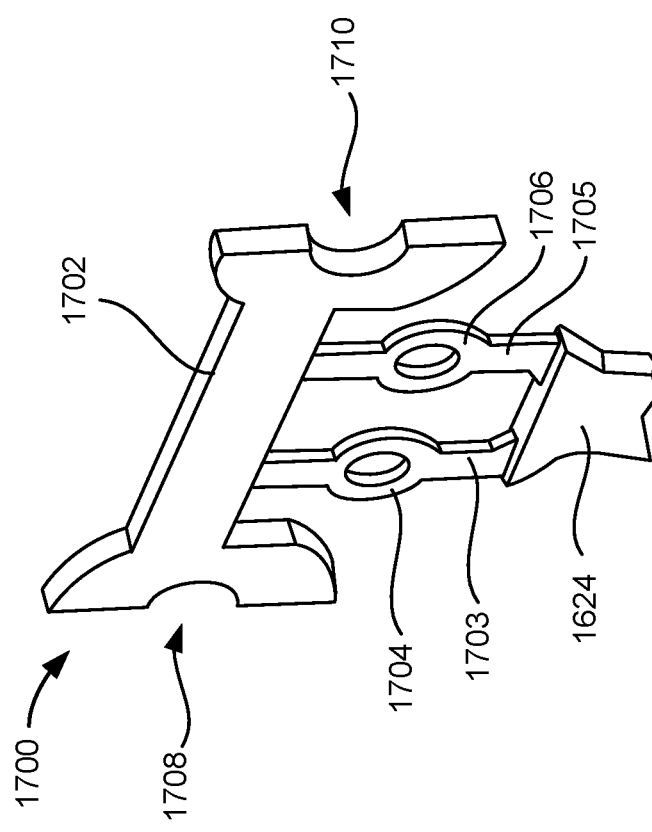
FIG. 17A is a perspective view illustration of an exemplary contact head configured with an alignment bar, according to some embodiments of the present disclosure.

FIGS. 17A and 17B are perspective view illustrations of different contact heads for a bus bar assembly, according to some embodiments of the present disclosure. Specifically, FIG. 17A is a perspective view illustration of an exemplary contact head 1700 configured with an alignment bar, and FIG. 17B is a perspective view illustration of an exemplary contact head 1700 configured with an alignment frame.

As shown in FIG. 17A, conductive head 1700 can include contacts 1704 and 1706. Contacts 1704 and 1706 can be exposed ends of copper traces 1703 and 1705 in bus bar 1624 that are formed to include contact features 1704 and 1706. Contact features 1704 and 1706 can be in the shape of circles as shown in FIG. 17A to increase the surface area of copper traces 1703 and 1705 to enable a more robust coupling with an interconnection structure, e.g., interconnection structure 1620 in FIG. 16B. Conductive head 1700 can also include an alignment bar 1702 for aligning contact features 1704 and 1706 to specific contact locations on the interconnection structure. Alignment bar 1702 can be positioned at ends of copper traces 1703 and 1705 opposite from bus bar 1624. In some embodiments, alignment bar 1702 can include alignment features 1708 and 1710 positioned on laterally opposite ends of alignment bar 1702. Alignment features 1708 and 1710 can be in the shape of crescents that are configured to align with complementary alignment posts, which can be positioned on the interconnection structure. Although alignment bar 1702 is shown as a single horizontal piece, alignment bar 1702 can be reinforced to prevent bending during FATP, as discussed in FIG. 17B.

With reference to FIG. 17B, conductive head 1701 can include an alignment frame 1712 positioned around contact features 1704 and 1706. Alignment frame 1712 can be in the shape of a picture frame that includes four parts: a top part 1714, a bottom part 1716, and two side parts 1718 and 1720, which together form a monolithic structure. Side parts 1718 and 1720 can include alignment features 1708 and 1710 for helping align contact features 1704 and 1706 to specific contact locations on the interconnection structure. The four parts of alignment frame 1712 can better resist bending and/or buckling during FATP to ease manufacturing.

Figure 18B:
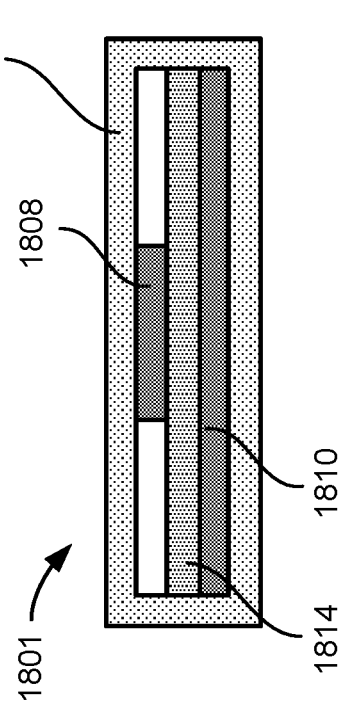
FIG. 18B is a cross-sectional view illustration of an exemplary bus bar having two conductive traces in different layers, according to some embodiments of the present disclosure.
Figure 18A:
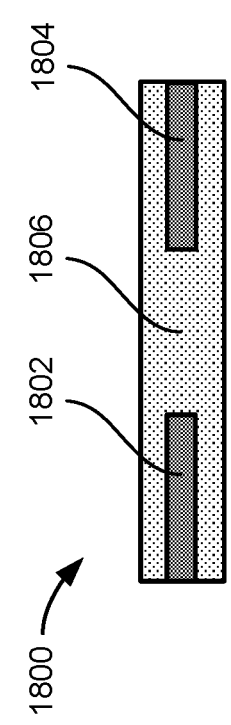
FIG. 18A is a cross-sectional view illustration of an exemplary bus bar having two conductive traces in a single layer, according to some embodiments of the present disclosure.

FIGS. 18A and 18B are cross-sectional view illustrations of different bus bars for a bus bar assembly, according to some embodiments of the present disclosure. Specifically FIG. 18A is a cross-sectional view illustration of an exemplary bus bar 1800 having two conductive traces in a single layer, and FIG. 18B is a cross-sectional view illustration of an exemplary bus bar 1801 having two conductive traces in different layers.

As shown in FIG. 18A, bus bar 1800 can include a first copper trace 1802 and a second copper trace 1804 that are both insulated from one another by insulating film 1806. First copper trace 1802 can be coupled to ground, and second copper trace 1804 can be coupled to power, or vice versa. First and second copper traces 1802 and 1804 can be formed in a single layer such that copper traces 1802 and 1804 are coplanar. Insulating film 1806 can be formed of any suitable insulating material, such as polyimide (PI) or any other polymer material. Although first and second copper traces 1802 and 1804 are shown to be arranged in a single layer in FIG. 18A, embodiments are not limited to such configurations. In some embodiments, the copper traces can be arranged in different layers, as shown in FIG. 18B.

With reference to FIG. 18B, bus bar 1801 can include a first copper trace 1808 and a second copper trace 1810 that are both disposed within an insulating film 1812. First copper trace 1808 can be coupled to power, and second copper trace 1810 can be coupled to ground, or vice versa. First and second copper traces 1808 and 1810 can be formed in different layers that are separated by an insulating layer 1814. Insulating film 1812 and insulating layer 1814 can be formed of any suitable insulating material, such as polyimide (PI) or any other non-conductive polymer material. By arranging first and second copper traces 1808 and 1810 in different layers, each trace can take advantage of the entire width of bus bar 1801. Thus, any of copper traces, e.g., second copper trace 1810, can have a width that extends across the entire width of bus bar 1810. Having a greater width increases the cross-sectional area of second copper trace 1810, thereby allowing second copper trace 1810 to have less resistance, which improves the conductivity of bus bar 1801.

VI. Method of Forming an Eartip

Figure 19A:
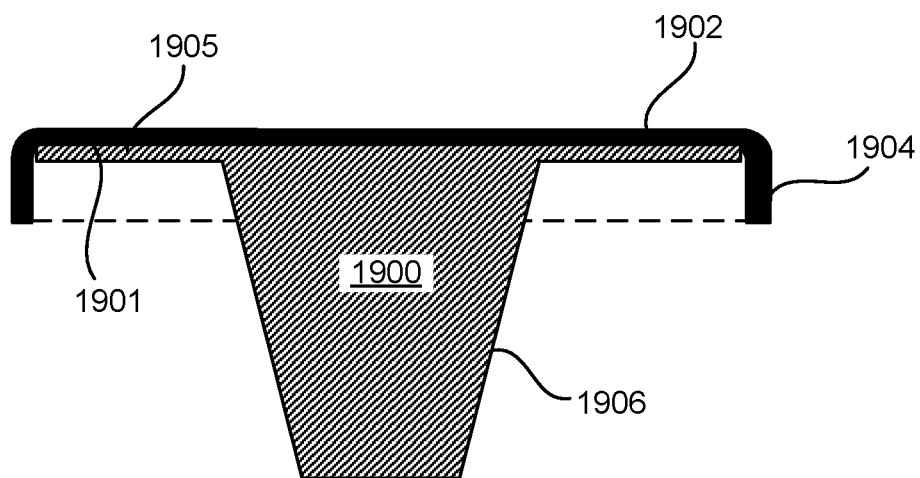
FIGS. 19A-19G are simplified illustrations of an exemplary method of forming an eartip, according to some embodiments of the present disclosure.

FIGS. 19A-19G are simplified illustrations of an exemplary method of forming an eartip, according to some embodiments of the present disclosure. The eartip can be eartip 300 discussed herein with respect to FIG. 3. As shown in FIG. 19A, a first mold 1900 can be patterned over a first side 1901 of wire mesh 1902. Wire mesh 1902 can be a circular disk cut from a sheet of wire cloth formed of a network of wire suitable for allowing sound to pass through but preventing dust from passing through, e.g., 50 mesh wire cloth. In some embodiments, wire mesh 1902 can have a lip 1904 that is bent at a 90 degree angle around the entire perimeter of wire mesh 1902, as illustrated by the dotted lines representing structures that are behind the cut line. Lip 1904 can be used as an alignment feature for later processes. In certain embodiments, first mold 1900 can include a flat layer 1905 and a protrusion 1906 extending from the center of flat layer 1905. Flat layer 1905 can cover a surface of wire mesh 1902 bordered by lip 1904, and protrusion 1906 can be a tapered structure that narrows as it extends away from wire mesh 1902. Protrusion 1906 can act as an alignment feature that can work alone or in conjunction with lip 1905 for alignment purposes in later processing.

Figure 19B:
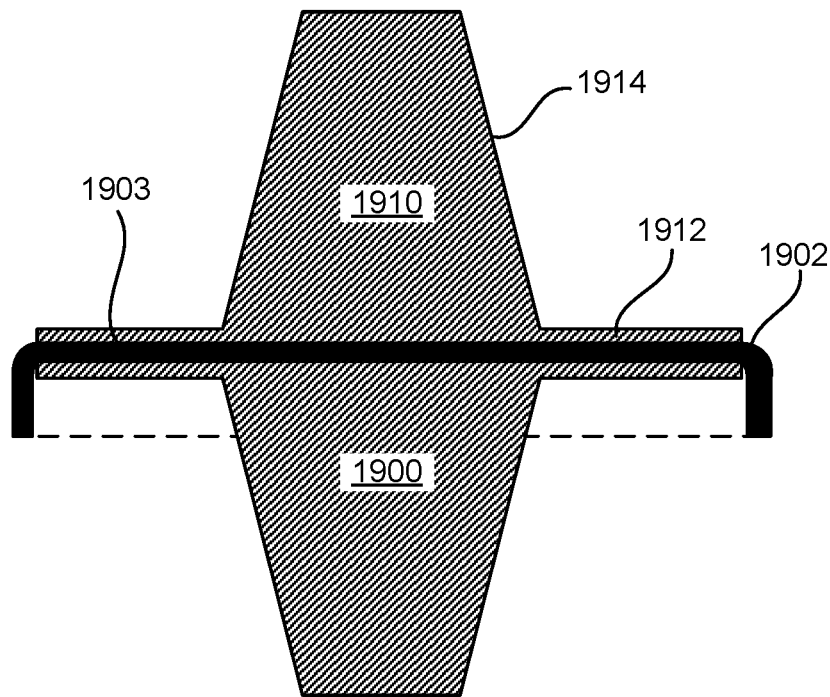

In some embodiments, a second mold 1910 can be formed on a second side 1903 of wire mesh 1902 opposite of first side 1901. Second mold 1910 can be formed as a mirror image of first mold 1900 and positioned to be vertically aligned with first mold 1900. Thus, second mold 1910 can also include a flat layer 1912 and a protrusion 1914 extending from the center of flat layer 1912. Protrusion 1914 can be a tapered structure that narrows as it extends away from wire mesh 1902 and first mold 1900. Protrusion 1914 can act as an alignment feature for later processing, e.g., injection molding. In some embodiments, first and second molds 1900 and 1910 can be formed of a material that resists bonding with certain materials and can function as a mask that prevents those certain materials from forming on regions of wire mesh 1902 covered by first and second molds 1900 and 1910, as will be discussed further herein. Although FIGS. 19A and 19B are ordered such that first mold 1900 is formed before second mold 1910, it is to be appreciated that this is merely exemplary and that other embodiments can form second mold 1910 before first mold 1900 without departing from the spirit and scope of the present disclosure.

Figure 19C:
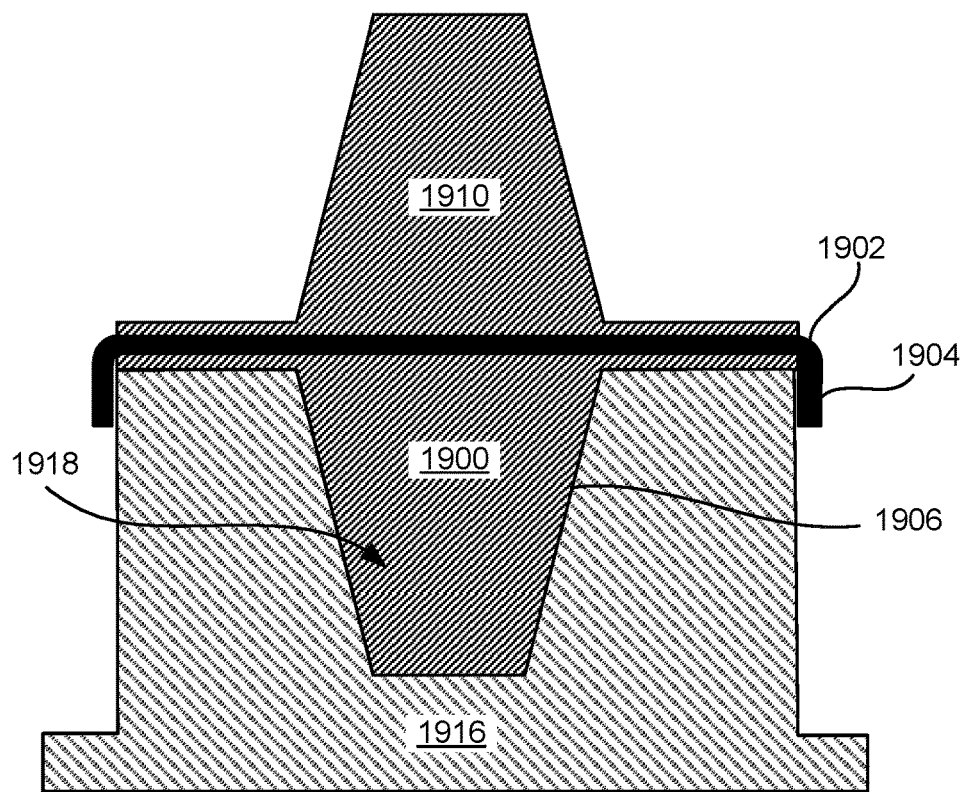
Figure 19D:
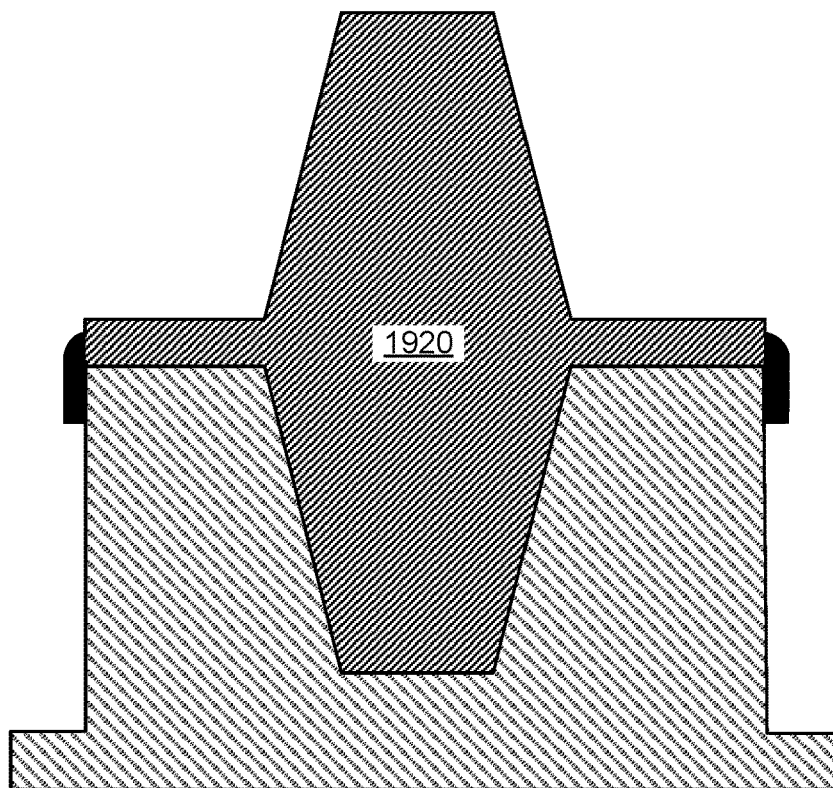

Once second mold 1910 is formed, then the resulting structure can be positioned on a tool fixture 1916 as shown in FIG. 19C. Tool fixture 1916 can be a fixture of a processing tool, e.g., a silicon molding tool, having a recess 1918 designed to receive and position the structure including wire mesh 1902 and first and second molds 1900 and 1910 in the correct position for processing. In some embodiments, protrusion 1906 of first mold 1900 can correctly align the structure to tool fixture 1916 by resting in recess 1918. Furthermore, lip 1904 can also help align the structure with tool fixture 1916 by wrapping around the outer edges of fixture 1916.

After the structure is properly aligned, energy can be applied to melt portions of first and second molds 1900 and 1910. For instance, ultrasonic energy can be applied to the structure and cause first and second molds 1900 and 1910 to melt over a portion of wire mesh 1902 disposed between first and second molds 1900 and 1910, thereby forming combined mold 1920. By melting first and second molds 1900 and 1910 to cover a portion of wire mesh 1902, air gaps between first and second molds 1900 and 1910 can be removed and wire mesh 1902 can thus be better coated and protected by molds 1900 and 1910 so that formation of structures using injection molding in later processing steps, such as an attachment mechanism and a inner eartip body of the eartip, can be prevented from leaking and/or flashing/ spreading into portions of wire mesh 1902 covered by molds 1900 and 1910, as discussed herein with respect to FIGS. 19E and 19F.

Figure 19E:
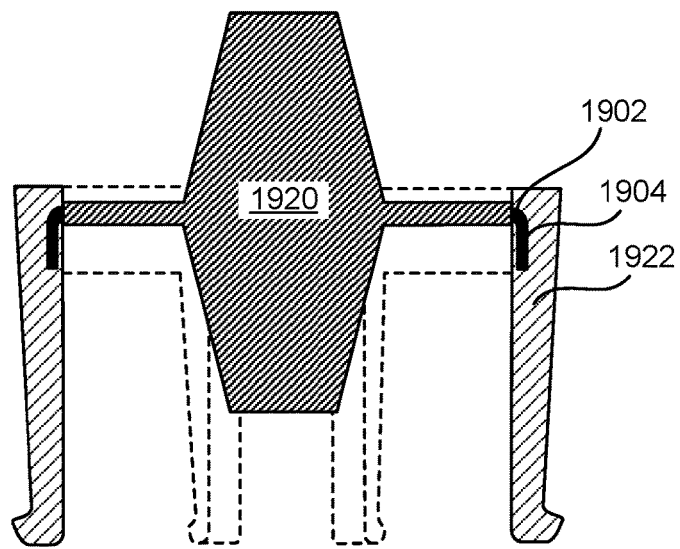

As shown in FIG. 19E, an attachment mechanism 1922 can be formed by injection molding. Attachment mechanism 1922 can be substantially similar in structure to attachment structure 308 discussed herein with respect to FIGS. 3A and 3C. Attachment structure 308 can, in some embodiments, be molded over lip 1904 of wire mesh 1902. Molding over lip 1904 can provide sufficient surface area for attachment mechanism 1922 to securely couple with wire mesh 1902. In some embodiments, attachment structure 308 can be formed of a stiff polymer, such as polycarbonate. As can be appreciated herein, molds 1900 and 1910 (and thus combined mold 1920) can be formed of a material that resists forming a chemical bond with polycarbonate (PC) materials, e.g., a synthetic polymer like polyvinyl alcohol (PVA). By forming molds 1900 and 1910 with PVA, combined mold 1920 can act as a mask that prevents flashing of PC materials into inner regions of wire mesh 1902. As will be appreciated further herein with respect to FIG. 19G, molds 1900 and 1910 can be formed of a soluble material so that it can be cleanly removed to leave wire mesh 1902 intact.

Figure 19F:
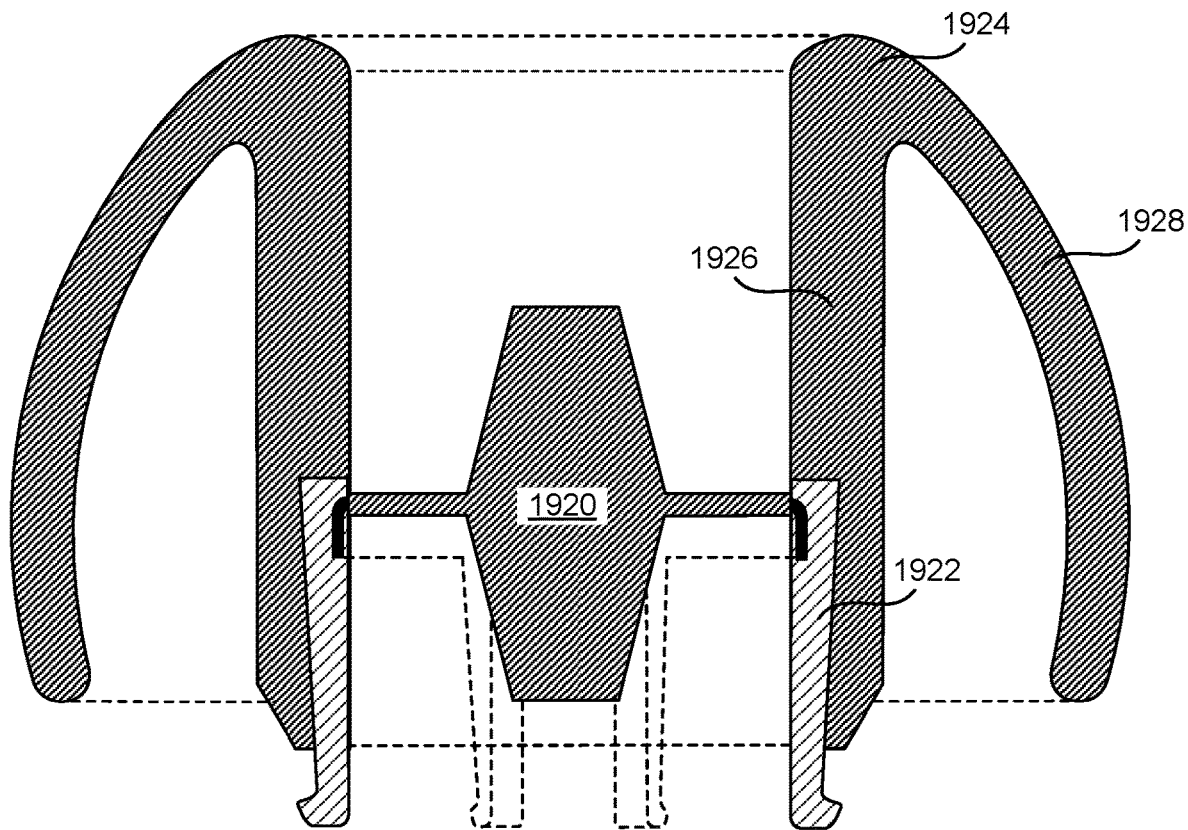

Then, as shown in FIG. 19F, the rest of the eartip can be formed. For instance, a single, monolithic structure 1924 including inner eartip body 1926 and outer eartip body 1928 can be formed. The structure and purpose of inner eartip body 1926 and outer eartip body 1928 can be similar to inner eartip body 316 and outer eartip body 322 discussed herein with respect to FIGS. 3A-4C. Monolithic structure 1924 can be formed of a soft, compliant material that can easily bend and deform to fit within an ear canal. As an example, monolithic structure 1924, and thus inner eartip body 1926 and outer eartip body 1928 by association, can be formed of silicone. Structure 1924 can be formed over portions of attachment mechanism 1922 so that attachment mechanism 1922 can provide a stiff stopper with which structure 1924 can attach to the eartip.

Figure 19G:
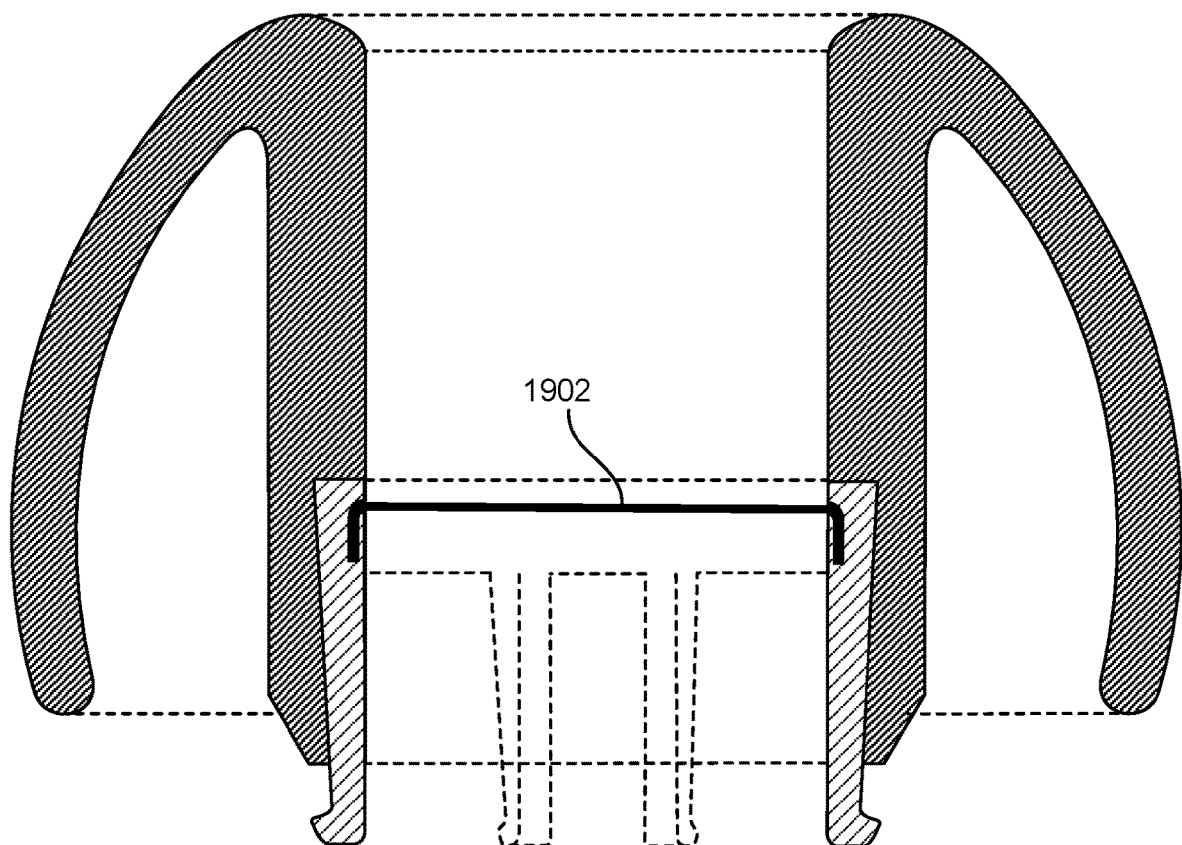

Once structure 1924 including inner eartip body 1926 and outer eartip body 1928 is formed, combined mold 1920 can be removed to form the completed eartip, according to some embodiments of the present disclosure as shown in FIG. 19G. For instance, mold 1920 can be dissolved and washed away using a solvent compatible for removing PVA, such as hot water. Removing mold 1920 can expose the once-covered portions of wire mesh 1902 and leave it intact. That way, wire mesh 1902 can remain as a barrier for debris and an avenue through which sound can pass through, such as sound generated by a housing, e.g., housing 702 in FIG. 7.

VII. Case for Wireless Listening Devices

As mentioned herein, a wireless listening device can be one of a pair of wireless listening devices that are designed to fit in the ears of a user and to fit within an case when not in use. The case can protect the wireless listening devices from physical damage as well as provide a source of power for charging the wireless listening devices.

Figure 20A:
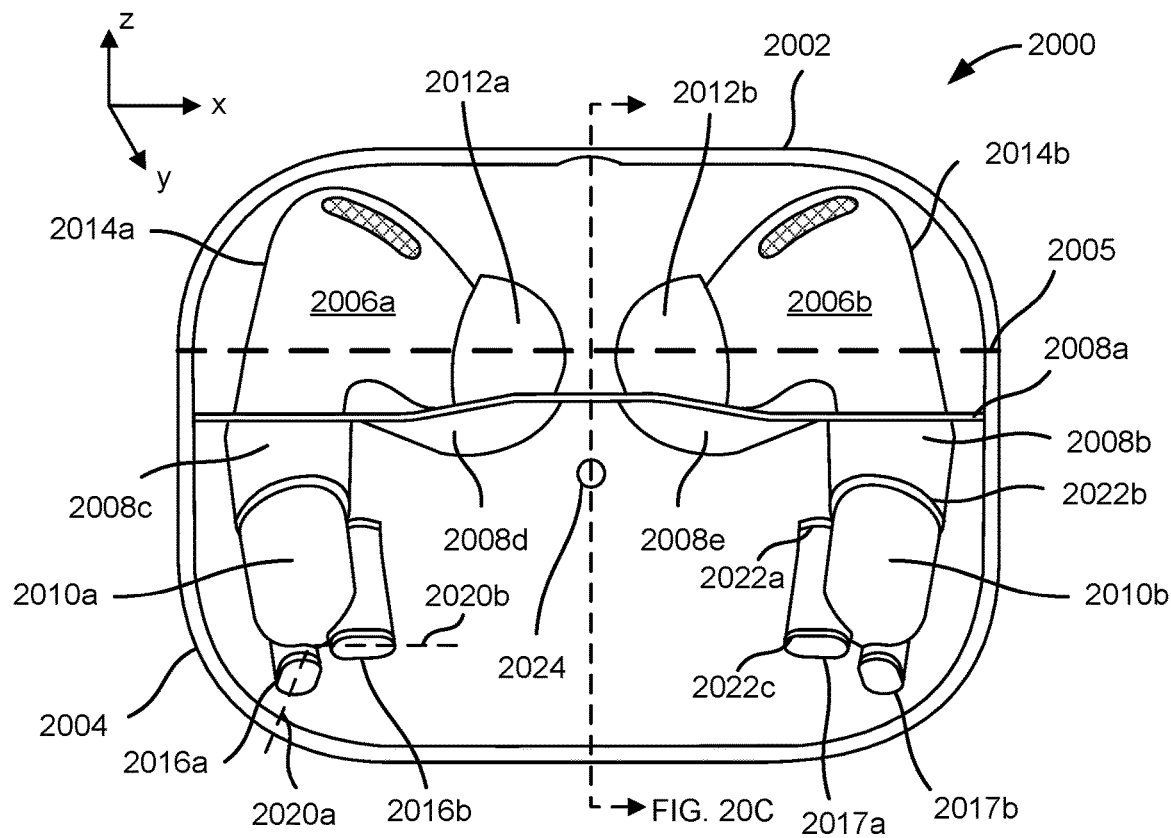
FIG. 20A is a front-view illustration of an exemplary case that is transparent to illustrate the configuration of the components inside of the case from the front, according to some embodiments of the present disclosure.
Figure 20B:
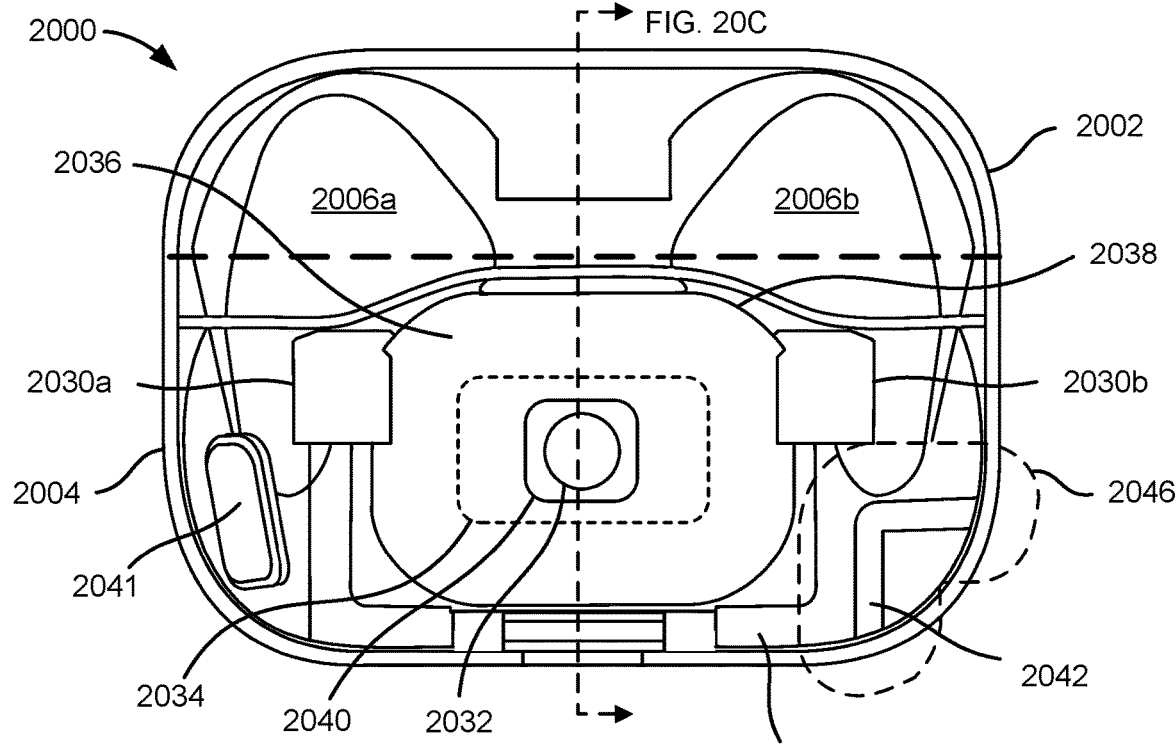
FIG. 20B is a back-view illustration of an exemplary case that is transparent to illustrate the configuration of the components inside of the case from the back, according to some embodiments of the present disclosure.
Figure 20C:
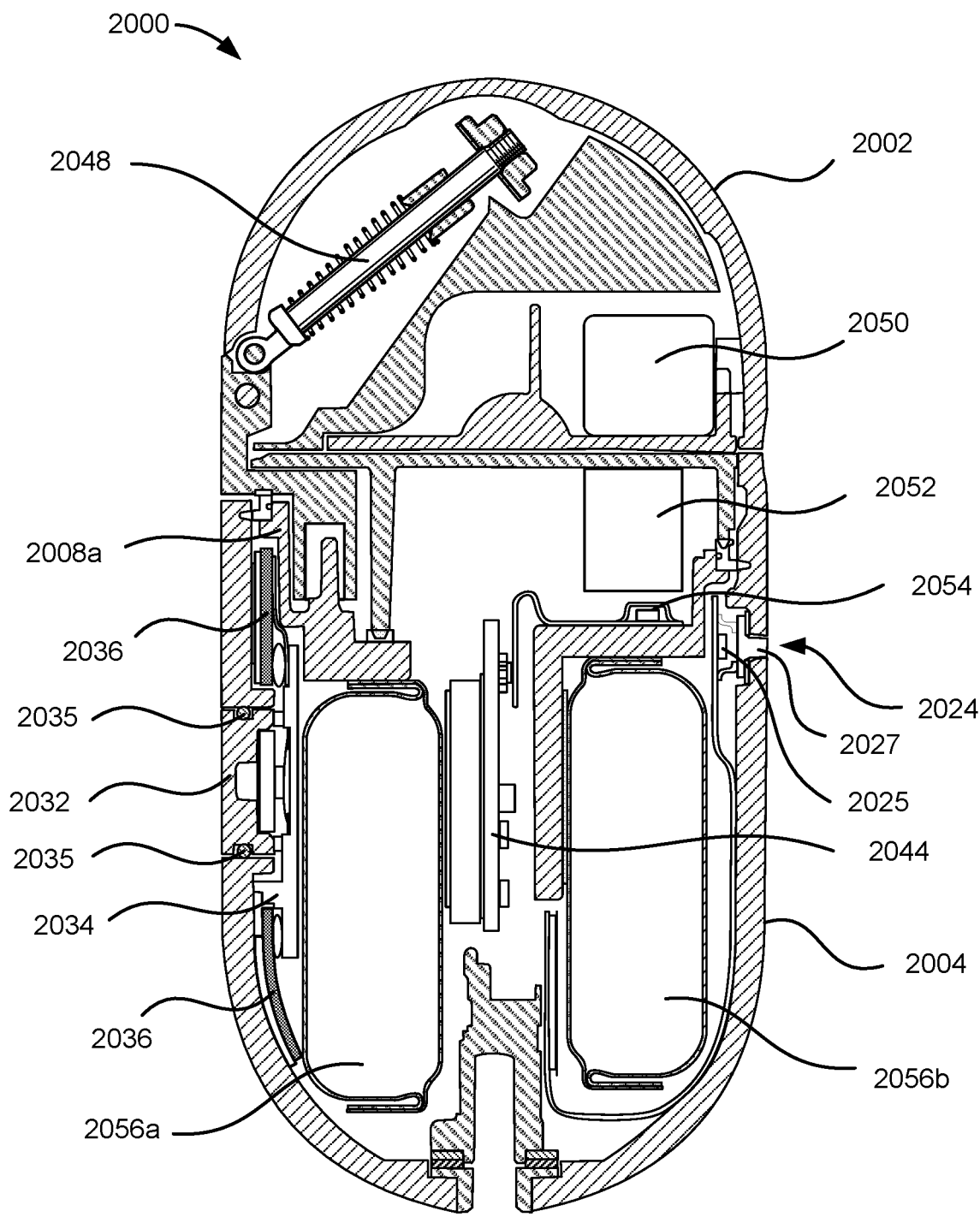
FIG. 20C is a cross-sectional view illustration of an exemplary case, according to some embodiments of the present disclosure.

FIGS. 20A-20C are different views of an exemplary case for a pair of wireless listening devices, according to some embodiments of the present disclosure. Specifically, FIG. 20A is a front-view illustration of a case 2000 that is transparent to illustrate the configuration of the components inside of case 2000 from the front, FIG. 20B is a back-view illustration of case 2000 that is also transparent to illustrate the configuration of the components inside of case 2000 from the back, and FIG. 20C is a cross-sectional view illustration of case 2000.

As shown in FIG. 20A, case 2000 can include a lid 2002 and a body 2004 that forms an internal cavity for housing a pair of wireless listening devices 2006*a-b*. Lid 2002 and body 2004 can meet at interface 2005. In some embodiments, case 2000 can include an internal frame 2008 formed of a monolithic structure including portions 2008a-d designed to provide contours and surface features against which wireless listening devices 2006a-b can rest in the strategic positions discussed herein to minimize the size of case 2000. Portion 2008a can be a part of the internal frame that makes contact with body 2004 to seal areas inside case 2000 below portion 2008a from the outside environment. Portions 2008b-c can be parts upon which stems 2010a-b can rest, and portions 2008d-e can be parts upon which eartips 2012a-b and housings 2014a-b can rest. Details of internal frame 2008 are further shown and discussed herein with respect to FIGS. 21A-21B, and 22A-22B.

To minimize the overall size of case 2000, wireless listening devices 2006a-b can be positioned at strategic angles when placed in case 2000. In some embodiments, each stem 2010a-b of respective wireless listening devices 2006a-b are positioned at an angle with respect to two axis: an x-axis and a y-axis, instead of being positioned substantially vertical where the stem is not positioned at any angle in the x- and y-axes. For purposes of description, the x-axis runs between wireless listening devices 2006a-b, the y-axis runs between the front and the back of the case, and the z-axis runs between the bottom of body 2004 and the top of lid 2002.

Case 2000 can be configured to charge wireless listening devices 2006a-b when they are housed in case 2000. Thus, case 2000 can include two pairs of contacts 2016a-b and 2018a-b for making electrical contact with respective pins on stems 2010a-b so that charge can flow from an internal battery of case 2000 to internal batteries of wireless listening devices 2006a-b. In some embodiments, the contacts of each pair of contacts are positioned on axes 2020a-b that are oriented at 90 degree angles with respect to one another. That way, the amount of space needed to implement contacts 2016a-b is smaller when compared to other contact arrangements, such as some contact arrangements where the two contacts are positioned at 180 degree angles with respect to one another. Utilizing less space results in more space for other components within case 2000 and/or helps reduce the overall size of case 2000.

In some embodiments, contacts 2016a-b and 2018a-b can be sealed from the outside environment to protect them from moisture. For instance, sealing rings 2022a, 2022b, and 2022c can be strategically positioned at interface regions that are entry points to contacts 2016a-b and 2018a-b. As an example, sealing ring 2022a and 2022b can be positioned on opposite ends of each contact 2016a-b and 2018a-b, and sealing ring 2022c can be positioned on a portion of the interior frame around portion 2008b.

Case 2000 can also include a visual indicator 2024 configured to emit different colors of light. Visual indicator 2024 can change colors depending on the charge status of the case, e.g., emit green light when the case is charged, emit orange light when the case battery is charging and/or when the case battery has less than a full charge, and red light when the battery is depleted. When viewed from outside of case 2000, visual indicator 2024 can have a circular shape, or any other suitable shape, such as square-like, rectangular, oval, and the like. With brief reference to FIG. 20C, visual indicator 2024 can include a light emitter 2025 and a light tube 2027. Light emitted from emitter 2024 can be projected into light tube 2027, which can direct the light out of case 2000. According to some embodiments of the present disclosure, an input end of light tube 2027 and an output end of light tube 2027 can have different shapes, as will be discussed further herein with respect to FIG. 25.

As shown in the back-view illustration of case 2000 in FIG. 20B, case 2000 can include two sets of retaining magnets 2030a-b positioned below portions of housing bodies of respective wireless listening devices 2006a-b. Each set of retaining magnets can be specifically configured to attract and hold respective wireless listening devices 2006a-b in place when devices 2006a-b are placed in case 2000. For example, each set of retaining magnets 2030a-b can include a plurality of magnets and shunts that are uniquely designed and arranged to generate highly concentrated magnetic attraction on ferrous retention slabs in wireless listening devices 2006a-b, as discussed herein with respect to FIGS. 23 and 24A-24B.

Case 2000 can further include a button 2032 mounted on a button substrate 2034, such as a PCB, that includes conductive traces for routing electrical signals when button 2032 is pressed by a user. Button 2032 can be configured to initiate different commands when pressed, such as a reset command or a pairing command with an external device, such as a smart phone. In some embodiments, case 2000 can also include a wireless power receiving coil 2036 formed of a wire arranged in a plurality of turns between an outer diameter 2038 and an inner diameter 2040. Receiving coil 2036 can wind around button 2032 so that button 2032 is positioned at a center of receiving coil 2036 within inner diameter 2040. Receiving coil 2036 can interact with time-varying magnetic flux to generate current that can be used to charge an internal battery of case 2000. To minimize the height and width of receiving coil 2036, a portion of receiving coil 2036 can overlap with a portion of button substrate 2034 so that inner diameter 2040 is positioned over substrate 2034. Another view of this configuration can be seen in the cross-sectional view of FIG. 20C. As shown, portions of coil 2036 can overlap the outer regions of button substrate 2034, and button 2032 can be positioned within the inner diameter of coil 2036. In some embodiments, button 2032 can include an o-ring 2035 that can act as a dynamic seal that moves with the movement of button 2032. O-ring 2035 can seal the internal components of case 2000 from the outside environment around button 2032. By using o-ring 2035, space utilized by button 2032 can be minimized, thereby allowing coil 2036 to overlap with portions of button substrate 2034, which helps decrease the size of case 2000 as a whole.

With reference back to FIG. 20B, in some embodiments, case 2000 can also include, a speaker 2041 configured to emit audible sound. Speaker 2041 can be configured to emit sound to indicate different states of the device. For instance, speaker 2041 can emit a beep when case 2000 is successfully paired with an external device, such as a smart phone, and/or emit sound when case 2000 drops out of connection with the external device. Furthermore, speaker 2041 can be configured to emit a repetitive pinging noise when it is in a find-me mode, such as when the case is lost and the user is looking for the case.

Case 2000 can also include an antenna 2042 for sending and receiving radio frequency (RF) signals. Antenna 2042 can be a conductive body formed on a case substrate 2044 and can be positioned a distance away from other electrical components to mitigate interference of antenna operation. For instance, a clearance zone 2046 can be imposed around antenna 2042 where other electrical components are not allowed to be positioned. By having an antenna, case 2000 can wirelessly communicate with other devices to send and receive data and commands. For instance, if the case is lost, the user can access his or her smart phone to which case 2000 is paired and initiate the find-me sequence where speaker 2041 is activated to emit the repetitive pinging noise. Antenna 2042 can be positioned at one of two bottom corners of case 2000 within body 2004 and away from lid 2002. In some instances, speaker 2041 can be positioned in the other of two bottom corners of case 2000 within body 2004 and away from lid 2002, as shown in FIG. 20B.

As shown in FIG. 20C, case 2000 can include a hinge 2048 for opening and closing lid 2002. Hinge 2048 can be a bistable hinge that has two stable states: an open state and a closed state. Having a bistable hinge can allow for case 2000 to close without needing many magnets to generate a high magnetic attraction force to draw lid 2002 toward body 2004 to close lid 2002. Accordingly, only a single magnet 2050 may be sufficient to keep lid 2002 closed. Thus, in the stable closed state, hinge 2048 can cause lid 2002 to press on body 2004 and magnet 2050 may need to have just enough force to help it stay closed to resist inadvertent opening of lid 2002. Details of bistable hinge 2048 is discussed further herein with respect to FIGS. 27 and 28A-28C.

To help keep lid 2002 closed, magnet 2050 can be attracted to a magnetic component in body 2004. For instance, a shunt 2052 formed of a ferrous block of material, such as steel, can be positioned within body 2004 immediately below a top surface of body 2004 and aligned with magnet 2050 when lid 2002 is in the closed position. Magnet 2050 can be attracted to shunt 2052 when the magnetic fields from magnet 2050 interact with the ferrous properties of shunt 2052. According to some embodiments of the present disclosure, shunt 2052 can operate as a hybrid retention and sensor shunt that can not only help lid 2002 stay closed by attracting magnet 2050, but also be used as a sensor component so that a sensor 2054 positioned below shunt 2052 can detect when lid 2002 is opened or closed by way of shunt 2052, as will be discussed further herein with respect to FIGS. 26A-26B. Sensor 2052 can be any suitable sensor that can detect the presence of a magnetic field, such as a hall-effect sensor.

In some embodiments, case 2000 can further include one or more energy storage devices 2056a-b, upon which a plurality of electrical devices can be mounted. Energy storage devices 2056 can store power that can be discharged to operate case 2000. In some embodiments, case 2000 can include two energy storage devices 2056a-b that are positioned on opposite sides of a vertically oriented case substrate 2044, as will be discussed further herein with respect to FIGS. 29A-29C. In addition to including an antenna, e.g., antenna 2042 discussed herein with respect to FIG. 20B, case substrate 2044 can operate as the motherboard for operating case 2000, and can thus include communication systems, computing systems, and circuitries, e.g., case communication system 121, case computing system 119, and power transmitting circuitry 120 in FIG. 1.

A. Internal Frame

Figure 21A:
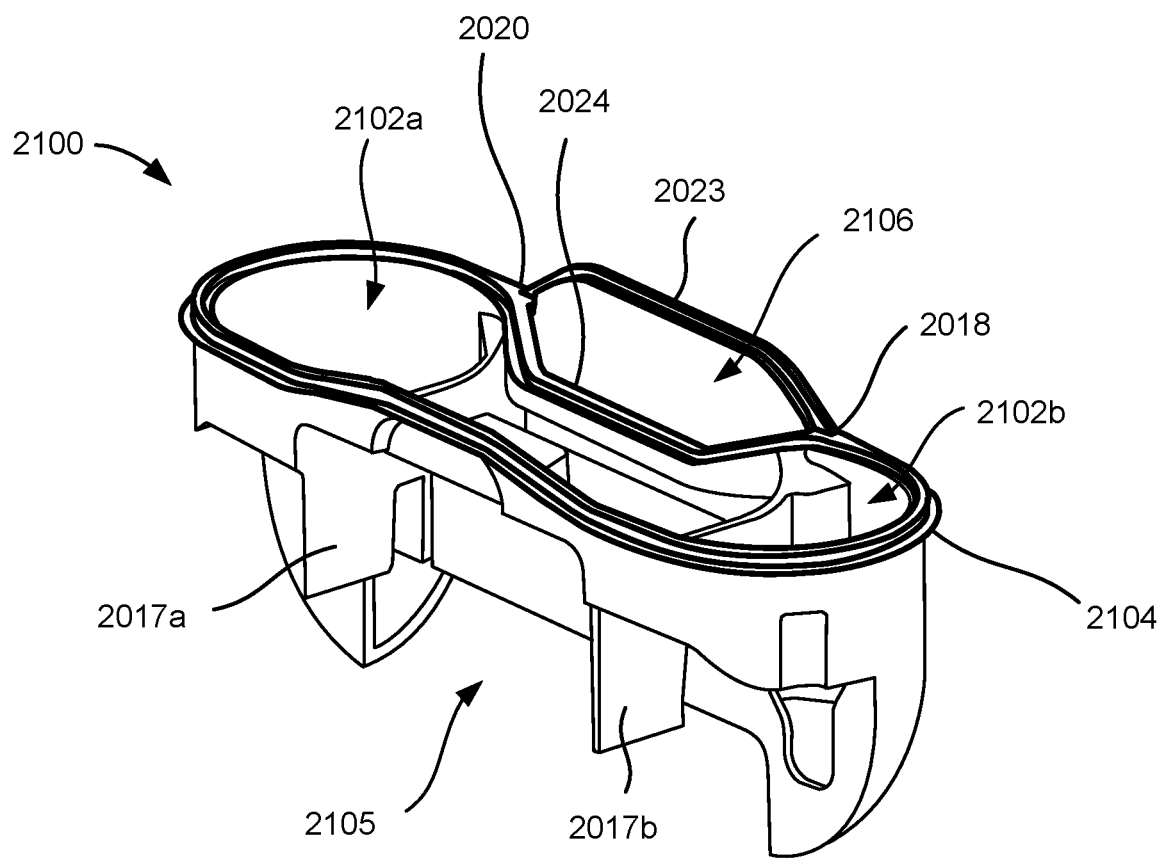
FIG. 21A is a simplified perspective view illustration of an internal frame for a case, according to some embodiments of the present disclosure.
Figure 21B:
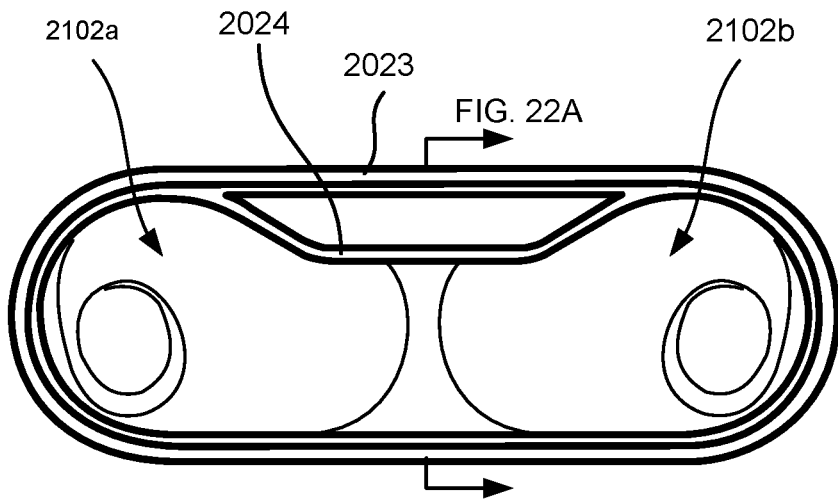
FIG. 21B is a simplified top-down view illustration of an internal frame for a case, according to some embodiments of the present disclosure.

As discussed herein with respect to FIG. 20A, an internal frame can be formed of a monolithic structure designed to provide contours and surface features against which electronic components within the case can rest and/or attach. FIGS. 21A-21B illustrate different views of an exemplary internal frame 2100, according to some embodiments of the present disclosure. Specifically, FIG. 21A is a simplified perspective view illustration of internal frame 2100, and FIG. 21B is a simplified top-down view illustration of internal frame 2100.

Internal frame 2100 is substantially similar to internal frame 2008 in FIG. 20A, and can provide the structural backbone for the internal components of a case. As discussed herein with respect to FIG. 20A, the internal frame can provide a structure upon which electrical devices can be mounted and compartmentalized, such as wireless listening devices, a printed circuit board, batteries, speakers, and the like. Thus, internal frame 2100 can define two bowl regions 2102a-b for accepting each wireless listening device, a center region 2105 defined by flaps 2017a-b for holding battery packs and a printed circuit board with electrical devices, and various other contours for other electronic devices discussed herein.

In some embodiments, internal frame 2100 can be configured to seal the internal components of a case from the outside environment through the top of the case body. Thus, internal frame 2100 can include a sealing structure 2104 that is formed of a pliable material suitable for sealing purposes. Sealing structure 2104 can follow the contours of the top ridges of internal frame 2100. For instance, sealing structure 2104 can extend around the perimeter of the top ridge of internal frame 2100, as shown in FIG. 21A. To seal off regions around a hinge (not shown) for the case, sealing structure 2104 can diverge at a first point 2018, extend around a clearance region 2106 in which a portion of the hinge could be positioned, and then converge back together past clearance region 2106 at a second point 2020, which then continues as part of sealing structure 2104. Thus, sealing structure 2104 can include a first diverged portion 2023 and a second diverged portion 2024.

As shown in FIG. 21A, first diverged portion 2023 can be positioned a distance away from second diverged portion 2024. In some embodiments, first diverged portion 2023 can be positioned a vertical distance away from second diverged portion 2024. And, as shown in FIG. 21B, first diverged portion 2023 can also be positioned a lateral distance away from second diverged portion 2024. In some instances, first diverged portion 2023 can be positioned at the outer perimeter of internal frame 2100, while second diverged portion 2024 can be positioned within the outer perimeter of internal frame 2100. As will be appreciated further herein with respect to FIGS. 22A-22B, second diverged portion 2024 can be constructed differently than the rest of sealing structure 2104, including first diverged portion 2023, so that when internal frame 2100 is positioned within a body of a case and an insert is positioned over internal frame 2100, sealing structures 2014 can seal the electrical components within the case body from the outside environment.

Figure 22A:
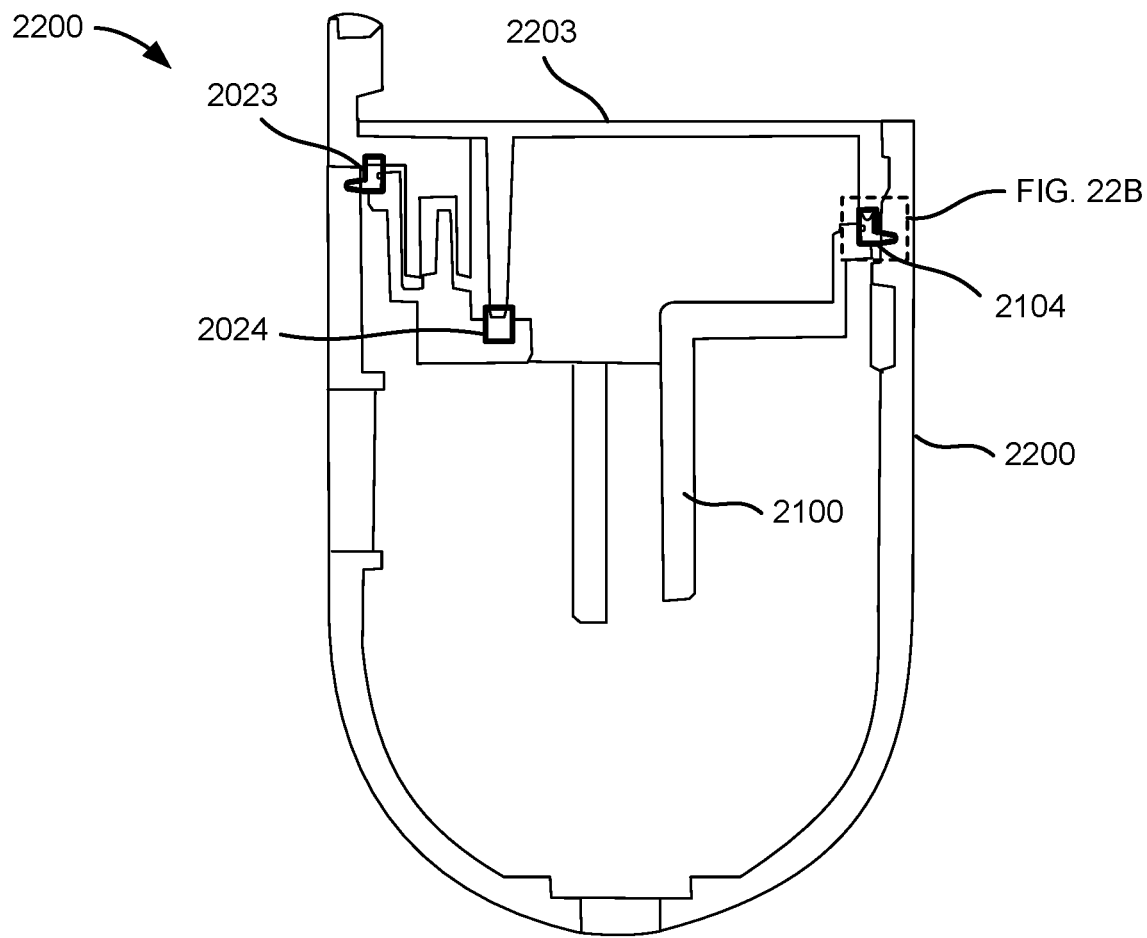
FIG. 22A is a simplified cross-sectional view illustration of the internal frame in FIG. 21A, according to some embodiments of the present disclosure.
Figure 22B:
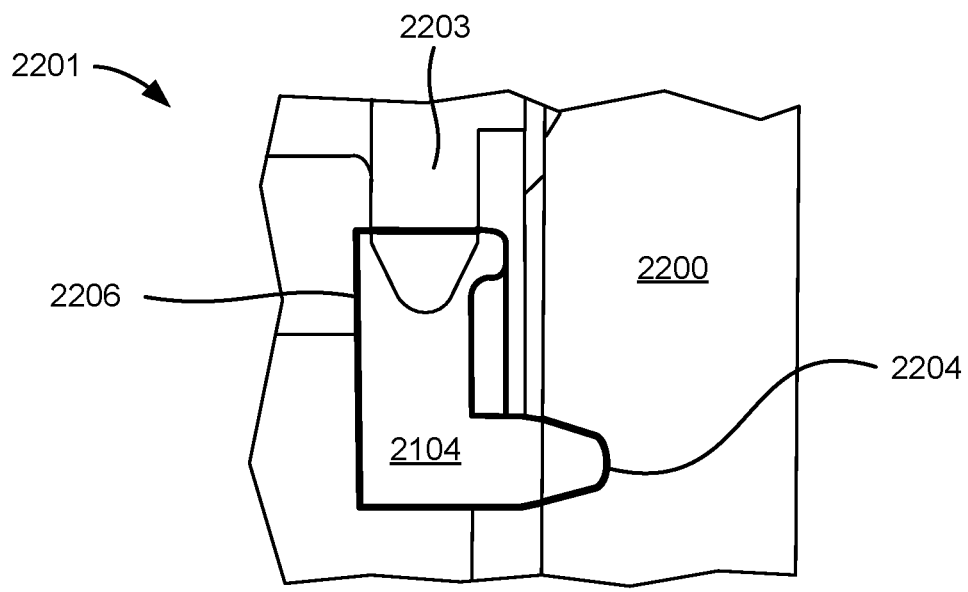
FIG. 22B is a simplified zoomed-in view illustration of a portion of the cross-sectional view of FIG. 22A, according to some embodiments of the present disclosure.

FIGS. 22A-22B illustrate cross-sectional views of internal frame 2100 implemented in a body 2200 of a case with an insert 2203 attached on the top of body 2200, according to some embodiments of the present disclosure. Specifically, FIG. 22A is a simplified cross-sectional view illustration 2200 of internal frame 2100, and FIG. 22B is a simplified zoomed-in view illustration 2201 of a portion of the cross-sectional view of FIG. 22A. The cross-sectional views can be from a perspective across the cut line shown in FIG. 21B Insert 2203 can be a structure that is pressed over internal frame 2100 and functions as part of the outer top structure of body 2200 of the case. As can be seen in the cross-sectional view illustration 2200 of internal frame 2100, sealing structure 2104 and first diverged portion 2023 can make contact with both insert 2203 and body 2200, while second diverged portion 2024 can make contact with only insert 2203 and not body 2200. Thus, second diverged portion 2024 can be configured to make a face seal with internal frame 2100, while the rest of sealing structure 2104 including first diverged portion 2023 can be configured to make both a face seal with insert 2203 and a radial seal with body 2200.

As shown in the close-up cross-sectional view illustration 2201 of sealing structure 2104 in FIG. 22B, sealing structure 2104 can include a horizontal portion 2204 and a vertical portion 2206 such that the combination of horizontal portion 2204 and vertical portion 2206 forms a monolithic structure having an "L" shape profile. Horizontal portion 2204 can interface with an inner side surface of case 2200 while vertical portion 2206 can interface with a bottom surface of insert 2203. Thus, regions beside and below sealing structure 2104 may be sealed from the outside environment. Configuring sealing structure 2104 in this manner allows sealing structure 2104 to achieve two sealing points in different axis with only one structure instead of two. It is to be appreciated that first diverged portion 2023 can have the same structure and function as the portion of sealing structure 2104 shown in FIG. 22B, but first diverged portion 2023 can just be arranged as a mirror image of the portion of sealing structure 2104 because it seals with an opposite side of body 2200, as can be seen in FIG. 21B.

B. Magnetic Retention System

Figure 23:
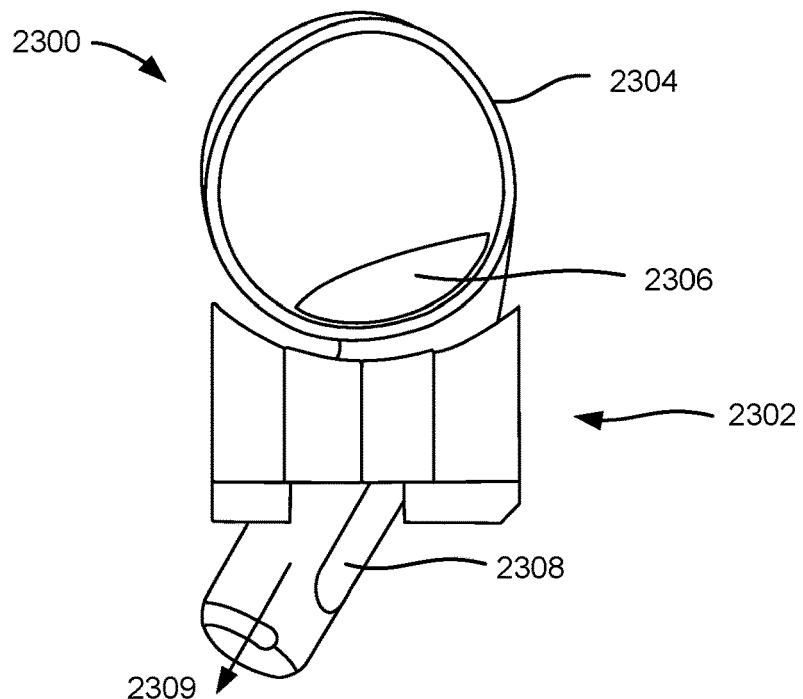
FIG. 23 is a simplified cross-sectional view illustration of a set of retaining magnets and a wireless listening device, according to some embodiments of the present disclosure.

As discussed herein, a case can include two sets of retaining magnets, each of which can be specifically configured to attract and hold respective wireless listening devices in place when the devices are placed in the case. FIG. 23 is a simplified cross-sectional view illustration 2300 of a set of retaining magnets 2302 and a wireless listening device 2304 aside from any other component within device 2304 and the case in which both magnets 2302 and device 2304 are positioned. Set of retaining magnets 2302 can attract a retention slab 2306 within a housing of wireless listening device 2304. Retention slab 2306 can have a curved surface that complements the curved surface of the housing of wireless listening device 2304. Retention slab 2306 can be formed of any suitable ferrous material, such as an iron and silicon alloy. In some embodiments, retention slab 2306 is positioned at a bottom region of the housing and above a stem 2308 of wireless listening device 2304. That way, the distance between retention slab 2306 and set of retaining magnets 2302 is small to increase the potential magnetic force achieved by set of retaining magnets 2302. In some embodiments, the amount of attractive magnetic force achieved along a direction, e.g. along an axis 2309 of stem 2308, is approximately 1 to 1.5 N, particularly 1.2 N in some embodiments. Because the direction of the targeted attractive magnetic force is at an angle, the actual amount of force that set of retaining magnets 2302 achieves in the vertical direction may be greater than 1.2 N, such as 1.5 N.

To achieve sufficient attractive magnetic force within certain size constraints, set of retaining magnets 2302 can be specifically designed to augment its magnetic field in one direction. And, in some instances, set of retaining magnets 2302 can be further designed to concentrate its magnetic field toward a small region within the general augmented direction. An example of this is shown more detail in FIGS. 24A and 24B, which are simplified illustrations of an exemplary set of retaining magnets 2400, according to some embodiments of the present disclosure. Specifically, FIG. 24A is a front-view illustration of set of retaining magnets 2400, and FIG. 24B is a top-down view illustration of set of retaining magnets 2400.

Figure 24A:
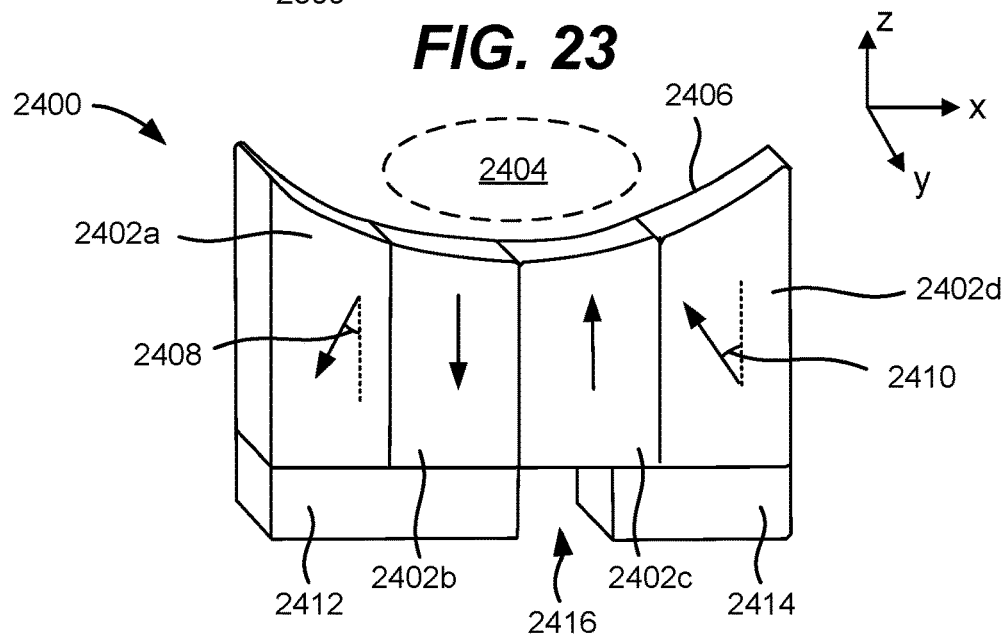
FIG. 24A is a front-view illustration of a set of retaining magnets, according to some embodiments of the present disclosure.
Figure 24B:
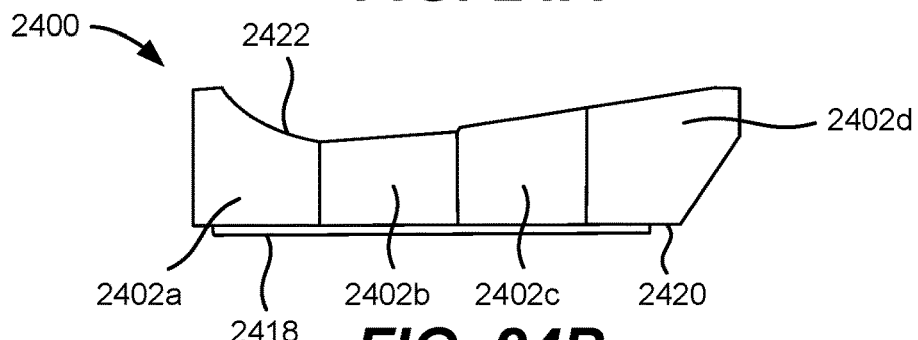
FIG. 24B is a top-down view illustration of a set of retaining magnets, according to some embodiments of the present disclosure.

As shown in FIG. 24A, set of retaining magnets 2400 can include several magnets arranged beside one another like a Halbach array. For instance, set of retaining magnets 2400 can include four magnets 2402a-d where pair of magnets 2402b-c are positioned directly beside one another, and magnets 2402a and 2402d are positioned on opposite sides of magnets 2402b-c. To concentrate magnetic field to a specific area, e.g., an area 2404 above magnets 2402b and 2402c, the polarity of each magnet in set of retaining magnets 2400 can have its polarity oriented in a different way. As an example, the polarity of magnet 2402a can be oriented downward and at an angle 2408 tilted away from magnet 2402b with respect to a vertical dimension, the polarity of magnet 2402b can be oriented vertically downward with no tilt angle, the polarity of magnet 2402c can be oriented vertically upward with no tilt angle, and the polarity of magnet 2402d can be oriented upward and at an angle 2410 tilted toward magnet 2402c with respect to the vertical dimension. By arranging the magnets of set of retaining magnets 2400 in this manner, magnetic fields can be concentrated toward area 2404 where retention slab 2306 may be positioned so that set of retaining magnets 2400 can generate a sufficiently high attractive magnetic force to retain the wireless listening device with strenuous size constraints. For reference, the orientation of the polarities of magnets 2402a-d are represented by arrows where the north pole is represented by an arrowhead and the south pole is represented by the tail, or vice versa.

Although both magnets 2402a and 2402d have polarities whose orientations are positioned at an angle with respect to a vertical axis, the degree of their tilt angle can depend on the position of area 2404. If area 2404 is to be positioned along the center of set of retaining magnets 2400, then angles 2408 and 2410 may be the same. However, if area 2404 is to be positioned a little to the left of center, then angles 2408 and 2410 can be adjusted accordingly, e.g., angle 2408 can be decreased and angle 2410 can be increased. In some embodiments, the degree of tilt for angles 2408 and 2410 can range between 20 and 40 degrees, such as 28 degrees for angle 2408 and 34 degrees for angle 2410, in certain particular instances. Furthermore, although magnets 2402b-c are shown as having polarities oriented in only one dimension (the z-dimension) and magnets 2402a and 2402d are shown as having polarities oriented in two dimensions (the z- and x-dimensions) for pulling shunt 2306 vertically downward, embodiments are not so limited. Other embodiments can include magnets 2402b-c that have polarities in two dimensions (the z-dimension and the y-dimension) and magnets 2402a and 2402d that have polarities in three dimensions. That way, the resulting magnetic force does not only have a vertical downward component, but also has a lateral y-dimension component to more efficiently direct an attractive force along axis 2309 of stem 2308 by more closely aligning the direction of magnetic force to axis 2309 of stem 2308.

Although FIG. 24A shows a set of retaining magnets as having four magnets, is to be appreciated that embodiments are not so limited and that any other number and configuration of magnets are envisioned herein without departing from the spirit and scope of the present disclosure. For instance, a set of retaining magnets can have six magnets where the two central magnets have vertical magnetic polarities, while the immediately adjacent two magnets straddling the two central magnets have angled magnetic polarities, and the final outer two magnets straddling the inner four magnets have magnetic polarities that are even more angled than the immediately adjacent two magnets. It can be appreciated that any number of magnets can be used and with different polarities to focus the magnetic force at a certain region above the set of retaining magnets, as discussed herein.

In some embodiments, set of retaining magnets 2400 can have a top surface 2406 that is curved to follow the curve of an interface surface upon which the housing of wireless listening device 2304 may rest. Thus, the curvature of top surface 2406 of set of retaining magnets 2400 can follow the curvature of the bottom of the housing of wireless listening device 2304 where retention slab 2306 may be positioned. While top surface 2406 is curved, each magnet 2402a-d in set of retaining magnets 2400 may be substantially vertical structures. For instance, each magnet 2402a-d in set of retaining magnets 2400 can have vertical sidewalls and horizontal bottom surfaces, while its top surface is curved. As can be further appreciated in FIG. 24A, even though the structure of magnets 2402a and 2402d are substantially vertical, the orientation of their polarity may be angled as shown by the arrows.

While use of magnets can result in a concentration of magnetic fields in a specific location, the magnetic properties of such magnets can also result in a leakage of magnetic fields that are propagating in undesirable directions. For instance, while magnetic fields are intended to be concentrated upwards, some magnetic fields may propagate downwards or into and out of the page. Thus, in some embodiments, one or more magnetic shunts may be implemented in addition to set of retaining magnets 2400 to control the leakage of magnetic fields. As an example, magnetic shunts 2412 and 2414 can be positioned at the bottom of set of retaining magnets 2400 to prevent magnetic fields from leaking downward. In some instances, shunts 2412 and 2414 can be positioned a distance away from one another to form a gap 2416, which can provide clearance space for positioning the stem of the wireless listening device. Magnetic shunts 2412 and 2414 can be configured to redirect stray magnetic fields to prevent them from propagating downward past shunts 2412 and 2414. Thus, magnetic shunts 2412 and 2414 can be formed of any material having high magnetic permeability, such as steel. Shunts 2412 and 2414 can be formed of a simple steel plate configured as shown in FIG. 24A.

In addition to shunts 2412 and 2414, an additional shunt can also be positioned on a back surface of set of retaining magnets 2400, as better shown in the top-down view perspective of FIG. 24B. As shown in FIG. 24B, a third shunt, shunt 2418, can be attached to a back surface 2420 of set of retaining magnets 2400 so that shunt 2418 makes contact with each magnet 2402a-d. Shunt 2418 can adhere to magnets 2402a-d of set of retaining magnets 2400 to hold them together as a single structure. That way, adhesives or other attachment methods may not need to be implemented between adjacent magnets, thereby further decreasing the footprint of set of retaining magnets 2400. A shunt may not need to be placed on a front surface 2422 of set of retaining magnets 2400 because that may be an area where the wireless listening device is positioned.

Although FIG. 24A illustrates set of retaining magnets 2400 as only having a curved top surface, embodiments are not limited to such configurations. As an example, from the top-down view perspective in FIG. 24B, set of retaining magnets 2400 can also have a curved front surface 2422. The curvature of front surface 2422 can follow a contour of the wireless listening device so that set of retaining magnets 2400 can maximize its presence around wireless listening device to increase its magnetic forces while providing clearance space for the wireless listening device to be positioned.

C. Visual Indicator

FIG. 25 is a simplified perspective view illustration of an exemplary visual indicator 2500 including a light emitter 2504 and a light tube 2501 for directing light 2502 emitted by light emitter 2504 from within a body of a case to a region outside of the body of the case, according to some embodiments of the present disclosure. Light tube 2501 can have an input end 2506 and an output end 2508, where input end 2506 receives light 2502 from light emitter 2504 and outputs the received light out of output end 2508. Input end 2506 can have a profile that is substantially similar to the profile of light emitter 2504 so that light tube 2501 can efficiently capture a large amount of the emitted light from light emitter 2504. Depending on the design as to how visual indicator 2500 is to appear from outside of the case, output end 2508 can have that specific profile, e.g., circular as shown in FIG. 20A. Thus, the profile of input end 2506 can be different from the profile of output end 2508.

In some embodiments, light emitter 2504 can be a light emitting device (LED) that has a square-like profile. Thus, in embodiments where visual indicator 2024 has a circular profile when viewed from outside of the case, light tube 2501 can be have an input end 2506 that has a square-like profile, and an output end 2508 that has a circular profile. A middle region 2510 between input end 2506 and output end 2508 can be formed of a structure that gradually transitions from a square-like profile at input end 2506 to a circular profile at output end 2508. Thus, middle region 2510 can have four surfaces 2512, each extending from input end 2506 and tapering, e.g., having a gradual decreasing width, toward output end 2508, so that the structure of light tube 2501 gradually changes from a square-like profile to a circular profile. Although FIG. 25 shows light emitter 2504 being positioned far away from light tube 2501, embodiments are not so limited. In some embodiments, light emitter 2504 can be placed adjacent to, or in contact with, light tube 2501 so that there is a minimal distance between light emitter 2504 and input end 2506 of light tube 2501.

It is to be appreciated that input end 2506 and output end 2508 can have any other profile and does not necessarily have to be square-like and circular, respectively. Rather, the profile of input end 2506 can depend on the shape of light emitter 2504, and the profile of output end 2508 can depend on design. Thus, input end 2506 and output end 2508 can be any other suitable shape, such as rectangular, triangular, oblong, and the like. In some embodiments, light tube 2501 can include a flange 2514 for securing light tube 2501 to a body of the case, as shown in FIG. 20C. Flange 2514 can extend outward from a center axis 2503 of inner eartip body 2501 and along the same plane as input end 2506 of light tube 2501.

D. Hybrid Retention and Sensor Shunt

As discussed herein with respect to FIG. 20C, a shunt can operate as a hybrid retention and sensor shunt that can not only help the lid stay closed by allowing a magnet in the lid to attract to it, but it can also be used as a sensor component so that a sensor positioned below the shunt can detect when the lid is opened or closed by way of the shunt. FIGS. 26A-26B are simplified cross-sectional views of an exemplary magnetic attachment and sensor system 2600 that includes a hybrid retention and sensor shunt 2602, according to some embodiments of the present disclosure. Specifically, FIG. 26A is a simplified cross-sectional view of magnetic attachment and sensor system 2600 when a lid 2610 is opened, and FIG. 26B is a simplified cross-sectional view of magnetic attachment and sensor system 2600 when a lid 2610 is closed. Hybrid retention and sensor shunt 2602 and a sensor 2604 can be positioned within a body 2606 of a case, and a magnet 2050 can be positioned within a lid 2610 of the case.

As shown in FIG. 26A, when lid 2610 is opened, lid 2610 is positioned away from body 2606 of the case. When lid 2610 is positioned away from body 2606, magnetic fields 2612 generated by magnet 2608 may propagate around magnet 2608 but may be so far from sensor 2604 that sensor 2604 may not detect the presence of magnetic fields 2612. In this case, sensor 2604 may generate a signal indicating that lid 2610 is open.

However, when lid 2610 is closed, as shown in FIG. 26B, lid 2610 can contact body 2606. When lid 2610 is in contact with body 2606, magnetic fields 2612 can propagate through hybrid retention and sensor shunt 2602 so that a magnetic attractive force can be generated to assist the bistable hinge in pulling lid 2610 shut. In addition, magnetic fields 2612 can propagate through hybrid retention and sensor shunt 2602 by entering a top surface of hybrid retention and sensor shunt 2602 and exiting a bottom surface of hybrid retention and sensor shunt 2602. Because hybrid retention and sensor shunt 2602 is formed of a ferrous material, such as steel, magnetic fields 2612 can easily pass through hybrid retention and sensor shunt 2602, which causes the propagation of magnetic fields 2612 to extend below hybrid retention and sensor shunt 2602. In this case, sensor 2604 can detect the presence of magnetic fields 2612 and generate a signal indicating that lid 2610 is closed. In some embodiments, sensor 2604 can detect the presence of magnetic fields 2612 when lid 2610 is in near contact with body 2606. For instance, if lid 2610 is at an angle of 0° when it is in contact with body 2606, sensor 2604 can detect the presence of magnetic fields 2612 when lid 2610 is at an angle of less than 10°. That way, there is a greater tolerance for detecting when lid 2610 is closed. By using hybrid retention and sensor shunt 2602, sensor 2604 can be placed vertically below shunt 2602 to detect the presence of a magnet that is positioned at a far distance that otherwise would not have been possible. This allows sensor 2604 to efficiently utilize the space already provided for hybrid retention and sensor shunt 2602, without requiring the need for space elsewhere around body 2606 to be reserved for sensor 2604. This configuration provides a more simple and elegant solution to a complex sensing and retention system.

E. Lid Hinge Design

Figure 27:
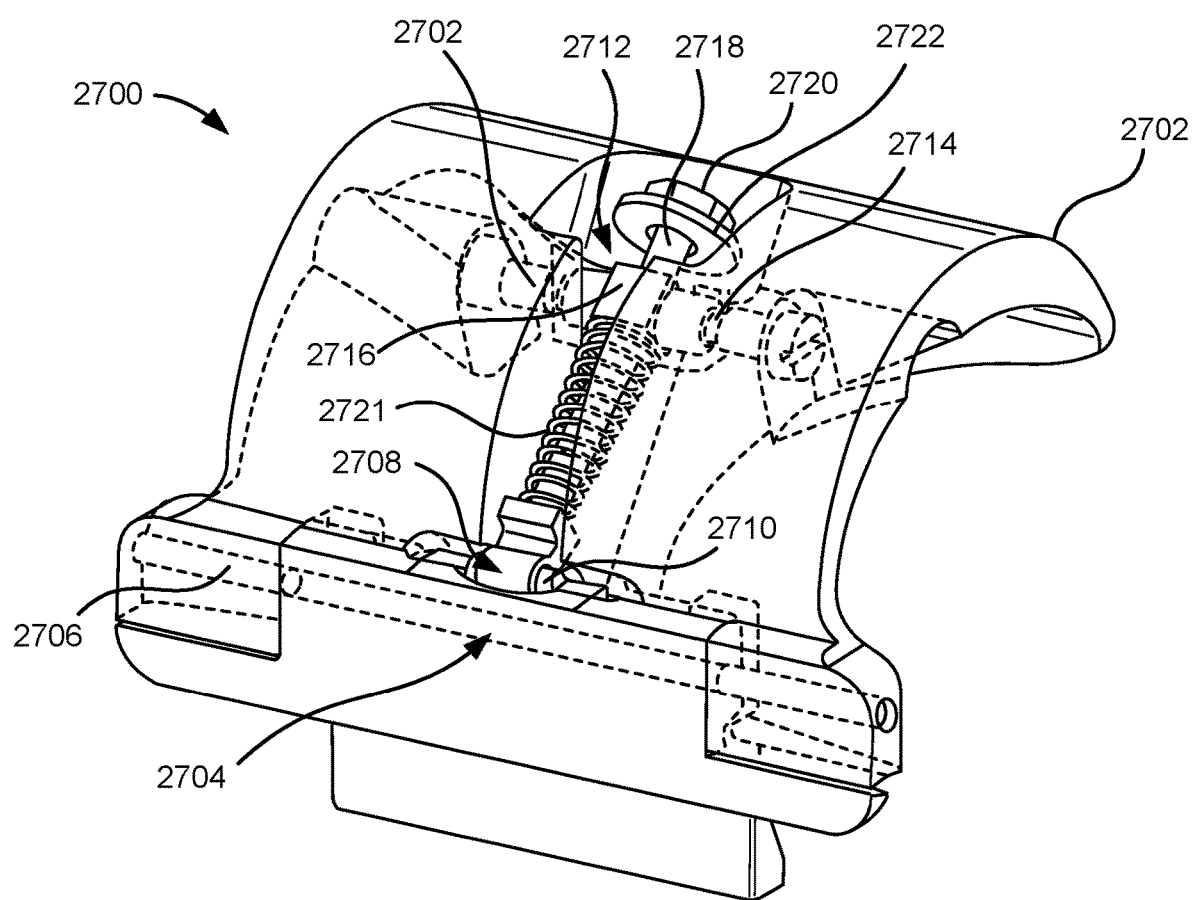
FIG. 27 is a perspective view illustration of an exemplary bistable hinge, according to some embodiments of the present disclosure.

As discussed herein with respect to FIG. 20C, a case can include a spring-loaded hinge for opening and closing the lid. In some embodiments, the hinge can be a bistable hinge that has two stable states: an open state and a closed state. This means that the bistable hinge can have a neutral position where it does not pull to open or close the lid, but once the lid moves in one direction past the neutral position, the bistable hinge can either pull the lid open or pull the lid closed. Thus, the lid can close without requiring a large number of magnets to generate a high magnetic attraction force to close the lid. FIGS. 27 and 28A-28C illustrate an exemplary bistable hinge 2700, according to some embodiments of the present disclosure. Specifically, FIG. 27 is a perspective view illustration of bistable hinge 2700, and FIGS. 28A-28C are cross-sectional view illustrations of the different states of bistable hinge 2700.

As shown in FIG. 27, bistable hinge 2700 can be formed as part of a lid 2702 of a case. Bistable hinge 2700 can include several pivot points about which bistable hinge 2700 can move to effectuate bistable opening and closing of lid 2702. As an example, bistable hinge 2700 can include a first pivot point 2704 along a first shaft 2706 that forms a first hinge about which bistable hinge 2700 rotates and a second pivot point 2708 along a second shaft 2710 that forms a second hinge about which bistable hinge 2700 rotates. The relative position between first shaft 2706 and second shaft 2710 can be fixed so that first shaft 2706 and second shaft 2710 are positioned a distance away from one another. An axis intersecting the first and second pivot points 2704 and 2708 can define the neutral position where bistable hinge 2700 does not pull in either direction to open or close lid 2702, as will be discussed further herein with respect to FIGS. 28A-28C.

In addition to first and second pivot points 2704 and 2708, bistable hinge 2700 can also include a third pivot point 2712 along a third shaft 2714 that forms a third hinge about which a piston guide 2716 can rotate. Piston guide 2716 can rotate around third shaft 2714 to maintain a concentric alignment with a piston rod 2718 while piston guide 2716 moves up and down piston rod 2718. Piston guide 2716 can have an inner diameter that is shaped as a tube to conform to the cylindrical shape of piston rod 2718. A first end of piston rod 2718 can be coupled to second shaft 2710 so that piston rod 2718 can pivot around second pivot point 2704 as bistable hinge 2700 transitions between open and closed positions, and a second end of piston rod 2718 opposite from its first end can be attached to a stopper 2720. Stopper 2720 can include a flange region 2722 that is annular in construction and is positioned around a portion of piston rod 2718 and perpendicular to an outer surface of piston rod 2718. Stopper 2720 can make contact with a part of lid 2702 to prevent lid 2702 from moving past the open position, as will be discussed herein with respect to FIG. 28C.

To generate the spring-loaded forces for the operation of bistable hinge 2700, a spring 2721 can be implemented between piston guide 2716 and second pivot point 2708. Spring 2721 can be a coil spring that is wound about a portion of piston rod 2718 so that it can apply force against piston guide 2716. In certain instances, spring 2721 is conical where it is wider in one end and narrower in the opposite end so that spring 2721 can provide a linear force profile during transition between compressed and extended states. Strictly cylindrical springs can buckle when compressed to a certain extent, which would result in a non-linear force profile. In some embodiments, third shaft 2714 is fixed in position so that piston guide 2716 cannot move relative to lid 2702. Thus, spring 2721 can generate force in a direction that is along an axis of piston rod 2718 but directed away from piston guide 2716. The direction of this force, when compared to the axis formed by the first and second pivot points 2704 and 2708 can effectuate the bistable operation of hinge 2700, as will be discussed further herein with respect to FIGS. 28A-28C.

FIGS. 28A-28C are simplified illustrations of the different positions of bistable hinge 2700, according to some embodiments of the present disclosure. As discussed herein, bistable hinge 2700 can be in two stable states: an open state and a closed state. In the closed state, bistable hinge 2700 applies a pushing torsional force that presses the lid closed, whereas in the open state, bistable hinge 2700 applies a pulling torsional force that pulls the lid open. Between the open state and the closed state is a neutral position, where bistable hinge 2700 does not push or pull into either one of the open state or the closed state. Once the lid is nudged to the right or left, bistable hinge 2700 will then begin to push or pull the lid into one of the two states. In some embodiments, the farther the hinge is in each state, the greater the torsional force is applied to keep it in that state.

FIG. 28A shows bistable hinge 2700 in a neutral position. The neutral position may be a position where bistable hinge 2700 does not push toward or pull into the closed or open state. The neutral position may be achieved when a direction of force 2802 (represented by an arrow) is aligned with a conversion axis 2804 (represented by a dashed line) defined by a line that intersects centers of first and second pivot points 2704 and 2708 where first and second shafts 2706 and 2710 are positioned, respectively as shown in FIG. 28A. In this position, spring 2721 may be compressed 2813 while providing force 2802, and lid 2702 may be at an angle of between 20° to 40°, such as 30°, with respect to horizontal. The direction of force 2802 is in-line with the axis of piston rod 2718 because spring 2721 is concentric to piston rod 2718. Conversion axis 2804 may define the angle at which bistable hinge 2700 moves between the closed state and the opened state.

For instance, once bistable hinge 2700 tilts out of alignment with conversion axis 2804, bistable hinge 2700 may begin to apply torsional force toward the direction in which it begins to tilt with increasing amounts of force as the angle between direction of force 2802 and conversion axis 2804 increases. As an example, if the lid begins to close, direction of force 2802 begins to angle away from conversion axis 2804 towards the left side of conversion axis 2804, and bistable hinge 2700 begins to apply increasing amounts of torsional force 2806 to push the lid toward the closed state until bistable hinge 2700 reaches the closed state, as shown in FIG. 28B. At this time, spring 2721 also begins to expand 2814 as it applies force 2802 to the left side of conversion axis 2804. Bistable hinge 2700 may stop pushing once lid 2702 presses against the body of the case, such as when the lid is parallel (e.g., at an angle of 0°) with respect to a horizontal dimension. In this case, bistable hinge 2700 may be completely in the closed state.

Alternatively, if the lid begins to open from the neutral position, direction of force 2802 begins to angle away from conversion axis 2804 towards the right side of conversion axis 2804, and bistable hinge 2700 begins to apply increasing amounts of torsional force 2808 to pull the lid toward the open state until bistable hinge 2700 reaches the opened state, as shown in FIG. 28C. At this time, spring 2721 also begins to expand 2816 as it applies force 2802 to the right side of conversion axis 2804. Bistable hinge 2700 may stop pulling once stopper 2720 presses against a seat 2810 formed in lid 2702, e.g. when the lid is at an angle between 100° and 130°, such as 115°, with respect to the horizontal dimension. In this case, bistable hinge 2700 may be completely in the open state.

As can be appreciated herein, bistable hinge 2700 can include a pivot guiding structure 2812 coupled to the first shaft 2706 or both first and second shafts 2706 and 2710. Pivot guiding structure 2812 can move independently from lid 2702 so that it can guide the bistable movement of hinge 2700. For instance, pivot guiding structure 2812 can pivot around first shaft 2706 while second shaft 2710 slides along an outer surface of pivot guiding structure 2812 as bistable hinge 2700 transitions between opened and closed states, as shown in FIGS. 28A-28C.

In some embodiments, bistable hinge 2700 may apply maximum amount of force when it is completely in the closed state or the open state, and gradually less amounts of force when approaching the neutral position. This may be because of the large angle between direction of force 2802 and conversion axis 2804 when in either of the states, and the smaller angles between force 2802 and conversion axis 2804 when approaching the neutral position. Thus, the most amount of resistance may be felt when pressing the lid to move out of either the closed state or the opened state, which achieves high quality user experience.

FIGS. 28D-28F are simplified illustrations of an exemplary bistable hinge 2820 different from hinge 2700 in FIG. 27 in that bistable hinge 2820 has a piston formed of a curved plate coupled to a rocker, according to some embodiments of the present disclosure. Specifically, FIG. 28D is a perspective view illustration of an exemplary bistable hinge 2820. As shown, bistable hinge 2820 can include a pushplate 2826 and a rocker 2828 coupled between a first shaft 2822 and a second shaft 2824. A first end of pushplate 2826 can be coupled to first shaft 2822 within a hinge block 2830, which can protect the coupling joint between pushplate 2826 and first shaft 2822, while a second end of pushplate 2826 opposite from the first end can be coupled to a first end of rocker 2828 via a third shaft 2832. A second end of rocker 2828 opposite from its first end can then be coupled to second shaft 2824. The combined movement of pushplate 2826 and rocker 2828 can effectuate the movement of bistable hinge 2820. In some embodiments, pushplate 2826 can be constructed as a curved plate to provide clearance space for other components within the case, and can be coupled to a spring 2834 that provides the spring forces for opening and closing the bistable hinge. Pushplate 2826 can be a single structure that is pressed against spring 2834 such that spring 2834 moves in conjunction with pushplate 2826 for guiding the movement of bistable hinge 2820. However, embodiments are not so limited. For instance, pushplate 2826 can be separated into two structures to allow spring 2834 to pivot freely with respect to pushplate 2826, as shown in FIG. 28E.

FIG. 28E is a perspective view illustration of an exemplary pushplate 2836 constructed of a primary structure 2838 and a secondary structure 2840. Third shaft 2832 can thread through both primary structure 2838 and secondary structure 2840 as shown. In some embodiments, secondary structure 2840 is set within a cutout region 2842 of primary structure 2838 so that portions of primary structure 2838 are positioned on opposite sides of secondary structure 2840. In certain embodiments, secondary structure 2840 can move independently from primary structure 2838 so that spring 2834 can be decoupled from primary structure 2838, thereby allowing spring 2834 to move independently from primary structure 2838. This movement allows a modified torque curve that can provide a better user feel when opening and closing the lid.

FIG. 28F is a cross-sectional view illustration of a case 2844 implemented with bistable hinge 2820 that includes pushplate 2826 and rocker 2828, according to some embodiments of the present disclosure. Pushplate 2826 can be coupled to a body 2844 of case 2820 by way of hinge block 2830. The curvature of pushplate 2826 can bend around internal components of case 2820 as shown in FIG. 28F before coupling to rocker 2828 via third shaft 2832. Rocker 2828 can be positioned at an angle with respect to pushplate 2826 and can be coupled to a mounting structure 2846 that is affixed to a lid 2848 of case 2820. Spring 2834 can contact, and be positioned between, pushplate 2826 and mounting structure 2846 so that forces applied by spring 2834 can press against pushplate 2826 to alter the angle between pushplate 2826 and rocker 2828 to open lid 2848. Protrusions 2850 and 2852 extending from mounting structure 2846 and pushplate 2826, respectively, can retain spring 2834 in position.

F. Straddle Battery Pack

As discussed herein, a case can include more than one battery pack for storing energy that can be later discharged to operate the case. For instance, the case can have two battery packs that are coupled together to provide twice as much energy storage than a single battery pack. In such instances, the two battery packs can be arranged to minimize occupied space so that the case can have a smaller size and/or more space can be utilized by other internal components. For instance, two battery packs can be positioned side-by-side and separated by a case substrate, such as a PCB, to minimize space.

Figure 29A:
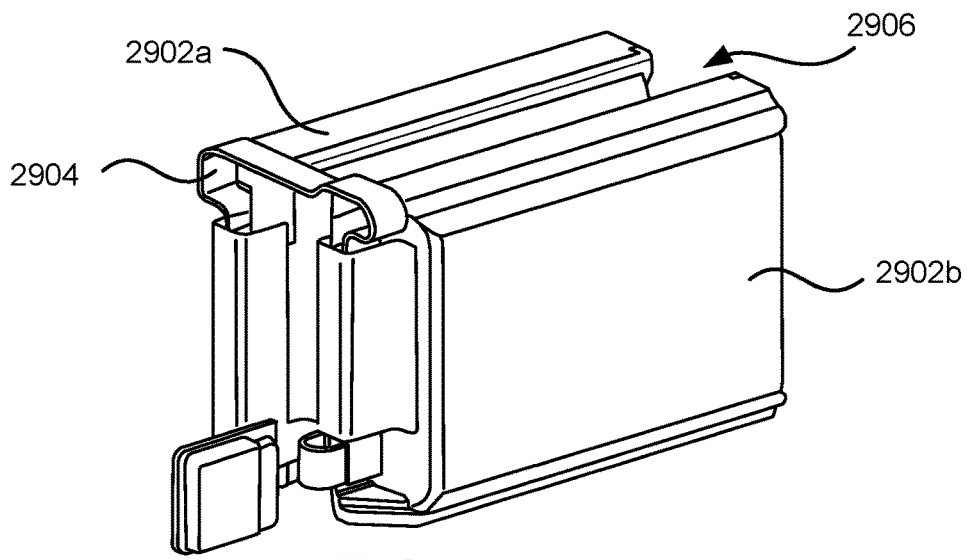
FIGS. 29A-29C are simplified illustrations of an exemplary straddle battery pack, according to some embodiments of the present disclosure.
Figure 29B:
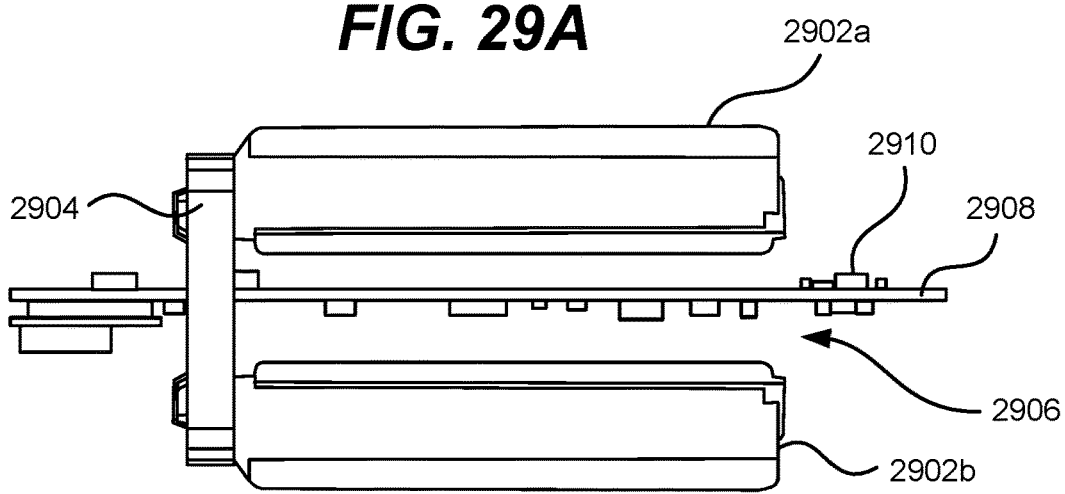
Figure 29C:
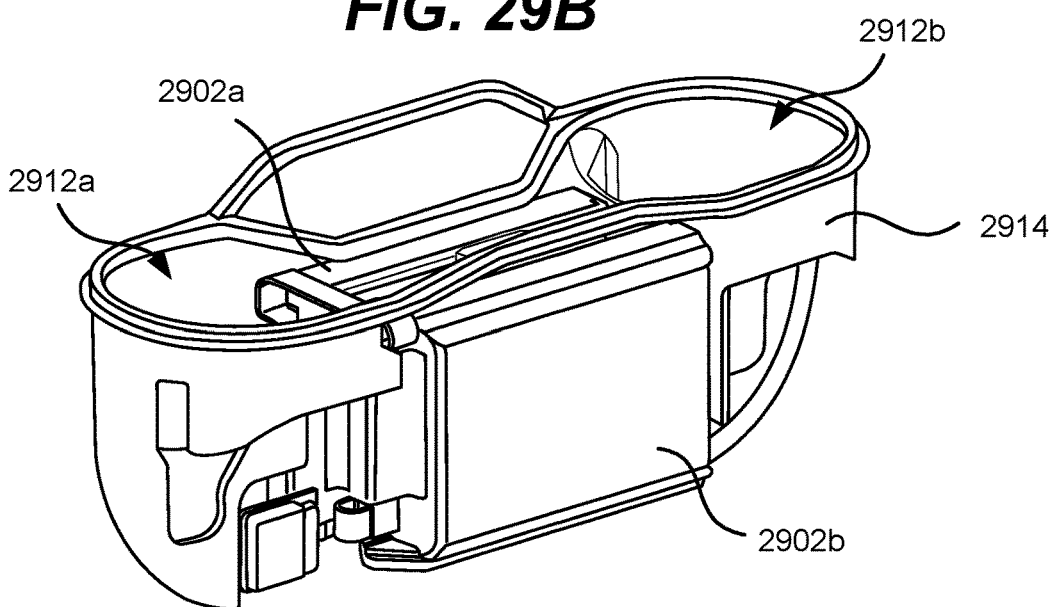

FIGS. 29A-29C illustrate configurations of an exemplary straddle battery pack 2900, according to some embodiments of the present disclosure. Straddle battery pack 2900 can include two battery packs: a first battery pack 2902a and a second battery pack 2902b, that can be oriented vertically and positioned side-by-side. To operate together, battery packs 2902a-b can be electrically coupled together via connection cables 2904 that can couple with a case substrate for providing power to operate the case. In some embodiments, battery packs 2902a-b can be separated by a gap 2906, within which one or more components can be strategically positioned to minimize the footprint of battery packs 2902a-b.

As an example, as shown in FIG. 29B, a case substrate 2908 mounted with a plurality of electronic devices 2910 can be positioned between first and second battery packs 2902a-b within gap 2906. To provide power to operate the case, connection cables 2904 can couple battery packs 2902a-b to case substrate 2908. By sandwiching case substrate 2908 between two battery packs, the overall footprint of the module can be small enough to be tucked away in a small region of the case. As an example shown in FIG. 29C, battery packs 2902a-b can be tucked in the space between bowls 2912a-b of an inner frame 2914 for a case. That way, battery packs 2902a-b can provide ample power storage while taking up minimal space within the case.

G. Case as a One-Handed Applicator

Figure 30:
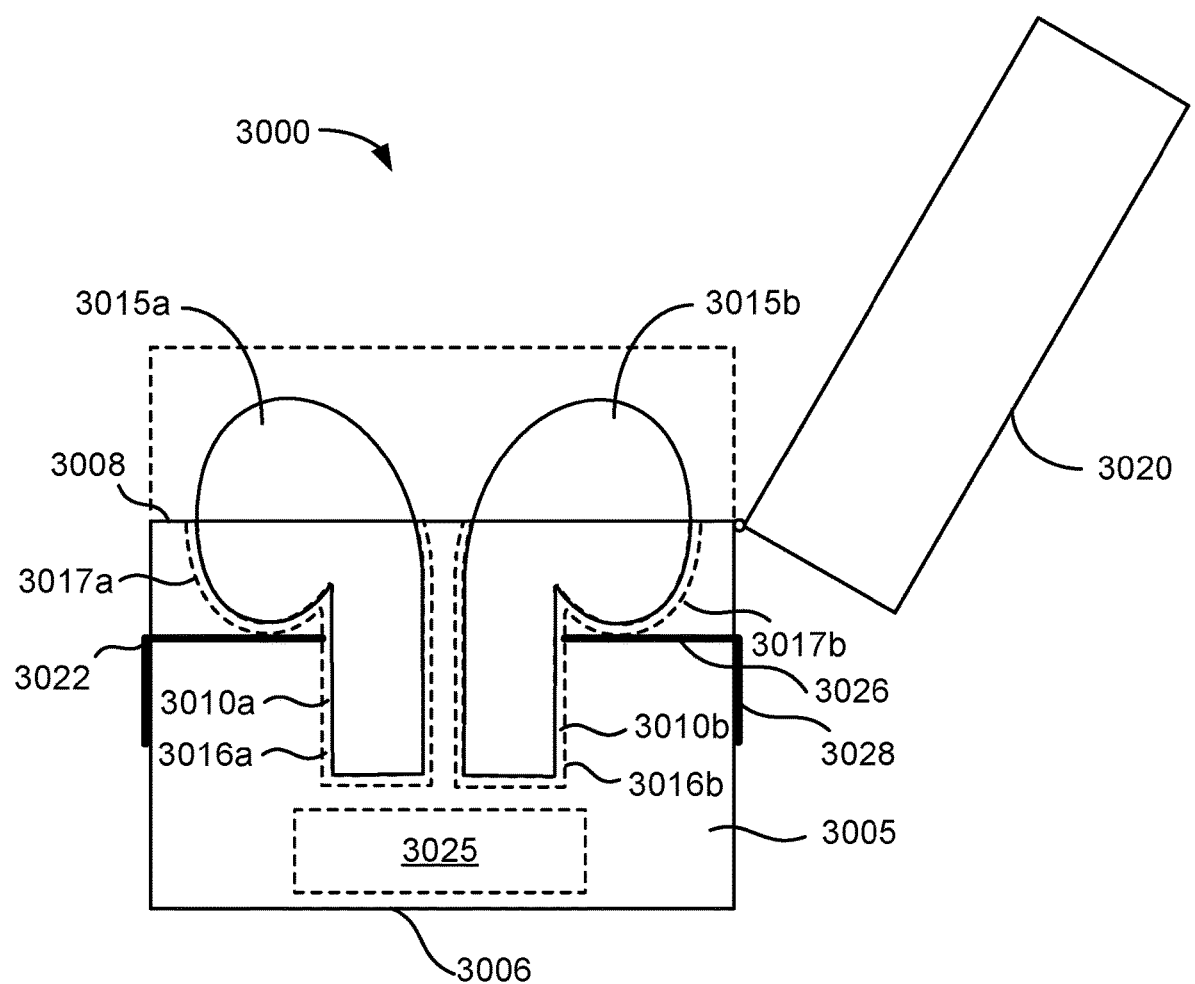
FIG. 30 is a simplified plan view illustration of a case for a pair of wireless listening devices, according to some embodiments of the disclosure.

FIG. 30 depicts a simplified plan view of a case 3000 for a pair of wireless listening devices according to some embodiments of the disclosure. As shown in FIG. 30, case 3000 includes a housing 3005 having one or more cavities 3010a and 3010b configured to receive a pair of wireless listening devices 3015a and 3015b. In some embodiments, cavities 3010a and 3010b can be positioned adjacent to each other on opposite sides of a center plane of case 3000. Each cavity 3010a and 3010b can be sized and shaped to match that of its respective listening device 3015a and 3015b. Each cavity can include a stem section 3016a and 3016b and a bud section 3017a and 3017b. Each stem section 3016a and 3016b can be an elongated generally cylindrical cavity that extends from its respective bud section 3017a and 3017b towards a bottom 3006 of case 3000. Each bud section 3017a and 3017b can be offset from its respective stem section 3016a and 3016b and open at an upper surface 3008 of housing 3005. Embodiments of the disclosure are not limited to any particular shape, configuration or number of cavities 3010a and 3010b and in other embodiments cavities 3010a and 3010b can have different shapes to accommodate different types of listening devices, different configurations and/or can be a single cavity or more than two cavities.

Case 3000 further includes a lid 3020 attached to housing 3005. Lid 3020 is operable between a closed position where lid 3020 is aligned over one or more cavities 3010a and 3010b fully enclosing pair of listening devices 3015a and 3015b within the housing, and an open position where the lid is displaced from the housing and cavities 3010a and 3010b such that a user can remove the listening devices from the cavities or replace the listening devices within the cavities. Lid 3020 can be pivotably attached to housing 3005 and can include a magnetic or mechanical system (not shown in FIG. 30) that provides lid 3020 with a bi-stable operation, as described more fully below. Case 3000 can also include a charging system 3025 configured to charge pair of listening devices 3015a and 3015b. Charging system 3025 can make electrical contact with external contacts of pair of listening devices 3015a and 3015b to provide power to listening devices 3015a and 3015b.

According to some embodiments of the present disclosure, case 3000 can be configured as a one-handed applicator that can eject one or both listening devices 3015a and 3015b with one hand without having to have one hand hold the case and the other hand pull listening devices 3015a and 3015b out of case 3000. As an example, case 3000 can include an ejection feature 3022 that can be configured to slide upwards to eject one or both listening devices 3015a and 3015b. In some embodiments, ejection feature 3022 can be formed of a frame that includes an engaging portion 3026 that is positioned below listening devices 3015a and 3015b so that when ejection feature 3022 is slid upwards, engaging portion 3026 can press upward against one or both listening devices 3015a and 3015b to eject one or both simultaneously. Ejection feature 3022 can also include an activation portion 3028 that is exposed on a side surface of case 3000 so that a user can use his or her finger to activate ejection feature 3022. In some embodiments, activation portion 3028 can include two parts, one positioned on opposite sides of case 3000 to allow flexibility in activating ejection feature 3022. Case 3000 can also include tracks (not shown) on the side surfaces of case 3000 to allow activation portion 3028 to move up and down. In some additional and alternative embodiments, activation portion 3028 can be a button that is pressed or a switch that is flipped instead of a sliding feature to activate ejection feature 3022. It is to be appreciated that any suitable type of activation feature can be envisioned herein without departing from the spirit and scope of the present disclosure.

Although the invention has been described with respect to specific embodiments, it will be appreciated that the invention is intended to cover all modifications and equivalents within the scope of the following claims.

What is claimed is:

1. An in-ear acoustic device, comprising:
   a housing comprising an outer structure defining an internal cavity and an acoustic opening that allows sound to exit out of the outer structure; and
   a deformable ear tip body having first and second opposing ends and a sound channel extending along a first axis through the ear tip body from the first end to the second end, wherein the ear tip body is sized and shaped such that the first end can be at least partially inserted into a human ear canal;
   a rigid frame coupled to the second end of the deformable ear tip, the rigid frame having a sidewall extending around a periphery of the frame and defining a centrally located opening in the frame axially aligned with the sound channel;
   first and second recesses formed on opposing sides of the frame sidewall and having openings facing the centrally located opening in the frame; and
   an acoustic vent formed through the frame sidewall at a location between the first and second recesses along a second axis that intersects the first axis.

2. The in-ear acoustic device of claim 1, wherein the acoustic vent is a first acoustic vent and a second acoustic vent separate from the first acoustic vent is formed through the frame sidewall.

3. The in-ear acoustic device of claim 2, wherein the first and second acoustic vents are disposed on opposite hemispheres of the frame sidewall.

4. The in-ear acoustic device of claim 3, further comprising a mesh coupled to the rigid frame and extending across the centrally located opening.

5. The in-ear acoustic device of claim 3, wherein the first opening and second acoustic vents are positioned along a the second axis, and the first and second recesses are positioned along a third axis oriented perpendicularly with the second axis.

6. The in-ear acoustic device of claim 1, wherein the openings of the first and second recesses are both oblong in shape.

7. A wireless listening device, comprising:
- a housing comprising an outer structure defining an internal cavity and an acoustic opening that allows sound to exit out of the outer structure;
- a nozzle attached to the housing around the acoustic opening;
- an attachment mechanism coupled to and extending through the nozzle and formed of wire bent in various directions forming a spring compressible in lateral directions; and
- a deformable ear tip body having first and second opposing ends and a sound channel extending along a first axis through the ear tip body from the first end to the second end, wherein the ear tip body is sized and shaped such that the first end can be at least partially inserted into a human ear canal;
- a rigid frame coupled to the second end of the deformable ear tip, the rigid frame having a sidewall extending around a periphery of the frame and defining a centrally located opening in the frame axially aligned with the sound channel;
- first and second recesses formed on opposing sides of the frame sidewall and having openings facing the centrally located opening in the frame; and
- an acoustic vent formed through the frame sidewall at a location between the first and second recesses along a second axis that intersects the first axis.

8. The wireless listening device of claim 7, wherein the acoustic vent is a first acoustic vent and the wireless listening device further includes a second acoustic vent formed through the frame sidewall.

9. The wireless listening device of claim 8, wherein the first and second acoustic vents are disposed on opposite hemispheres of the frame sidwall.

10. The wireless listening device of claim 9, further comprising a mesh coupled to the rigid frame and extending across the centrally located opening.

11. The wireless listening device of claim 9, wherein the first and second acoustic vents are positioned along the second axis and the first and second recesses are positioned along a third axis that intersects the first axis and the second axis.

12. A detachable ear tip, comprising:
- a deformable ear tip body having first and second opposing ends and a sound channel extending along a first axis through the ear tip body from the first end to the second end, wherein the ear tip body is sized and shaped such that the first end can be at least partially inserted into a human ear canal;
- a rigid frame coupled to the second end of the deformable ear tip, the rigid frame having a sidewall extending around a periphery of the frame and defining a centrally located opening in the frame axially aligned with the sound channel;
- first and second recesses formed on opposing sides of the frame sidewall and having openings facing the centrally located opening in the frame; and
- an acoustic vent formed through the frame sidewall at a location between the first and second recesses along a second axis that intersects the first axis.

13. The detachable ear tip of claim 12 wherein the frame sidewall has an inverted u-shapes profile.

14. The detachable ear tip of claim 12 further comprising a mesh coupled to the rigid frame and extending across the centrally located opening.

15. The detachable ear tip of claim 12 wherein the frame sidewall has an inverted u-shapes profile.

16. The detachable ear tip of claim 12 wherein the ear tip includes a plurality of acoustic vents formed through the frame sidewall.

17. The detachable ear tip of claim 16 wherein the plurality of acoustic vents includes first and second acoustic vents disposed in an opposing relationship with each other on opposite sides of the frame sidewall.

\* \* \* \* \*